US008816035B2

(12) United States Patent
Leclerc et al.

(10) Patent No.: US 8,816,035 B2
(45) Date of Patent: Aug. 26, 2014

(54) PHOTOACTIVE POLYMERS

(75) Inventors: Mario Leclerc, Quebec (CA); Ahmed Najari, Quebec (CA); Yingping Zou, Quebec (CA)

(73) Assignee: Universite Laval, Quebec (CA)

( * ) Notice: Subject to any disclaimer, the term of this patent is extended or adjusted under 35 U.S.C. 154(b) by 66 days.

(21) Appl. No.: 13/511,831

(22) PCT Filed: Nov. 30, 2010

(86) PCT No.: PCT/CA2010/001913
§ 371 (c)(1), (2), (4) Date: Nov. 2, 2012

(87) PCT Pub. No.: WO2011/063534
PCT Pub. Date: Jun. 3, 2011

(65) Prior Publication Data

US 2013/0048075 A1 Feb. 28, 2013

Related U.S. Application Data

(60) Provisional application No. 61/265,037, filed on Nov. 30, 2009, provisional application No. 61/389,460, filed on Oct. 4, 2010.

(51) Int. Cl.
*C08G 77/04* (2006.01)
*C08G 61/12* (2006.01)
*H01L 51/00* (2006.01)
*H01L 51/42* (2006.01)

(52) U.S. Cl.
CPC .......... *H01L 51/0036* (2013.01); *C08G 61/124* (2013.01); *H01L 51/0043* (2013.01); *C08G 2261/1432* (2013.01); *C08G 2261/91* (2013.01); *H01L 51/0037* (2013.01); *H01L 51/4253* (2013.01); *C08G 2261/92* (2013.01); *C08G 2261/3241* (2013.01); *C08G 2261/344* (2013.01); *Y02E 10/549* (2013.01); *C08G 61/126* (2013.01); *C08G 2261/3223* (2013.01)
USPC .................. 528/25; 528/27; 528/28; 528/30; 136/261

(58) Field of Classification Search
USPC .......................... 136/263; 528/25, 27, 28, 30
See application file for complete search history.

(56) References Cited

U.S. PATENT DOCUMENTS

2008/0102559 A1* 5/2008 Ong et al. ........................ 438/99
2010/0099840 A1* 4/2010 Moon et al. ................... 528/321
2010/0252112 A1* 10/2010 Watson ......................... 136/263

FOREIGN PATENT DOCUMENTS

WO WO 2008/144756 11/2008

OTHER PUBLICATIONS

Chen et al., "Efficient Polymer Solar Cells with Thin Active Layers Based on Alternating Polyfluorene Copolymer/Fullerene Bulk Heterojunctions" , Advanced Materials, vol. 21, pp. 4238-4242, 2009.

(Continued)

*Primary Examiner* — Shane Fang
(74) *Attorney, Agent, or Firm* — Fulbright & Jaworski LLP

(57) ABSTRACT

Photoactive polymers comprising first and second co-monomer repeat units, the first co-monomer repeat unit comprising a moiety selected from the group consisting of an alkylthieno[3,4-c]pyrrole-4,6-dione moiety and a 1,3-dithiophene-5-alkylthieno[3,4-c]pyrrole-4,6-dione moiety, and the second co-monomer repeat unit comprising a moiety selected from the group consisting of a 4,4'-dialkyl-dithieno[3,2-b:2'3'-d]silole moiety, an ethylene moiety, a thiophene moiety, an N-alkylcarbazole moiety, an N-(1-alkyl)dithieno[3,2-b:2'3'-d]pyrrole moiety and a 4,8-dialkyloxylbenzo[1,2-b:3,4-b]dithiophene moiety are described herein. These polymers are suitable for use in photovoltaic cells and field effect transistors.

28 Claims, 17 Drawing Sheets

(56) References Cited

OTHER PUBLICATIONS

Kim et al., "New architecture for high-efficiency polymer photovoltaic cells using solution-based titanium oxide as an optical spacer", Advanced Materials, vol. 18, pp. 572-576, 2006.
Kim et al., "Roles of donor and acceptor nanodomains in 6% efficient thermally annealed polymer photovoltaics", Applied Physics Letters, vol. 90, pp. 163511-1-163511-3, 2007/.
Li et al., "High-efficiency solution processable polymer photovoltaic cells by self-organization of polymer blends", Nature Material, vol. 4, pp. 864-868, Nov. 2005.
Liang et al., "For the bright future—bulk heterojunction polymer solar cells with power conversion efficiency of 7.4%", Advanced Energy Materials, vol. 22, pp. E135-E138, 2010.
Nielsen et al., "New regiosymmetrical dioxopyrrolo-and dihydropyrrolo-functionalized plythiophenes" , Organic Letters, vol. 6, No. 19, pp. 3381-3384, 2004.
Park et al., "Bulk heterojunction solar cells with internal quantum efficiency approaching 100%", Nature Photonics, vol. 3, pp. 297-303, May 2009.
PCT International Search Report issued in PCT Application No. PCT/CA2010/001913, dates Feb. 25, 2011.
Peet et al. ,"Efficiency enhancement in low-bandgap polymer solar cells by processing with alkane dithiols", Nature Materials, vol. 6, pp. 497-500, Jul. 2007.
Piliego et al., "Synthetic Control of Structural Order in N-alkylthieno[3,4-c]pyrrole-4,6-dione-based Polymers for Efficient Solar cells", Journal of American Chemical Society, vol. 132, pp. 7595-7597, 2010.
Pomerantz et al., "Studies of planar poly(3,4-disubstuted-thiophenes)", Synthetic Meatal, vol. 135/136, pp. 257-258, 2003.
Pomerantz, "Planar 2,2'-bithiophenes with 3,3'- and 3,3', 4,4'-substituents. A computational study", Tetrahedron Letters, vol. 44, pp, 1563-1565, 2003.
Scharber et al, "Design Roles for Donors in Bulk-Heterojunction Solar Cells—Towards 10% Energy-Conversion Efficiency", Advanced Materials, vol. 18, pp. 789-794, 2006.
Yuan et al., "A thieno[3,4-c]pyrrole-4,6-dione-based donor-acceptor polymer exhibiting high crystallinity for photovoltaic applications", Macromoleutes, vol. 43, pp. 6936-6938, 2010.
Zhang et al., "Alternating donor/acceptor repeat units in polythiophenes. Intramolecular Charge Transfer for Reducing Band Gaps in Fully Substituted Conjugates Polymers", Journal of American Chemical Society, vol. 120, No. 22, pp. 5355-5362, Jun. 10, 1998.
Zhang et al., "Benzo[1,2-b:4,5-b']dithiophene-dioxopyrrolothiophen copolymers for high performance solar cells", Chemistry Communication, vol. 46, pp. 4997-4999, 2010.
Zhang et al., "Efficient Polymer solar cells based on the copolymers of benzodithiophene and thienopyrroledione", Chemistry of Materials, vol. 22, No. 9, pp. 2696-2698, 2010.
Zhang et al., "Low Optical bandgap polythiophenes by an alternating donor/acceptor repeat unit strategy", J. American Chemical Society, vol. 119, pp. 5065-5066, 1997.
Zhou et al., "Synthesis of Thieno[3,4-b]pyrazine-based and 2,1,3-Benzothiadiazole-based donor-acceptor copolymers and their application in photovoltaic devices", Macromolecules, vol. 43, pp. 2873-2879, 2010.
Zou et al., "A Thieno[3,4-c]pyrrole-4,6-dione-based copolymer for efficient solar cells", Journal of American Chemical Society, vol. 132, pp. 5330-5331, 2010.

* cited by examiner

Poly(Thieno[3,4-c]Pyrrole-4,6-Dione) derivatives

C60-PCBM

[A]

[B]

PHOTOACTIVE POLYMERS

CROSS-REFERENCE TO RELATED APPLICATIONS

This application is a national phase application under 35 U.S.C. §371 of International Application No. PCT/CA2010/001913 filed Nov. 30, 2010, which claims priority to U.S. Provisional Application Ser. No. 61/265,037 filed Nov. 30, 2009 and U.S. Provisional Application Ser. No. 61/389,460 filed Oct. 4, 2010. The entire contents of each of the above-referenced disclosures is specifically incorporated herein by reference without disclaimer.

FIELD

The present specification broadly relates to novel photoactive polymers. More specifically, but not exclusively, the present disclosure relates to thieno[3,4-c]pyrrole-4,6-dione-based polymers. The present disclosure also relates to a process for the preparation of thieno[3,4-c]pyrrole-4,6-dione-based polymers. Moreover, the present disclosure also relates to the use of the thieno[3,4-c]pyrrole-4,6-dione-based polymers in light emitting devices such as light emitting diodes and solar cells as well as to their use in field-effect transistors.

BACKGROUND

Harvesting energy from sunlight to produce electricity using photovoltaic devices provides a promising way to produce a clean and renewable source of energy. During the past decade, a significant amount of effort has been devoted to the development of polymer-based solar cells. Polymeric materials offer unique advantages over inorganic materials such as low-cost processability and flexibility. The more efficient organic solar cells are often based on a bulk heterojunction (BHJ) structure were the interface between the donor and acceptor provides an efficient charge separation leading to high photocurrents. Polymer bulk heterojunction (BHJ) solar cells offer a compelling option for tomorrow's photovoltaic devices since they can be easily prepared using low-cost and energy efficient roll-to-roll manufacturing processes. Although BHJ solar cells have made great progress over the last several years with power conversion efficiencies reaching over 6%, higher efficiency and stability are desired for large-scale production and commercialization of photovoltaic devices. Low bandgap polymers were expected to harvest more photons and improve the power conversion efficiency of organic solar cells.

Bulk heterojunction solar cells based on a regioregular poly(3-hexylthiophene) (P3HT) and [6,6]-phenyl C61-butyric acid methyl ester ([60]PCBM) blend have been widely investigated [1-3]. However, BHJ devices made from such low bandgap materials, using PCBM (C60) as acceptor, are usually not highly efficient. Most of them suffer from mismatches between HOMO-LUMO energy levels, low hole mobility, and low open circuit voltage ($V_{oc}$) all of which lead to low short circuit currents ($J_{sc}$) and a small fill factor (FF). Power conversion efficiencies (PCE) up to 5-6% have been reported. The relatively large band gap of 1.9 eV and a HOMO energy level of 5.1 eV prevent P3HT/PCBM-based BHJ solar cells to reach higher PCE values.

To achieve higher power conversion efficiencies, a good balance of the bandgap and energy levels of both donor and acceptor materials to enhance the $V_{oc}$ and the $J_{sc}$ are required. The $V_{oc}$ is typically defined by the difference between the HOMO energy level of the electron donor (polymer or small molecules) and the LUMO energy level of the electron acceptor (most often [60]PCBM). To achieve high PCEs using the BHJ configuration, the ideal electron donor should have a bandgap ranging between 1.2 and 1.9 eV, a HOMO energy level ranging between −5.2 and −5.8 eV and a LUMO energy level ranging between −3.7 and 4.0 eV. These properties will promote efficient charge separation and maximize the open circuit potential ($V_{oc}$).

The past few years have witnessed the development of several new classes of conjugated polymers that have been used as electron donors in BHJ solar cells [4-6]. Lately, power conversion efficiencies up to 8.1% have been reported confirming that organic photovoltaic technology can become a cost effective and competitive technology.

Donor-Acceptor (D-A) structures have been widely used to reduce the bandgap of polymers. 2,1,3-Benzothiadiazole (BT) or 4,7-dithien-2-yl-2,1,3-benzothiadiazole (DTBT) have been synthesized and copolymerized with electron-donor co-monomers such as fluorene, dibenzosilole, carbazole, dithienole, and cyclopenta[2,1-b:3,4-b]dithiophene leading to PCEs of up to 6%. However, only a few good electron-acceptor structures have been reported in the literature when compared to electron-donor units.

Tour et al reported an imido-containing polythiophene with reduced optical bandgap [7, 8]. Pomerantz et al performed ab initio calculations on thieno[3,4-c]pyrrole-4,6-dione (TPD) which revealed that polythiophenes with carbonyl groups in both the 3- and 4-positions are planar. Planarity is the result of coulombic attraction between the carbonyl oxygens and the sulfur atom in the adjacent ring [9, 10]. Bjrnholm et al. reported a detailed synthesis of homopolymers based on thieno[3,4-e]pyrrole-4,6-dione [11]. The use of conjugated thiophene-comprising polymers as organic electrodes has been described in International publication WO 2008/144756 [12].

The TPD structural unit represents an attractive building block since it can be readily prepared from commercially available starting materials. Moreover, it exhibits a compact planar structure which is beneficial to electron delocalization when incorporated into various conjugated polymers. Furthermore, its planar structure is beneficial in promoting intra- and inter-chain interactions along and between coplanar polymer chains, while its strong electron withdrawing effect leads to lower HOMO and LUMO energy levels, a desired property for increasing the stability and the $V_{oc}$ in BHJ solar cells. Copolymers based on benzodithiophene (BDT) and TPD were recently reported. A power conversion energy of 5.5% was obtained for a PBDTTPD/[70]PCBM blend having an active area of 100 $mm^2$ [13]. It was subsequently reported that copolymers based on BDT and the TPD unit can reach higher power conversion efficiencies. Jen et al. have reported a power conversion efficiency of 4.1% for a PBDTTPD/[70]PCBM (ratio 1:2) blend while Fréchet et al. and Xie et al. have reported power conversion efficiencies ranging from 4.0% to 6.8% for a series of alkylated TPD-based copolymers [14-16]. Lately, Wei et al. have reported a power conversion efficiency of 4.7% and a high $V_{oc}$ of 0.95V using a copolymer based on TBD and bithiophene derivatives [17].

The present specification refers to a number of documents, the content of which is herein incorporated in their entirety.

SUMMARY

The present specification broadly relates to thieno[3,4-c]pyrrole-4,6-dione-based polymers and co-polymers. In an embodiment, the present disclosure relates to thieno[3,4-c]pyrrole-4,6-dione-based polymers and co-polymers exhibiting low bandgap and deep HOMO energy levels and proper LUMO energy levels as well as high charge mobility for photovoltaic applications. In a further embodiment, the present specification relates to thieno[3,4-c]pyrrole-4,6-dione and related compounds as electron accepter units to be copolymerized with electron donors for the manufacture of photoactive polymers useful in photovoltaic devices.

In an embodiment, the present specification relates to novel low bandgap thieno[3,4-c]pyrrole-4,6-dione-based polymers, co-polymers and derivatives thereof. In a further embodiment, the present specification relates to novel low bandgap thieno[3,4-c]pyrrole-4,6-dione-based polymers, co-polymers and derivatives thereof exhibiting broad absorption and high charge mobility. In an embodiment, the present specification relates to novel low bandgap thieno[3,4-c]pyrrole-4,6-dione-based polymers, co-polymers and derivatives thereof suitable for use in photovoltaic cells and field effect transistors.

In an embodiment, the present specification relates to a new class of benzodithiophene (BDT)-thieno[3,4-c]pyrrole-4,6-dione (TPD)-based copolymers.

In an embodiment, the present specification relates to a photoactive polymer comprising first and second co-monomer repeat units, the first co-monomer repeat unit comprising a moiety selected from the group consisting of an alkylthieno[3,4-c]pyrrole-4,6-dione moiety and a 1,3-dithiophene-5-alkylthieno[3,4-c]pyrrole-4,6-dione moiety, and the second co-monomer repeat unit comprising a moiety selected from the group consisting of a 4,4'-dialkyl-dithieno[3,2-b:2'3'-d]silole moiety, an ethylene moiety, a thiophene moiety, an N-alkylcarbazole moiety, an N-(1-alkyl)dithieno[3,2-b:2'3'-d]pyrrole moiety and a 4,8-dialkyloxylbenzo[1,2-b:3,4-b]dithiophene moiety.

In an embodiment, the present specification relates to a photoactive polymer wherein the first co-monomer repeat unit comprises an alkylthieno[3,4-c]pyrrole-4,6-dione moiety of Formula:

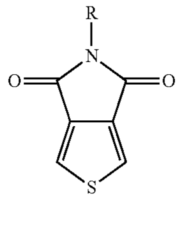

wherein R is an alkyl group.

In an embodiment, the present specification relates to a photoactive polymer, wherein the first co-monomer repeat unit comprises a 1,3-dithiophene-5-alkylthieno[3,4-c]pyrrole-4,6-dione moiety of Formula:

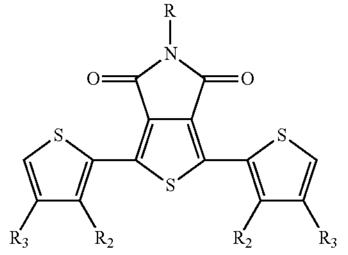

wherein R is an alkyl group and wherein $R_2$ and $R_3$ are independently selected from H and an alkyl group.

In an embodiment, the present specification relates to a photoactive polymer, wherein the second co-monomer repeat unit comprises a 4,4'-dialkyl-dithieno[3,2-b:2'3'-d]silole moiety of Formula:

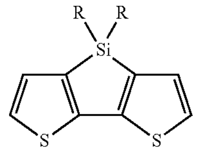

wherein R is an alkyl group.

In an embodiment, the present specification relates to a photoactive polymer, wherein the second co-monomer repeat unit comprises an ethylene moiety.

In an embodiment, the present specification relates to a photoactive polymer, wherein the second co-monomer repeat unit comprises a thiophene moiety.

In an embodiment, the present specification relates to a photoactive polymer, wherein the second co-monomer repeat unit comprises an N-alkylcarbazole moiety of Formula:

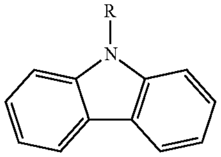

wherein R is an alkyl group.

In an embodiment, the present specification relates to a photoactive polymer, wherein the second co-monomer repeat unit comprises an N-(1-alkyl)dithieno[3,2-b:2'3'-d]pyrrole moiety of Formula:

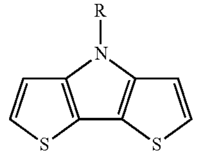

wherein R is an alkyl group.

In an embodiment, the present specification relates to a photoactive polymer, wherein the second co-monomer repeat unit comprises a 4,8-dialkyloxylbenzo[1,2-b :3,4-b]dithiophene moiety of Formula:

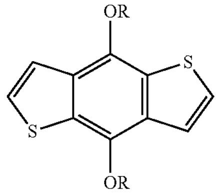

wherein R is an alkyl group.

In an embodiment, the present specification relates to a monomer of Formula I:

Formula I

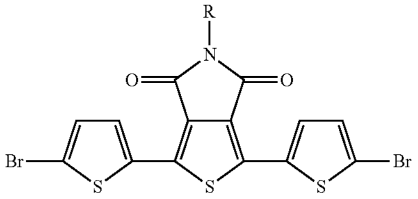

wherein R is an alkyl group.

In an embodiment, the present specification relates to polymers and co-polymers comprising a monomeric unit based on a monomer of Formula I:

Formula I

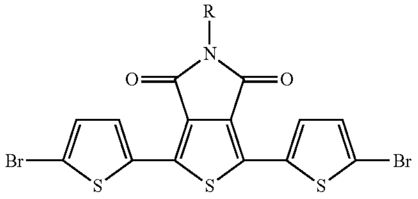

wherein R is an alkyl group.

In an embodiment, the present specification relates to electro-optical devices comprising at least one polymer or copolymer comprising a monomeric unit based on a monomer of Formula I:

Formula I

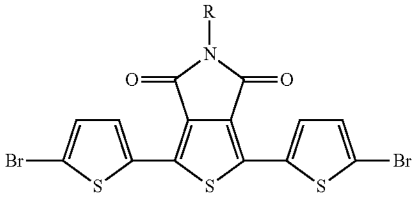

wherein R is an alkyl group.

In an embodiment, the present specification relates to a monomer of Formula II:

Formula II

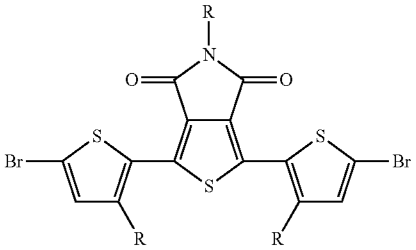

wherein R is an independently selected alkyl group.

In an embodiment, the present specification relates to polymers and co-polymers comprising a monomeric unit based on a monomer of Formula II:

Formula II

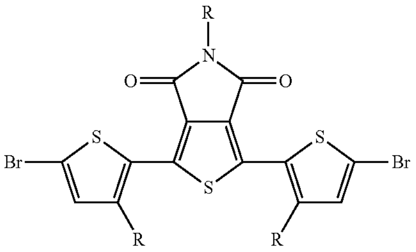

wherein R is an independently selected alkyl group.

In an embodiment, the present specification relates to a photoactive polymer of Formula III:

Formula III

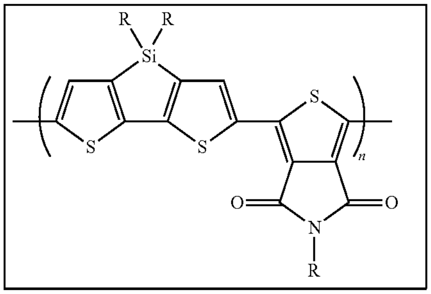

wherein R is an independently selected alkyl group and n is an integer ranging from 5 to 1000000.

In an embodiment, the present specification relates to a photoactive polymer of Formula IV:

Formula IV

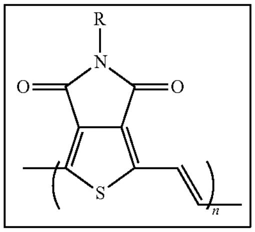

wherein R is an alkyl group and n is an integer ranging from 5 to 1000000.

In an embodiment, the present specification relates to a photoactive polymer of Formula V:

Formula V

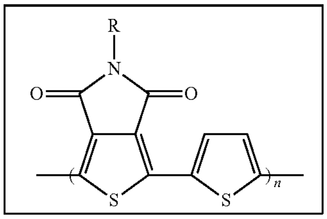

wherein R is an alkyl group and n is an integer ranging from 5 to 1000000.

In an embodiment, the present specification relates to a photoactive polymer of Formula VI:

Formula VI

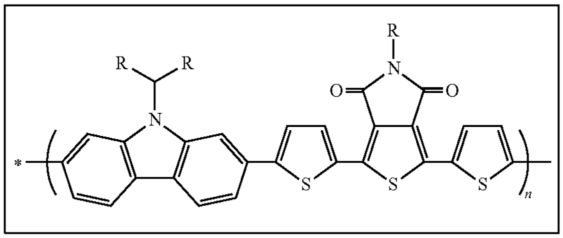

wherein R is an independently selected alkyl group and n is an integer ranging from 5 to 1000000.

In an embodiment, the present specification relates to a photoactive polymer of Formula VII:

Formula VII

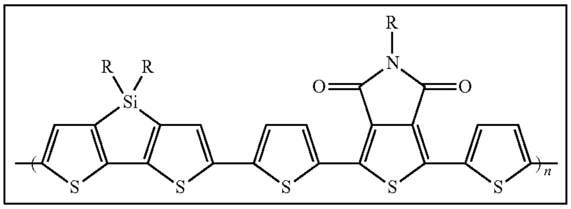

wherein R is an independently selected alkyl group and n is an integer ranging from 5 to 1000000.

In an embodiment, the present specification relates to a photoactive polymer of Formula VIII:

Formula VIII

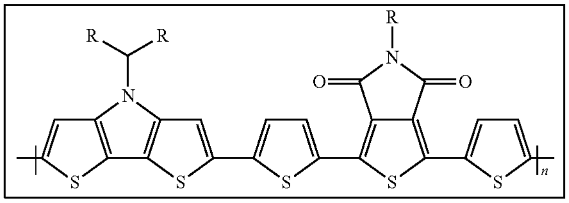

wherein R is an independently selected alkyl group and n is an integer ranging from 5 to 1000000.

In an embodiment, the present specification relates to a photoactive polymer of Formula IX:

Formula IX

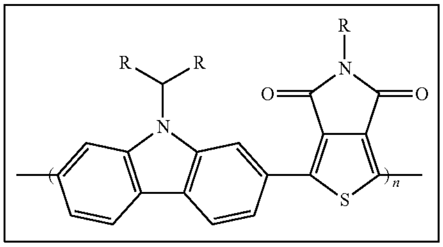

wherein R is an independently selected alkyl group and n is an integer ranging from 5 to 1000000.

In an embodiment, the present specification relates to a photoactive polymer of Formula X:

Formula X

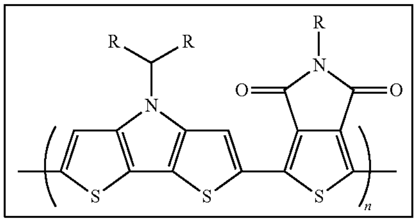

wherein R is an independently selected alkyl group and n is an integer ranging from 5 to 1000000.

In an embodiment, the present specification relates to a photoactive polymer of Formula XI:

Formula XI

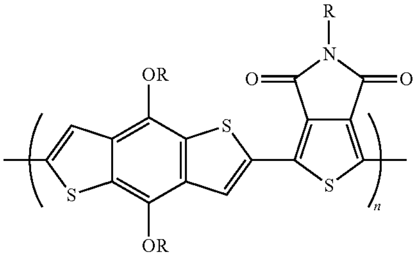

wherein R is an independently selected alkyl group and n is an integer ranging from 5 to 1000000.

In an embodiment, the present specification relates to a photoactive polymer of Formula XII:

Formula XII

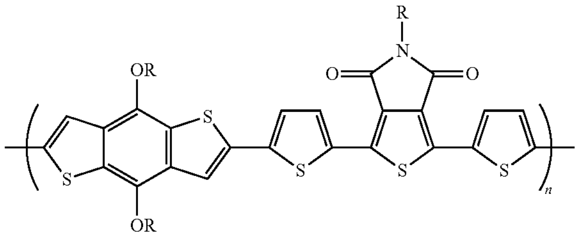

wherein R is an independently selected alkyl group and n is an integer ranging from 5 to 1000000.

In an embodiment, the present specification relates to a photoactive polymer of Formula XIII:

Formula XIII

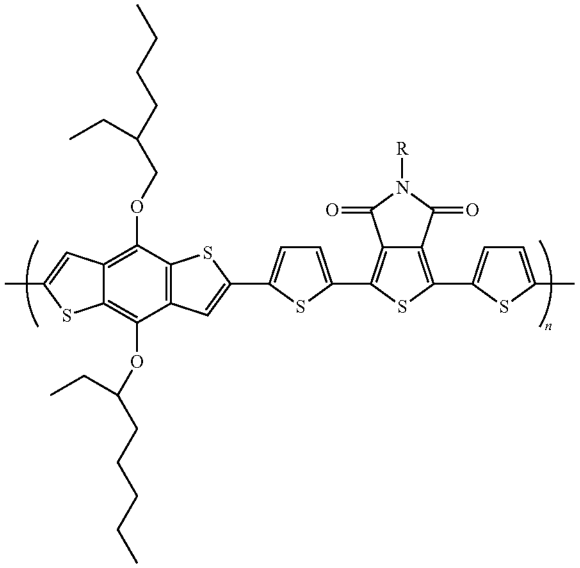

wherein R is an alkyl group and n is an integer ranging from 5 to 1000000.

In an embodiment, the present specification relates to a photoactive polymer of Formula XIV:

Formula XIV

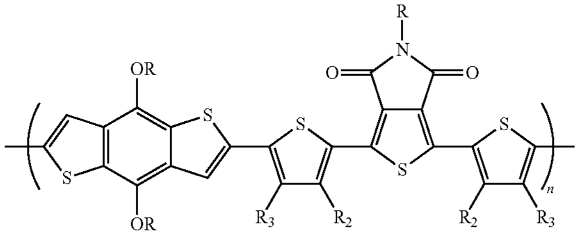

wherein R, $R_2$ and $R_3$ are is an independently selected alkyl group and wherein n is an integer ranging from 5 to 1000000.

In an embodiment, the present specification relates to a photoactive polymer of Formula:

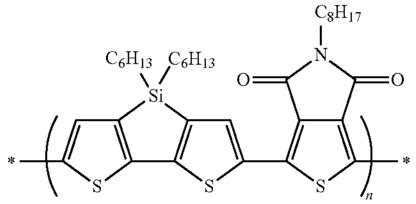

wherein n is an integer ranging from 5 to 1000000.

In an embodiment, the present specification relates to a photoactive polymer of Formula:

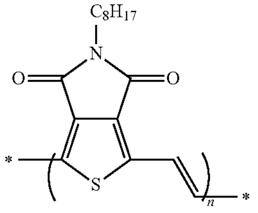

wherein n is an integer ranging from 5 to 1000000.

In an embodiment, the present specification relates to a photoactive polymer of Formula:

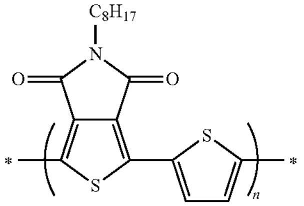

wherein n is an integer ranging from 5 to 1000000.

In an embodiment, the present specification relates to a photoactive polymer of Formula:

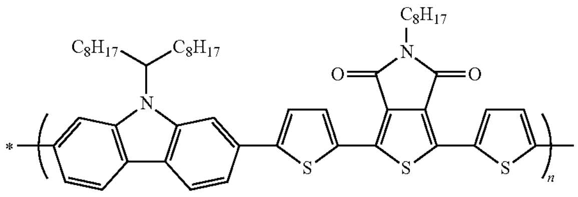

wherein n is an integer ranging from 5 to 1000000.

In an embodiment, the present specification relates to a photoactive polymer of Formula:

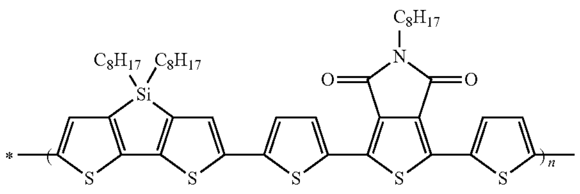

wherein n is an integer ranging from 5 to 1000000.

In an embodiment, the present specification relates to a photoactive polymer of Formula:

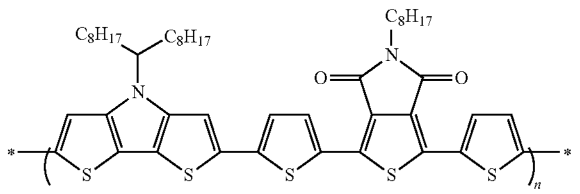

wherein n is an integer ranging from 5 to 1000000.

In an embodiment, the present specification relates to a photoactive polymer of Formula:

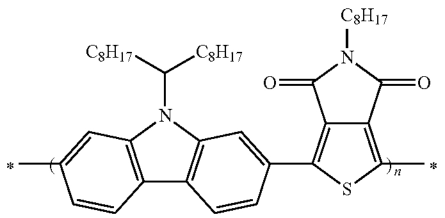

wherein n is an integer ranging from 5 to 1000000.

In an embodiment, the present specification relates to a photoactive polymer of Formula:

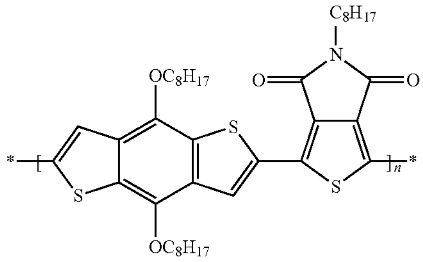

wherein n is an integer ranging from 5 to 1000000.

In an embodiment, the present specification relates to a photoactive polymer of Formula:

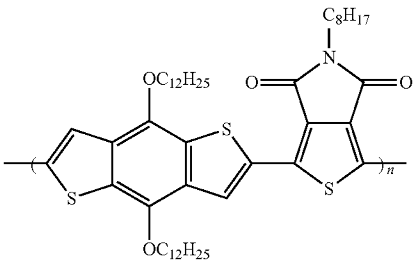

wherein n is an integer ranging from 5 to 1000000.

In an embodiment, the present specification relates to a photoactive polymer of Formula:

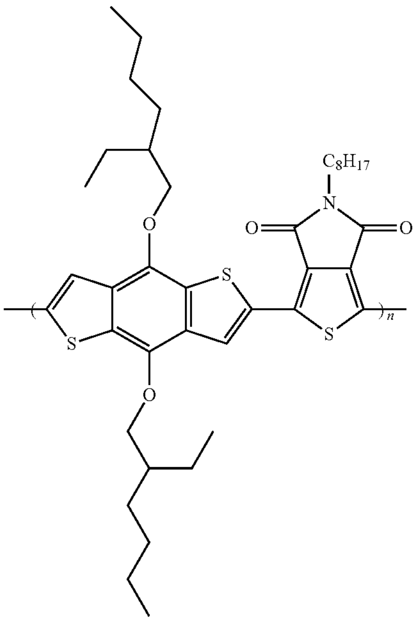

wherein n is an integer ranging from 5 to 1000000.

In an embodiment, the present specification relates to a photoactive polymer of Formula:

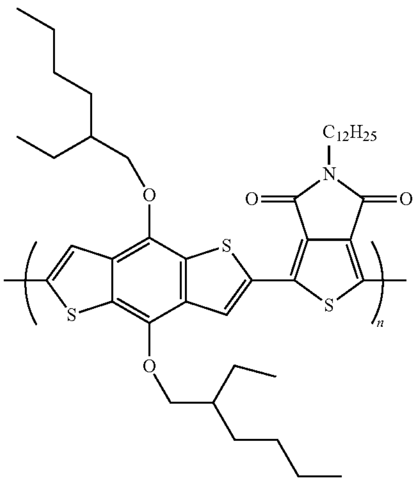

wherein n is an integer ranging from 5 to 1000000.

In an embodiment, the present specification relates to a photoactive polymer of Formula:

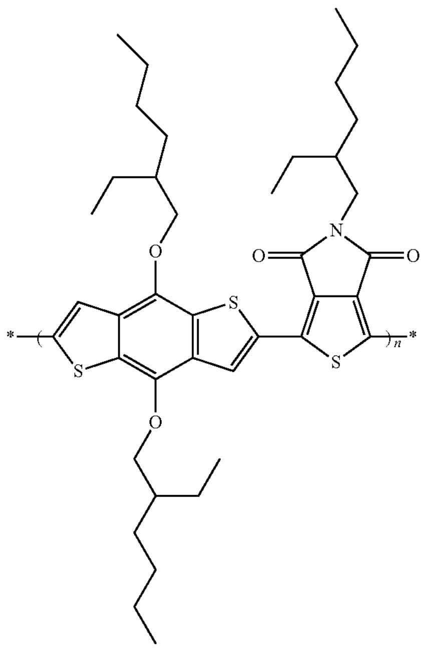

wherein n is an integer ranging from 5 to 1000000.

In an embodiment, the present specification relates to a photoactive polymer of Formula:

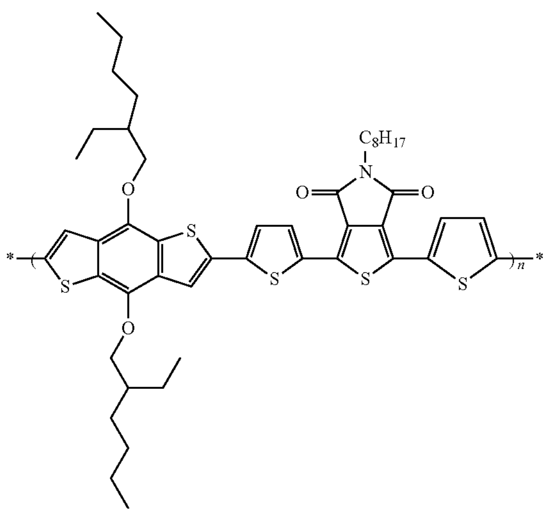

wherein n is an integer ranging from 5 to 1000000.

In an embodiment, the present specification relates to a photoactive polymer of Formula:

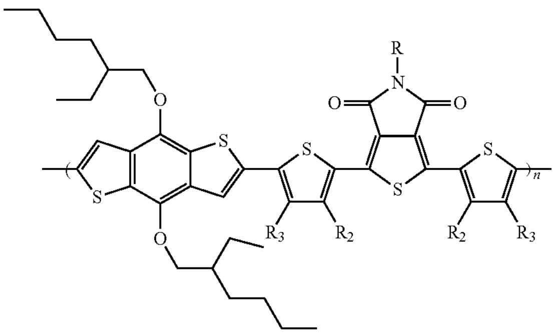

wherein R, $R_2$ and $R_3$ are is an independently selected alkyl group and wherein n is an integer ranging from 5 to 1000000.

In an embodiment, the present specification relates to a system comprising first and second electrodes; and at least one photoactive layer between the first and second electrodes, the photoactive layer comprising a photoactive polymer comprising first and second co-monomer repeat units, the first co-monomer repeat unit comprising a moiety selected from the group consisting of an alkylthieno[3,4-c]pyrrole-4,6-dione moiety and a 1,3-dithiophene-5-alkylthieno[3,4-c]pyrrole-4,6-dione moiety, and the second co-monomer repeat unit comprising a moiety selected from the group consisting of a 4,4'-dialkyl-dithieno[3,2-b:2'3'-d]silole moiety, an ethylene moiety, a thiophene moiety, an N-alkylcarbazole moiety, an N-(1-alkyl)dithieno[3,2-b:2'3'-d]pyrrole moiety and a 4,8-dialkyloxylbenzo[1,2-b:3,4-b]dithiophene moiety; wherein the system is configured as a photovoltaic system.

The foregoing and other objects, advantages and features of the present specification will become more apparent upon reading of the following non-restrictive description of illustrative embodiments thereof, given by way of example only with reference to the accompanying drawings.

DETAILED DESCRIPTION

Figure 1:
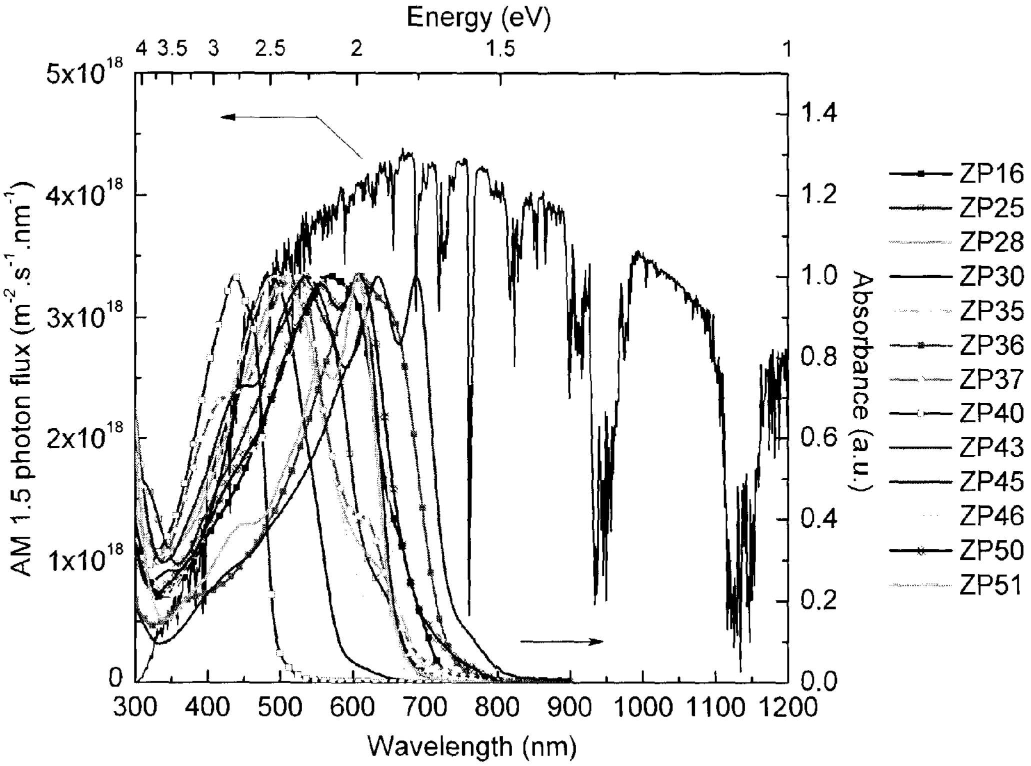
FIG. 1 is an illustration of the UV-vis spectra taken at room temperature in a chloroform solution and the solar spectral irradiance (Air Mass 1.5) for various thieno[3,4-c]pyrrole-4,6-dione-based polymers in accordance with an embodiment of the present specification.

In order to provide a clear and consistent understanding of the terms used in the present specification, a number of definitions are provided below. Moreover, unless defined otherwise, all technical and scientific terms as used herein have the same meaning as commonly understood by one of ordinary skill in the art to which this specification pertains.

The use of the word "a" or "an" when used in conjunction with the term "comprising" in the claims and/or the specification may mean "one", but it is also consistent with the meaning of "one or more", "at least one", and "one or more than one". Similarly, the word "another" may mean at least a second or more.

As used in this specification and claim(s), the words "comprising" (and any form of comprising, such as "comprise" and "comprises"), having (and any form of having, such as "have" and "has"), "including" (and any form of including, such as "include" and "includes"), or "containing" (and any form of containing, such as "contain" and "contains"), are inclusive and open-ended and do not exclude additional, unrecited elements or process steps.

The term "about" is used to indicate that a value includes an inherent variation of error for the device or the method being employed to determine the value.

As used herein, the term "alkyl" can be straight-chain or branched. This also applies if they carry substituents or occur as substituents on other residues, for example in alkoxy residues, alkoxycarbonyl residues or arylalkyl residues. Substituted alkyl residues can be substituted in any suitable position. Examples of alkyl residues containing from 1 to 18 carbon atoms are methyl, ethyl, propyl, butyl, pentyl, hexyl, heptyl, octyl, nonyl, decyl, undecyl, dodecyl, tetradecyl, hexadecyl and octadecyl, the n-isomers of all these residues, isopropyl, isobutyl, isopentyl, neopentyl, isohexyl, isodecyl, 3-methylpentyl, 2,3,4-trimethylhexyl, sec-butyl, tert-butyl, or tert-pentyl. A specific group of alkyl residues is formed by the residues methyl, ethyl, n-propyl, isopropyl, n-butyl, isobutyl, sec-butyl and tert-butyl.

As used herein, the term "lower alkyl" can be straight-chain or branched. This also applies if they carry substituents or occur as substituents on other residues, for example in alkoxy residues, alkoxycarbonyl residues or arylalkyl residues. Substituted alkyl residues can be substituted in any suitable position. Examples of lower alkyl residues containing from 1 to 6 carbon atoms are methyl, ethyl, propyl, isopropyl, butyl, isobutyl, tert-butyl, pentyl, isopentyl, neopentyl, and hexyl.

In an embodiment, the present specification relates to thieno[3,4-c]pyrrole-4,6-dione and related compounds as electron accepter units to be copolymerized with electron donors for the manufacture of photoactive polymers useful in photovoltaic devices. The rigid structure of the thieno[3,4-c] pyrrole-4,6-dione unit enhances electron delocalization when incorporated into the conjugated backbone of photoactive polymers. It is believed that the rigid structure promotes interactions between polymer chains and improves the charge carrier mobility. Moreover, the diketone functional group is a strong electron-withdrawing unit which is efficient in lowering the HOMO energy level to ensure high open circuit potentials. Finally, positioning alkyl chains of various lengths on the nitrogen atom is susceptible to lead to highly soluble and easily processable materials.

In an embodiment, the present specification relates to the synthesis and characterization [X-ray scattering (GIXS) and atomic force microscopy (AFM)] of polymers based on BDT and alkylated-TPD comonomers, with or without thiophene spacers. The thiophene units were added in order to tune the electronic properties and to enhance photon harvesting.

In accordance with an embodiment of the present specification, various N-alkylated TBD derivatives were prepared using the synthetic route shown herein below in Scheme 1.

Scheme 1:

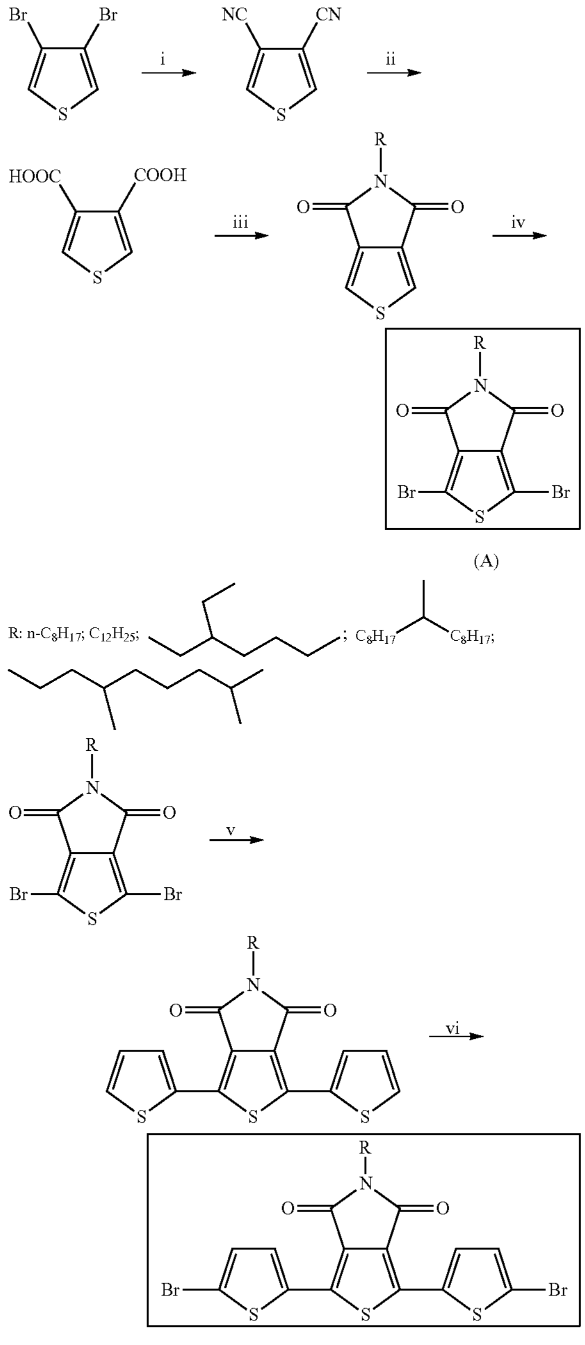

(A)

(B)

Reagents and conditions:
(i) CuCN, DMF, 140° C., 12-24 h, 45% yield;
(ii) KOH, ethylene glycol, reflux, overnight, 75% yield;
(iii) $Ac_2O$, 140° C., overnight, then $RNH_2$, toluene, reflux 24 h, following $SOCl_2$, reflux, 12 h, total yield 50-60%;
(iv) Con $H_2SO_4$, $CF_3COOH$, NBS, rt, overnight, 81% yield;
(v) tributyltin, thiophene, $Pd(PPh_3)_2Cl_2$, THF, reflux, 10 h, 75% yield;
(vi) NBS, $CHCl_3$, AcOH, rt, 24 h, 98% yield.

In accordance with a further embodiment of the present specification, various additional N-alkylated TPD derivatives were obtained using the synthetic route shown herein below in Scheme 2.

Scheme 2:

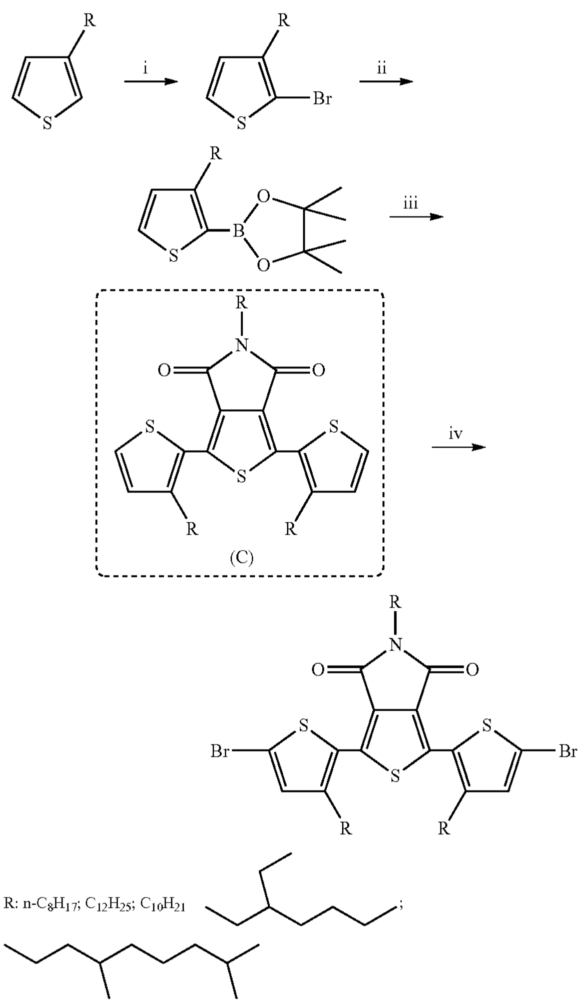

(C)

Reagents and conditions:
(i) NBS, DMF, rt, 12 h, 90% yield;
(ii) BuLi, THF, 2-isopropoxy-4,4,5,5-tetramethyl[1,3,2]dioxaboralane, 78% yield; (iii) $Pd(Ph_3)_4$, $K_2CO_3$, THF, reflux, 72% yield;
(iv) NBS, $CHCl_3$, AcOH, rt, 24 h, 89% yield.

In accordance with an embodiment of the present specification, various electron donor units (monomers) to be co-polymerized with the TPD derivatives were prepared using the synthetic routes shown hereinbelow in Schemes 3-5.

Scheme 3: Reagents and conditions:

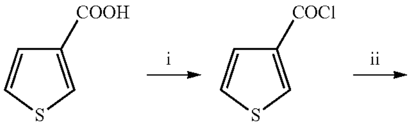

-continued

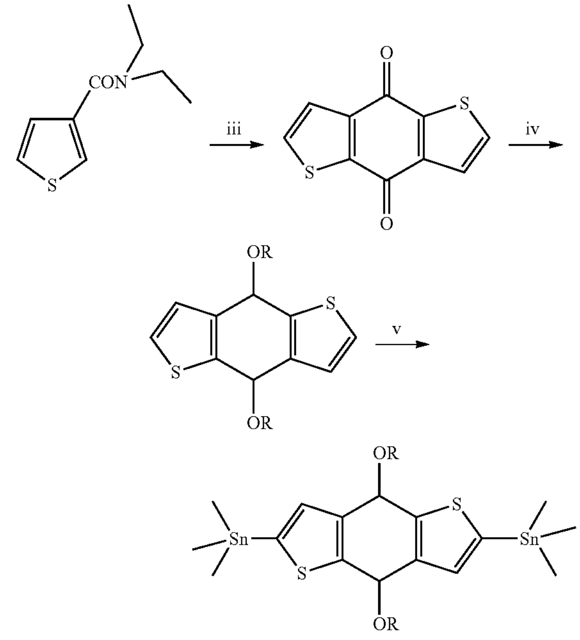

R: n-$C_8H_{17}$; $C_{12}H_{25}$;

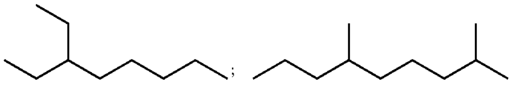

Reagents and conditions:
(i) DCM, oxalyl chloride, rt, overnight;
(ii) DCM, diethylamine, rt, overnight, 91% yield;
(iii) THF, BuLi, rt, 4 h, 82% yield;
(iv) Zn dust, water, NaOH, RBr, $Bu_4NBr$, 70-90% yield;
(v) BuLi, THF, $(CH_3)_3SnCl$, 80-95% yield.

Scheme 4:

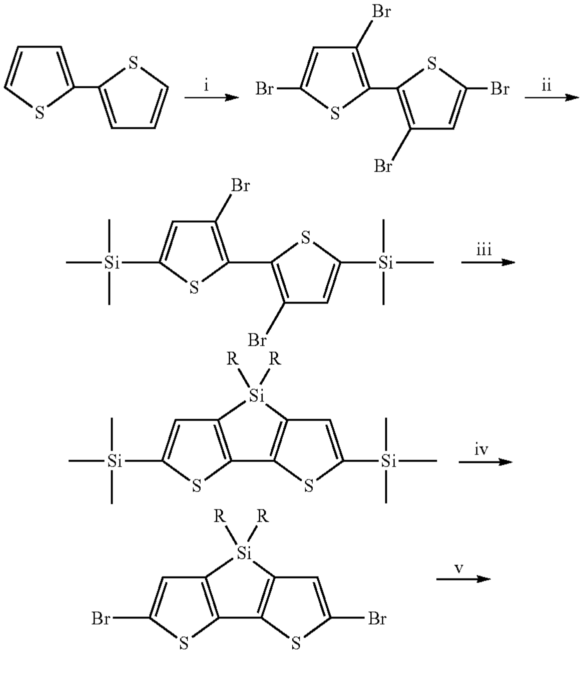

-continued

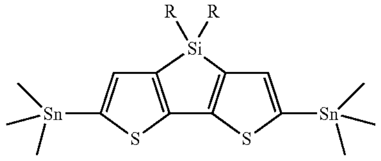

Reagents and conditions:
R: $C_8H_{17}$; $C_6H_{13}$
(i) $Br_2$, $CH_3COOH$, $CHCl_3$, 78% yield;
(ii) n-BuLi, THF, TMSCl, 67% yield;
(iii) n-BuLi, THF, $Cl_2Si(C_8H_{17})_2$, 72% yield;
(iv) NBS, THF, rt, overnight, 85% yield.
(v) BuLi, THF, $(CH_3)_3SnCl$, 84% yield.

Scheme 5:

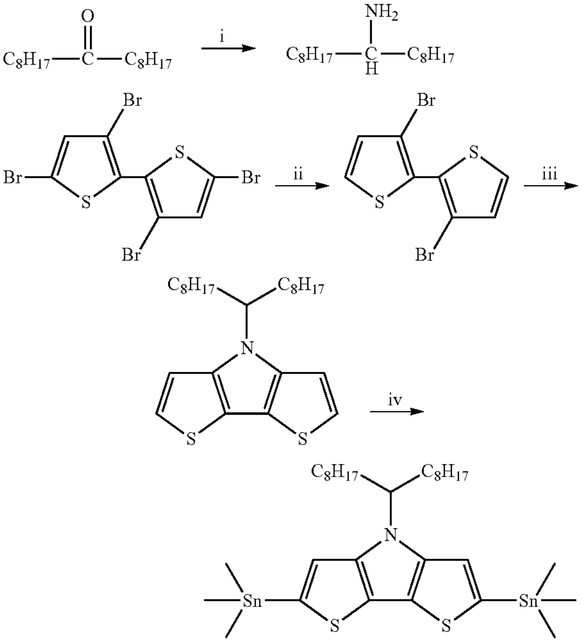

Reagents and conditions:
(i) $NH_4Ac$, $NaBH_3CN$, $CH_3OH$, rt, 3 days, 82% yield;
(ii) Zn dust, $C_2H_5OH$, $H_2O$, AcOH, HCl, reflux, overnight, 67% yield;
(iii) t-BuONa, $Pd_2(dba)_3$, BINAP, Toluene, $RNH_2$, reflux, 7 h, 94% yield;
(iv) BuLi, THF, $(CH_3)_3SnCl$, 82% yield.

In accordance with an embodiment of the present specification, the synthesis of various polymers comprising a thieno [3,4-c]pyrrole-4,6-dione unit is disclosed hereinbelow in Scheme 6. All the polymers were prepared using the Stille or Suzuki cross-coupling reaction.

Scheme 6: Various illustrative polymers comprising a thieno [3,4-c] pyrrole-4,6-dione unit.

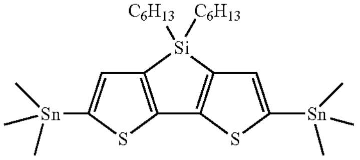

+

-continued
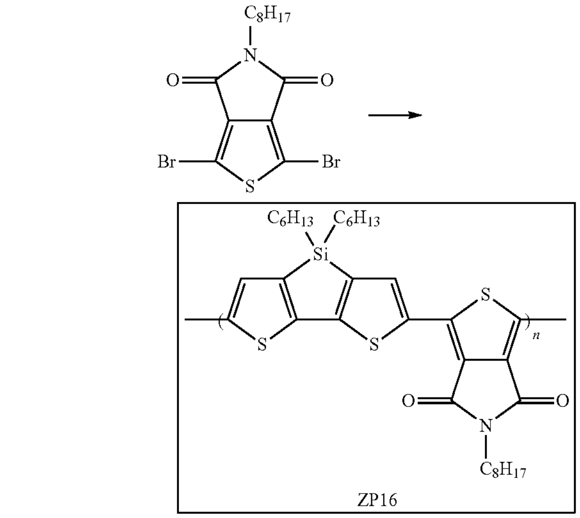
ZP16
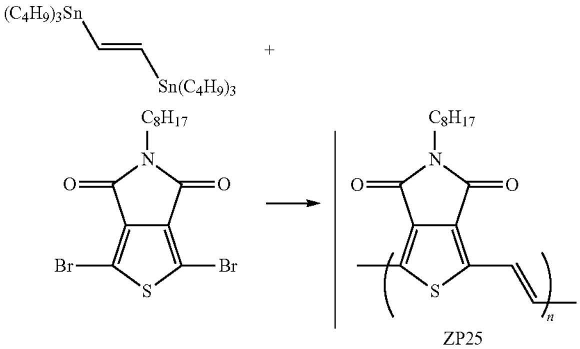
ZP25
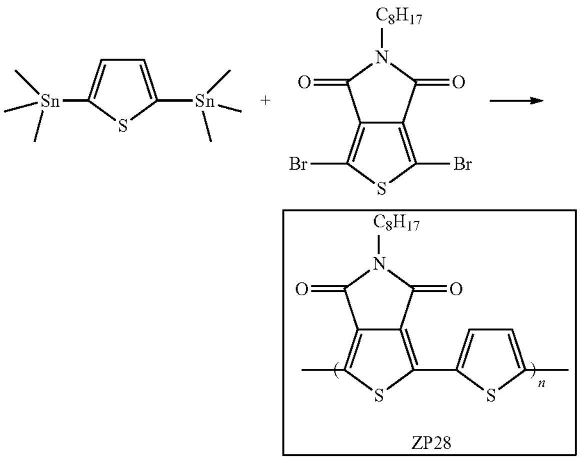
ZP28
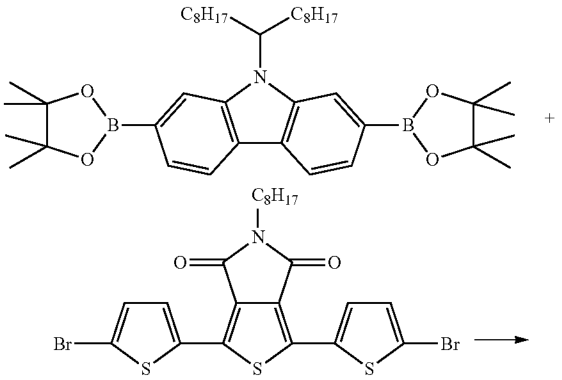
-continued
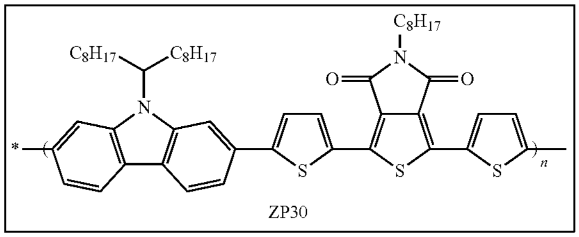
ZP30
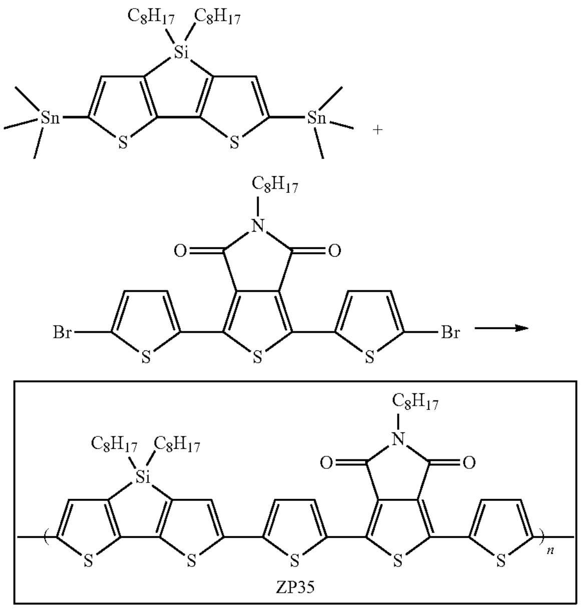
ZP35
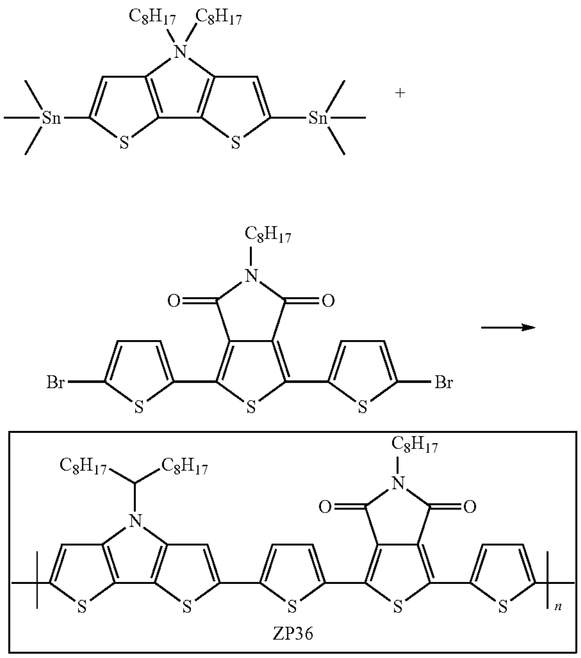
ZP36
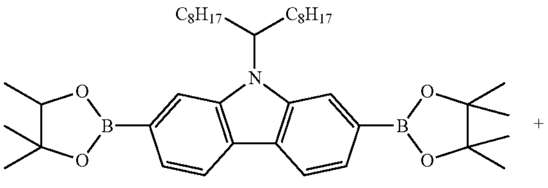

-continued
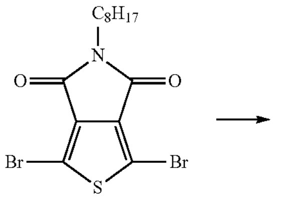
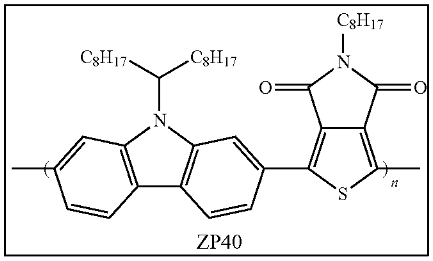
ZP40
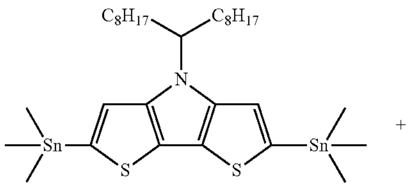
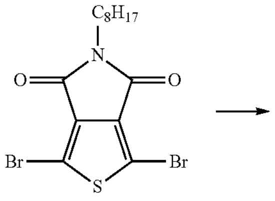
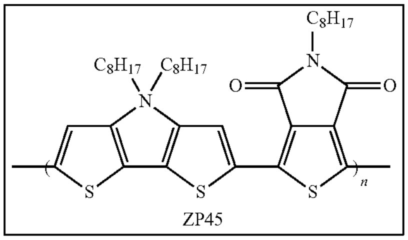
ZP45
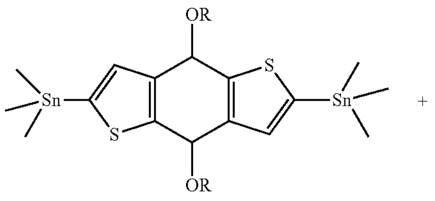
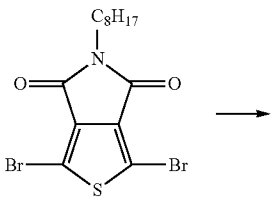
-continued
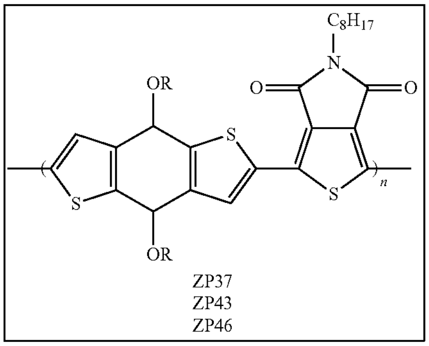
ZP37
ZP43
ZP46
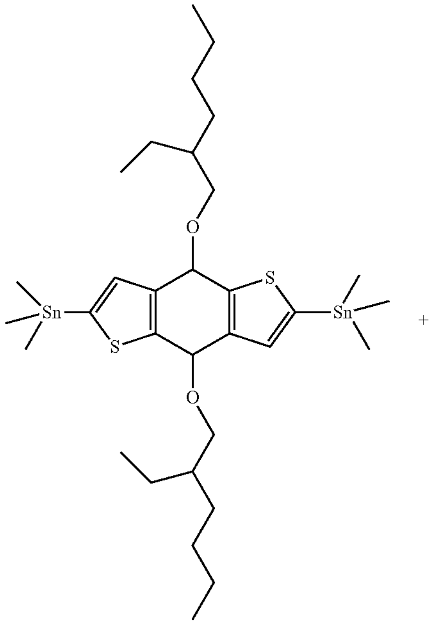
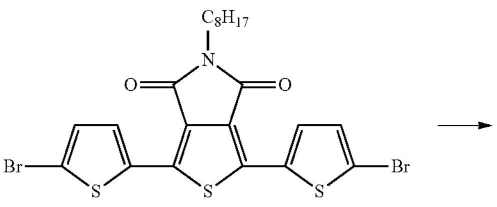

-continued

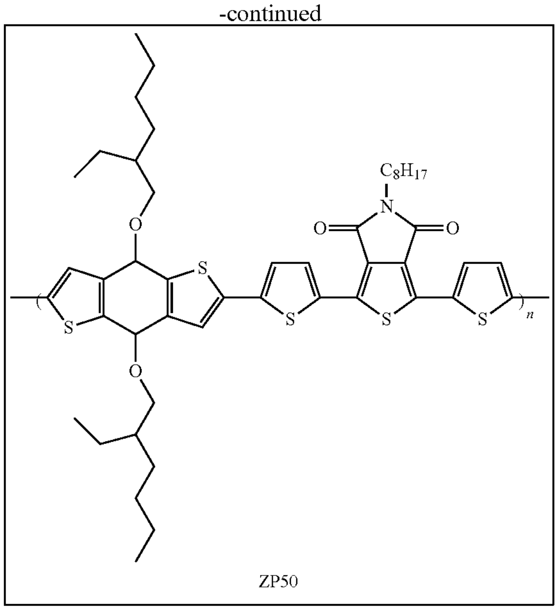

ZP50

-continued

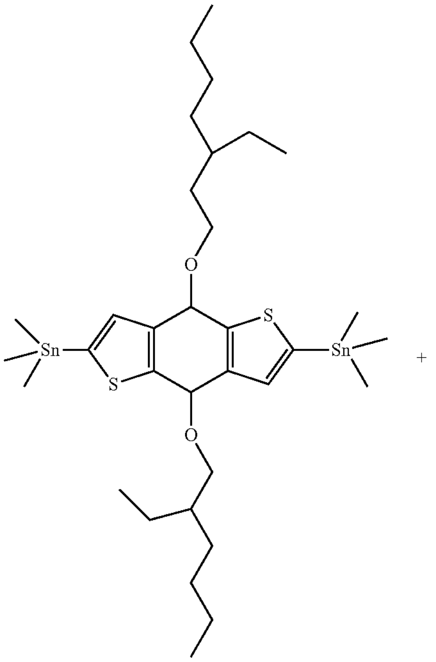

+

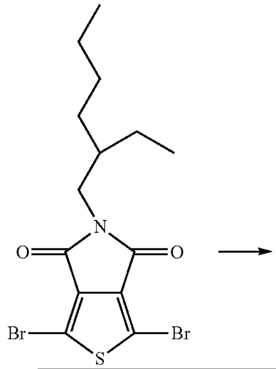

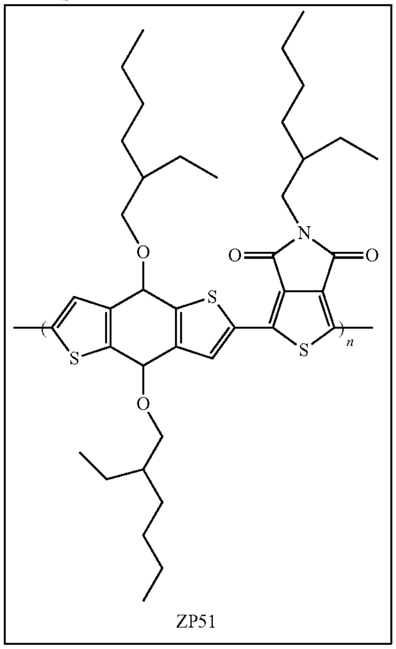

ZP51

Polymerization yields, molecular weights and selected thermal properties of the polymers illustrated in Scheme 6 are summarized hereinbelow in Table 1. The polymers were shown to be thermally stable having Td values of over 400° C. Some of the polymers such as ZP25, ZP 37 or ZP46 were not soluble in most common solvent or solvent systems. However, the solubility could be improved by varying the nature of the alkyl chain (Scheme 2).

TABLE 1

Polymerization yields, Molecular weights[a], and various Thermal properties of the polymers illustrated in Scheme 6.

| Structures | Polymers | Yield (%) | $M_n$ (kg/mol) | $M_w$ (kg/mol) | $M_w/M_n$ | $T_d$ [b](° C.) |
|---|---|---|---|---|---|---|
| 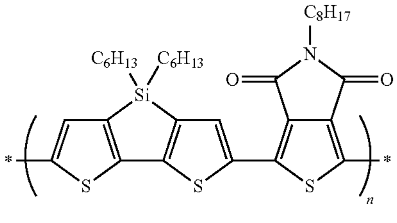 (black solid) | ZP16 | 65 | | | | |

TABLE 1-continued
| Polymerization yields, Molecular weights[a], and various Thermal properties of the polymers illustrated in Scheme 6. | | | | | | |
|---|---|---|---|---|---|---|
| Structures | Polymers | Yield (%) | $M_n$ (kg/mol) | $M_w$ (kg/mol) | $M_w/M_n$ | $T_d$ [b](° C.) |
| 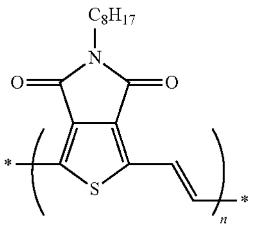 (purple dark solid) | ZP25 | 15 | Poor solubility at room temperature | | | 426 |
| 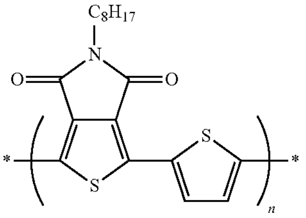 (purple dark solid) | ZP28 | 26 | 1.6 | 1.9 | 1.13 | 468 |
| 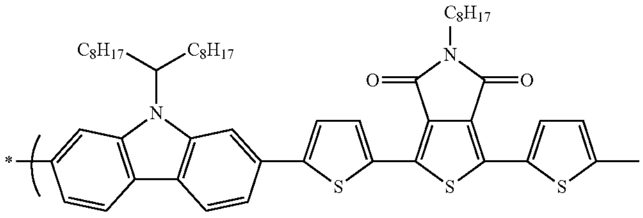 (red-dark solid) | ZP30 | 76 | 12.7 | 23.6 | 1.86 | 452 |
| 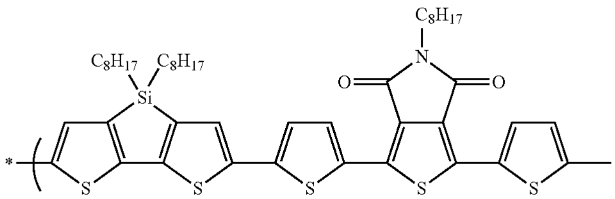 (purple dark solid) | ZP35 | 41 | 2.5 | 5.2 | 2.08 | |
| 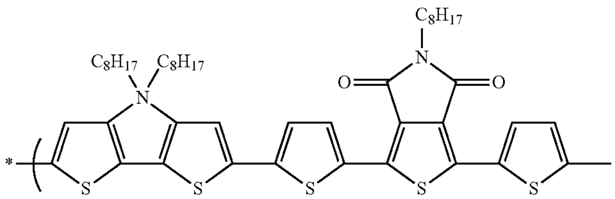 (blue dark solid) | ZP36 | 75 | 19.8 | 36.4 | 1.83 | |

TABLE 1-continued
Polymerization yields, Molecular weights[a], and various Thermal properties of the polymers illustrated in Scheme 6.
| Structures | Polymers | Yield (%) | $M_n$ (kg/mol) | $M_w$ (kg/mol) | $M_w/M_n$ | $T_d$ [b](° C.) |
|---|---|---|---|---|---|---|
| 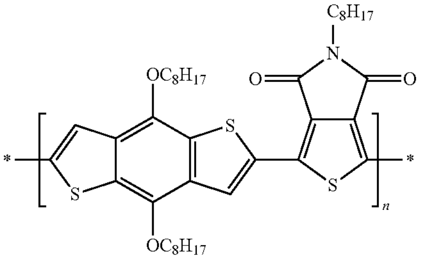 (purple dark solid) | ZP37 | 43 | Poor solubility at room temperature | | | |
| 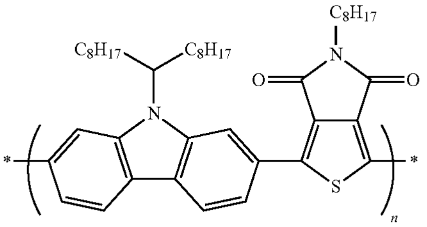 (brown-red solid) | ZP40 | 55 | 2.9 | 4 | 1.4 | |
| 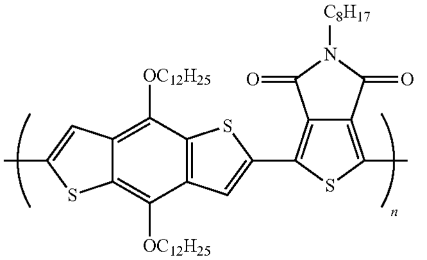 (purple dark solid) | ZP43 | 72 | 4.9 | 10.6 | 2.2 | |
| 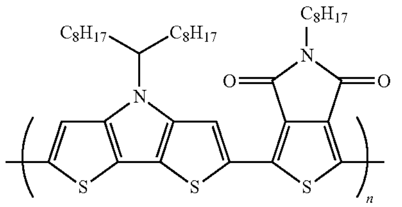 (blue dark solid) | ZP45 | 89 | 7.9 | 17.1 | 2.16 | |

TABLE 1-continued
| Polymerization yields, Molecular weights[a], and various Thermal properties of the polymers illustrated in Scheme 6. | | | | | | |
|---|---|---|---|---|---|---|
| Structures | Polymers | Yield (%) | $M_n$ (kg/mol) | $M_w$ (kg/mol) | $M_w/M_n$ | $T_d$ [b](° C.) |
| 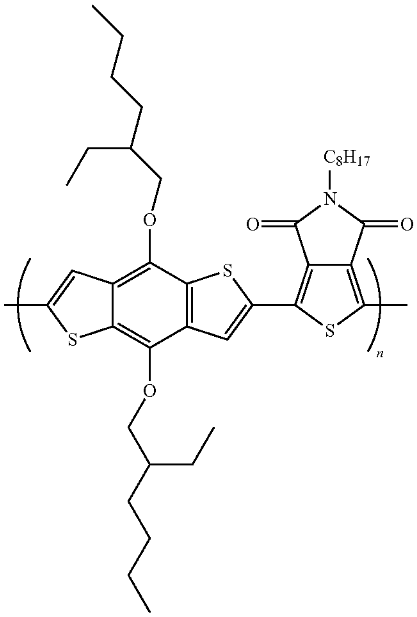 (purple dark solid) | ZP46 | 98 | Propensity to aggregate, must be measured at high temperatures | | | |
| 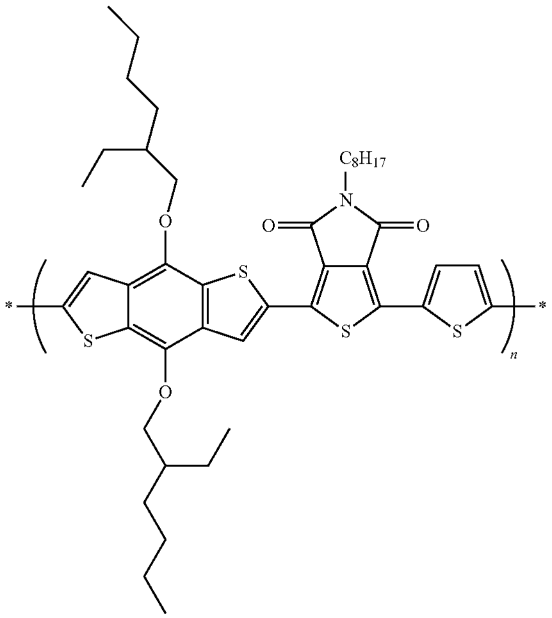 (purple dark solid) | ZP50 | 23 | Poor solubility at room temperature | | | |

TABLE 1-continued

Polymerization yields, Molecular weights[a], and various Thermal properties of the polymers illustrated in Scheme 6.

| Structures | Polymers | Yield (%) | $M_n$ (kg/mol) | $M_w$ (kg/mol) | $M_w/M_n$ | $T_d$ [b](° C.) |
|---|---|---|---|---|---|---|
| 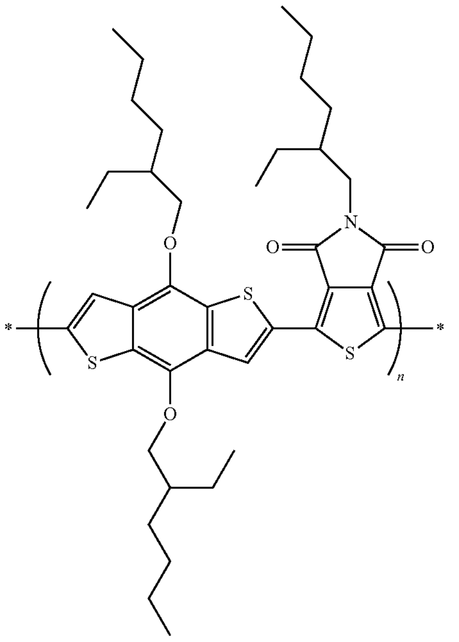 (purple dark solid) | ZP51 | 84 | | | | |

[a]Determined by SEC in $CHCl_3$ based on polystyrene standards.
[b]Temperature at 5% weight loss under nitrogen.

Figure 2:
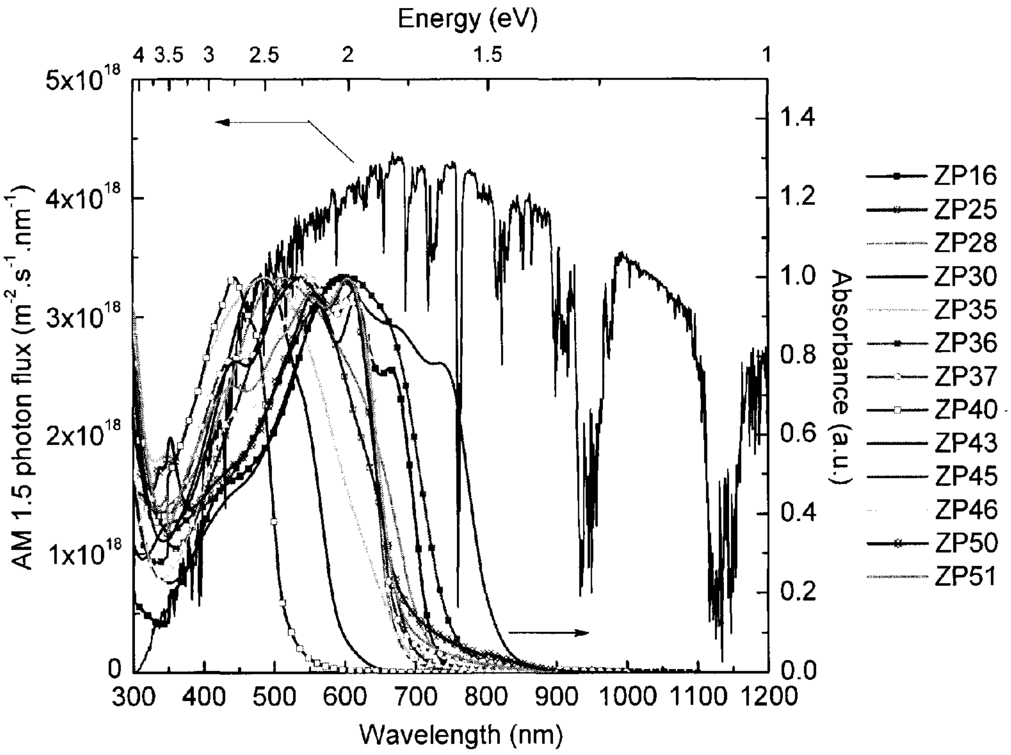
FIG. 2 is an illustration of the UV-vis spectra taken at room temperature for various thieno[3,4-c]pyrrole-4,6-dione-based polymers cast from a chloroform solution onto a glass substrate and the solar spectral irradiance (Air Mass 1.5) in accordance with an embodiment of the present specification.

Selected optical and electrochemical properties of the polymers illustrated in Scheme 6 are summarized hereinbelow in Table 2. The optical properties were characterized by UV-vis-NIR spectroscopy (FIGS. 1 and 2). In solution, the UV-vis-NIR absorption spectra show an absorbance ranging from 437 (ZP40) to 689 nm (ZP45) (FIG. 1). In the solid state, the UV-vis-NIR absorption spectra show an absorbance ranging from 530 (ZP40) to 840 nm (ZP45) (FIG. 2). The absorption spectra of the novel photoactive polymers of the present specification are thus located in the ideal range of the solar emission spectra.

TABLE 2

Optical and Electrochemical Properties of the Polymers illustrated in Scheme 6.

| | UV-vis-NIR absorption spectra | | | | Cyclic voltammetry(vs SCE) | | | |
|---|---|---|---|---|---|---|---|---|
| | Solution[a] | Film[b] | | | p-doping | n-doping | | |
| | $\lambda_{max}$ (nm) | $\lambda_{max}$ (nm) | $\lambda_{onset}$ (nm) | $E_g^{optc}$ (eV) | $E_{on}^{ox}$/HOMO (V)/(eV) | $E_{on}^{red}$/LUMO[d] (V)/(eV) | $E_g^{EC}$ (eV) | PCE (Expected) |
| ZP16 | 567 | 598 | 738 | 1.68 | 0.82/−5.52 | −0.94/−3.76 | 1.76 | 8 |
| ZP25 | 533 | 532 | 730 | 1.70 | 1.05/−5.75 | −0.71/−3.99 | 1.76 | 10 |
| ZP28 | 505 | 510 | 745 | 1.66 | 1.07/−5.77 | −0.76/−3.94 | 1.83 | 10 |
| ZP30 | 488 | 484 | 628 | 1.97 | 1.01/−5.71 | −0.96/−3.74 | 1.97 | 6.5 |
| ZP35 | 494 | 496 | 698 | 1.77 | 0.91/−5.61 | −0.99/−3.71 | 1.90 | 7 |
| ZP36 | 609 | 604 | 765 | 1.62 | 0.51/−5.21 | −0.95/−3.75 | 1.46 | 7.5 |
| ZP37 | 524 | 544, 613 | 685 | 1.81 | 0.91/−5.61 | −0.88/−3.82 | 1.79 | 8.5 |
| ZP40 | 437 | 445 | 530 | 2.33 | 1.20/−5.90 | −0.98/−3.72 | 2.18 | 6 |
| ZP43 | 537 | 548, 616 | 685 | 1.81 | 0.95/−5.65 | −0.9/−3.8 | 1.85 | 9 |
| ZP45 | 633, 689 | 590 (broad) | 840 | 1.47 | 0.64/−5.34 | −0.89/−3.81 | 1.53 | 8.5 |
| ZP46 | 547, 602 | 546, 618 | 685 | 1.81 | 0.95/−5.65 | −0.86/−3.84 | 1.81 | 9 |
| ZP50 | 553, 612 | 606 | 708 | 1.75 | 0.82/−5.52 | −0.84/−3.86 | 1.66 | 9 |
| ZP51 | 608 | 608 | 692 | 1.79 | 1.05/−5.75 | −0.83/−3.87 | 1.88 | 9 |

[a]Measured in chloroform solution.
[b]Cast from chloroform solution.
[c]Bandgap estimated from the onset wavelength of the optical absorption.
[d]HOMO = $-e(E_{on}^{ox} + 4.7)$ (eV); LUMO = $-e(E_{on}^{red} + 4.7)$ (eV), assuming SCE to be −4.7 V.

Figure 3:
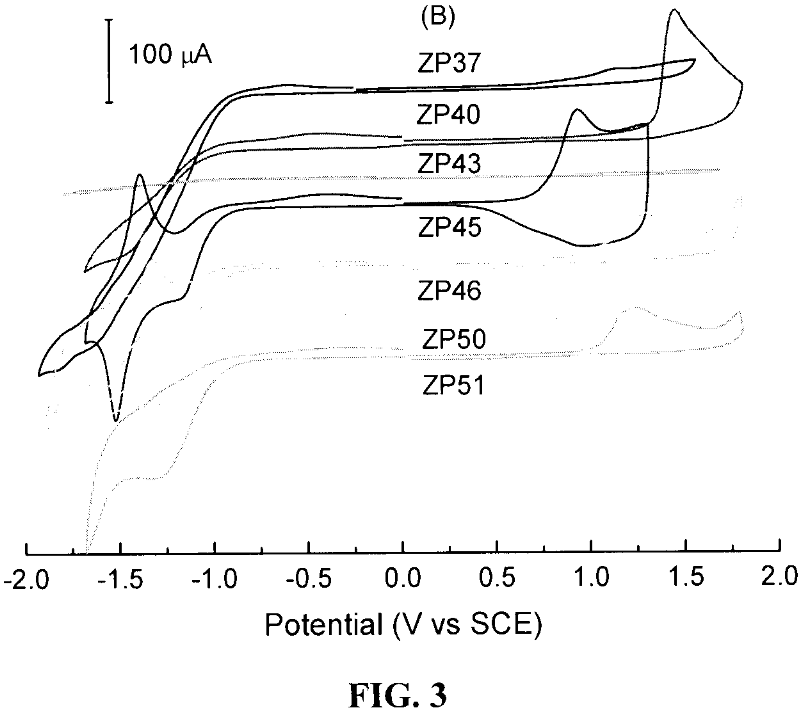
FIG. 3 is an illustration of the cyclic voltammograms (second scan) for various thieno[3,4-c]pyrrole-4,6-dione-based polymer films cast on a platinum wire from a $Bu_4NBF_4$/acetonitrile solution at 30 mV/s in accordance with an embodiment of the present specification [(A) ZP16 to ZP 36] and [(B) ZP37 to ZP51].
Figure 4:
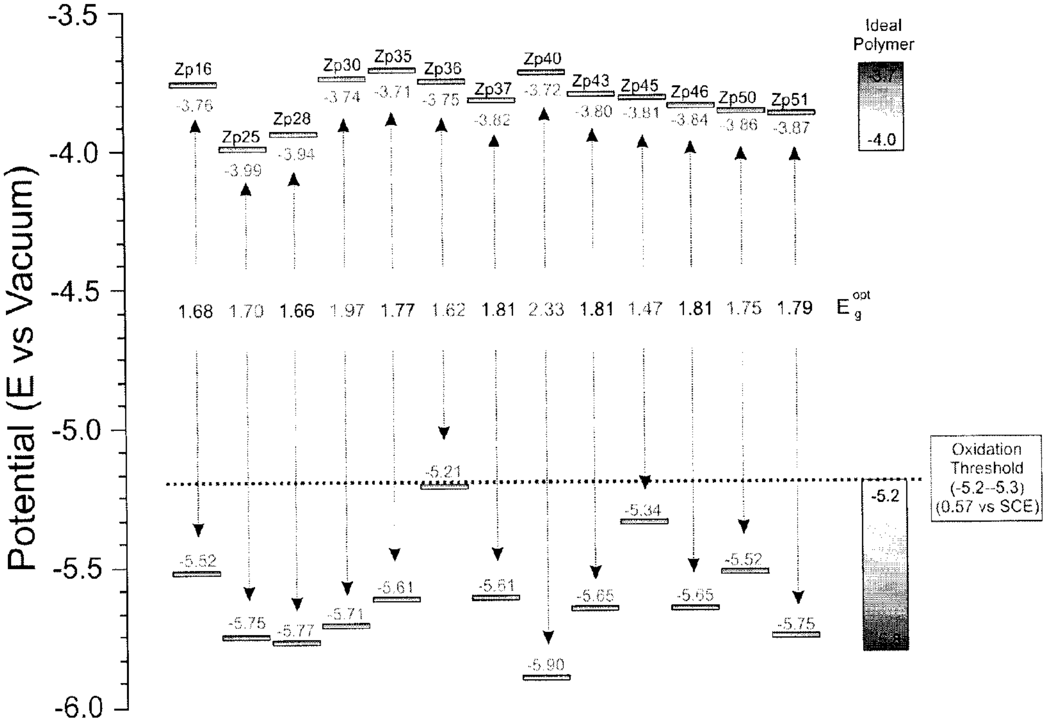
FIG. 4 is an illustration of the experimental energy levels for various thieno[3,4-c]pyrrole-4,6-dione-based polymers in accordance with an embodiment of the present specification.

Cyclic voltammetry measurements were performed (FIG. 3) in order to estimate the HOMO/LUMO energy levels and the bandgap of the polymers illustrated in Scheme 6. The electrochemical bandgaps were shown to range between 1.53 eV (ZP45) and 2.18 eV (ZP40). The HOMO energy levels were shown to range between −5.21 eV (ZP36) and −5.90 eV (ZP45), which means that the polymers, with the exception of ZP36, can be considered as being air-stable (FIG. 4). The LUMO energy levels were shown to be located at energy levels conducive to efficient electron transfer and were measured to range between −3.71 eV (ZP35) and −3.99 eV (ZP25) (FIG. 4).

Device Properties

Figure 5:
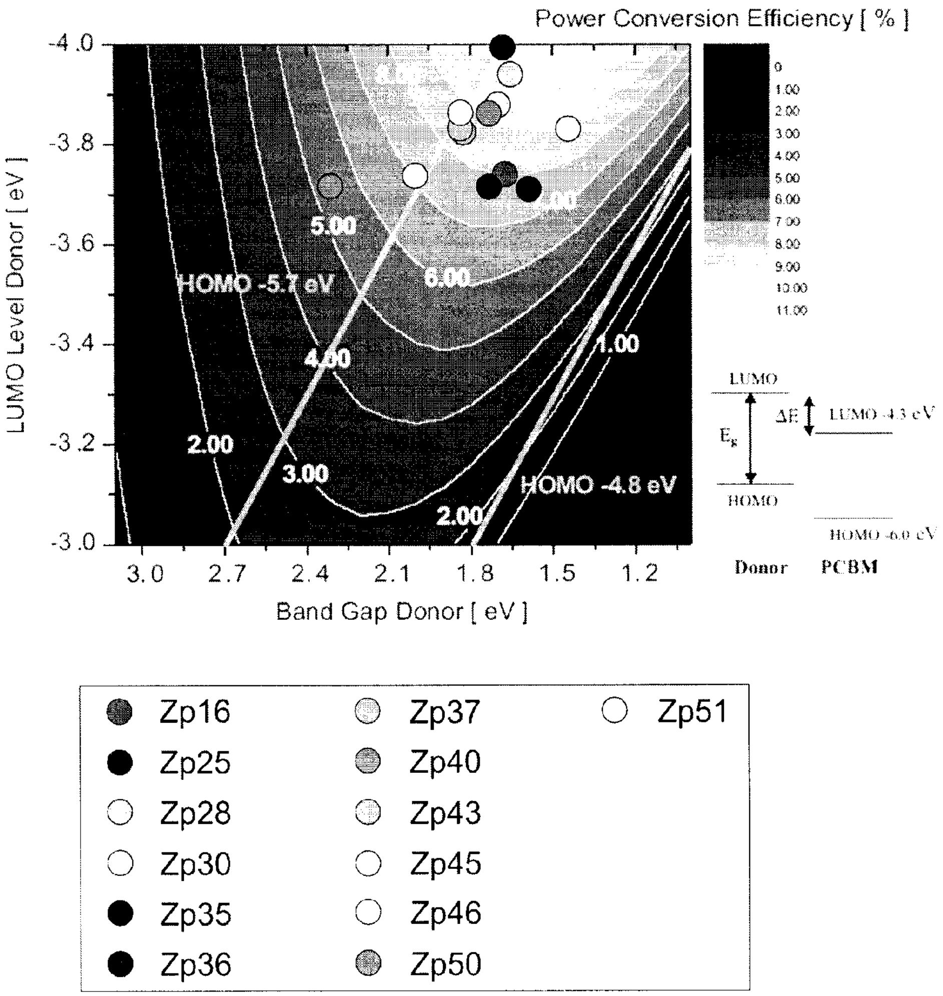
FIG. 5 is an illustration of the estimated Power Conversion Efficiency (PCE) for various thieno[3,4-c]pyrrole-4,6-dione-based polymers in accordance with an embodiment of the present specification.
Figure 6:
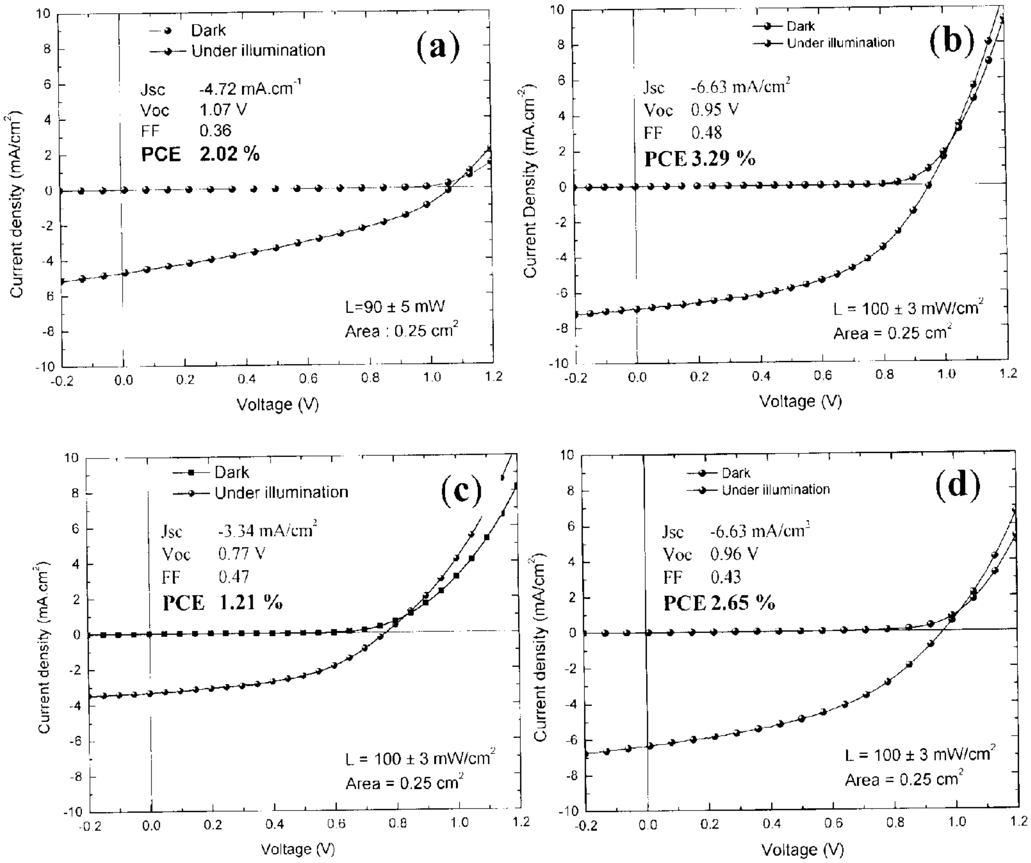
FIG. 6 is an illustration of the J-V characteristics of (A) ZP30:$PC_{60}$BM, (B) ZP46:$PC_{60}$BM, (C) ZP50:$PC_{60}$BM, and (D) ZP51:$PC_{60}$BM devices as measured at room temperature in accordance with an embodiment of the present specification.

By using the Scharber model [18], almost all of the polymers illustrated in Scheme 6 illustrated a theoretical Power Conversion Efficiency (PCE) of more than 7% (FIG. 5). ZP-25 and ZP-28 exhibited a PCE of near 10%. Preliminary screening using ZP30, ZP46, ZP50 and ZP51 as the active layer in BHJ photovoltaic cells was performed and the results summarized hereinbelow in Table 3. The Voc values were determined to be relatively high for all the polymers illustrated in Scheme 6. ZP46 was determined to exhibit a PCE of 3.3% for non-optimized devices. It is of interest to note that the thieno[3,4-c]pyrrole-4,6-dione-based polymers of the present specification can be used in conjunction with additional electron acceptors, non-limiting examples of which include PCBM (C60 or C70) (FIG. 6).

TABLE 3

Open circuit Potential (Voc), Short Circuit Potential (Jsc), Fill Factor (FF) and Power Conversion Efficiency (PCE) for selected Polymers illustrated in Scheme 6.

| Polymers | Thickness (nm) | Jsc ($mA \cdot cm^{-2}$) | Voc (V) | FF | PCE (%) |
|---|---|---|---|---|---|
| ZP30 | 52 | −4.72 | 1.07 | 0.36 | 2.02 |
| ZP46 | 56 | −6.63 | 0.95 | 0.48 | 3.29 |
| ZP50 | 25 | −3.34 | 0.77 | 0.47 | 1.21 |
| ZP51 | 68 | −6.23 | 0.96 | 0.43 | 2.65 |

Figure 7:
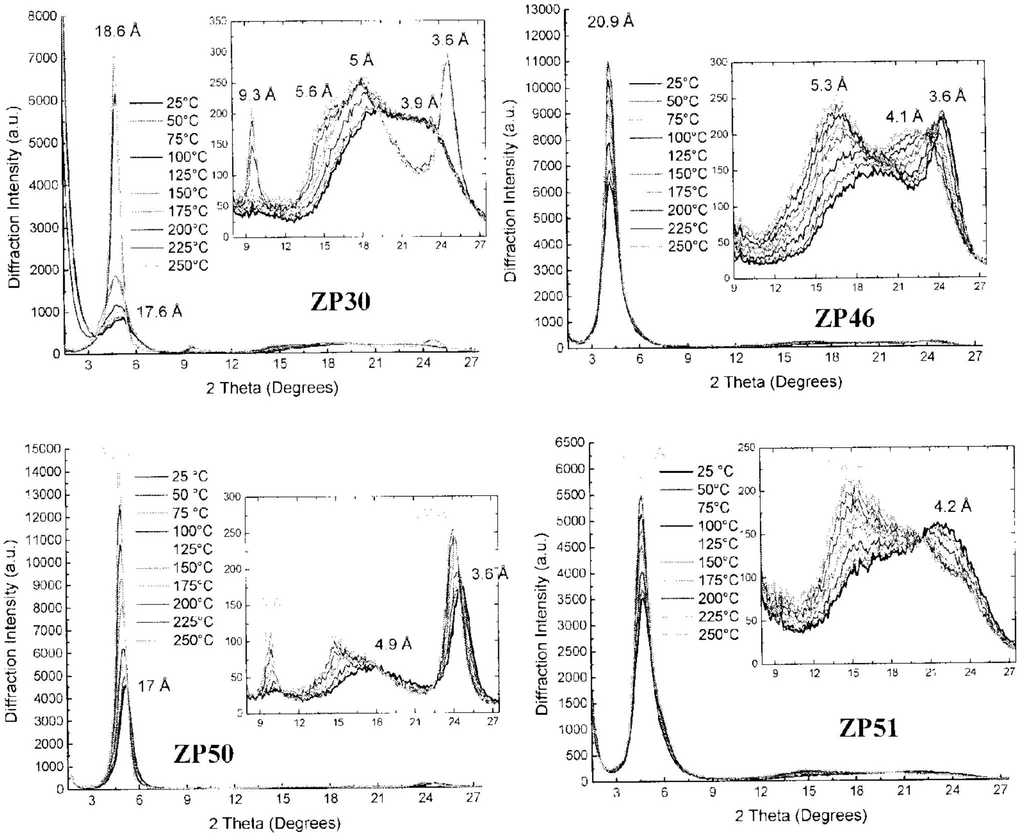
FIG. 7 is an illustration of the X-ray diffraction patterns for various powdery thieno[3,4-c]pyrrole-4,6-dione-based polymers as measured from room temperature to 250° C. in accordance with an embodiment of the present specification.

The preliminary results obtained for the photovoltaic devices comprising at least one of the polymers as illustrated in Scheme 6 can be explained by good structural organization at room temperature. The X-ray diffraction patterns for polymers ZP30, ZP46, ZP50 and ZP51 are illustrated in FIG. 7. The polymers show several diffraction peaks at room temperature which is indicative of some degree of organization. The peak intensity increased and sharpened upon heating. The diffraction planes localized around 9 and 3.6 Å are attributed to interlayer and π-stacking spacing respectively, which implies a higher degree of organization [19]. Preliminary measurements on ZP30 revealed a hole mobility of about 0.01 $cm^2/V.s$.

Fabrication of Photovoltaic Devices

Figure 11:
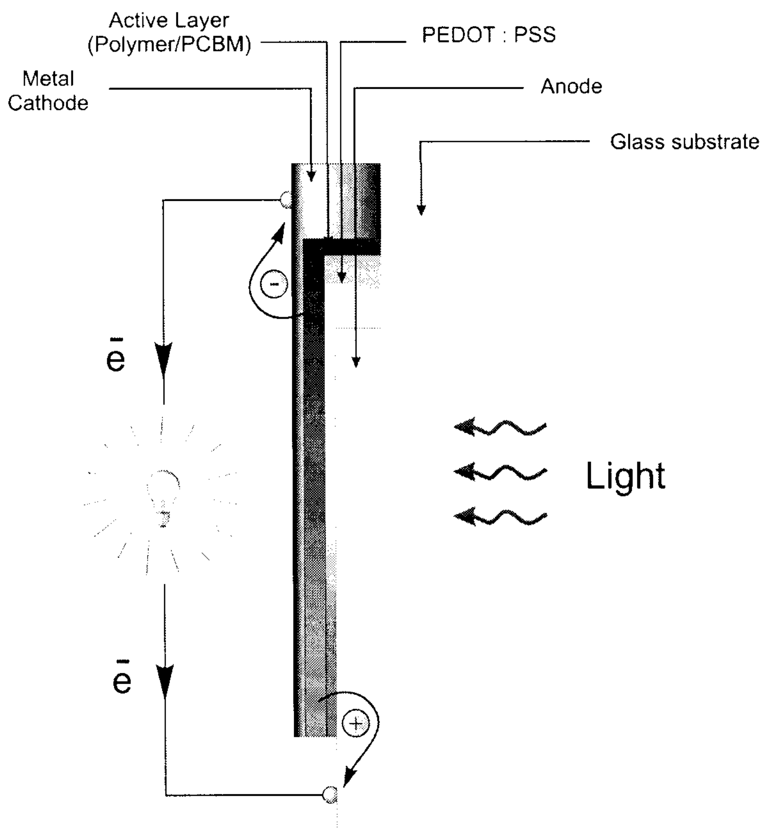
FIG. 11 is a schematic illustration of a bulk-heterojunction photovoltaic device in accordance with an embodiment of the present specification.

In accordance with an embodiment of the present specification, the bulk heterojunction photovoltaic solar cell (PSCs) were fabricated using the following structure: Glass/ITO/PEDOT:PSS/Polymer:PCBM/Al (FIG. 11). A commercial Indium Tin Oxide (ITO)-coated glass substrate (24×24 $mm^2$) with a sheet resistance of ≤10 Ohms/sq (Prazisions Glass Optic GmbH, Germany), was cleaned by ultrasonication using soap, water, acetone and 2-propanol respectively. Following a 5 minute plasma-$O_2$ treatment, the ITO substrate was patterned using photolithography. Poly(3,4-ethylenedioxythiophene): poly(stryrenesulphonate) (PEDOT-PSS, Baytron P, H. C. Starck) was spin-coated (2000 rpm, 60 s) onto the ITO surface and dried at 120° C. over a period of 1 h. Following cooling, an orthodichlorobenzene (ODCB) solution of polymer/[6,6]-phenyl-butyric acid methyl ester (PCBM) (Nano-C, USA) was spin-coated onto the substrate. The substrate was subsequently placed into a thermal evaporation chamber. A 70 nm thick aluminum electrode (0.3-0.4 nm/s) was then deposited under high vacuum ($2\times10^{-5}$ torr; the active area is 25 $mm^2$). The current-voltage characteristics of the photovoltaic cells were measured using a Kheithey 2400 (I-V) Digital SourceMeter under a collimated beam. The measurements were conducted under the irradiation of AM 1.5 G simulated solar light (100 mW $cm^{-2}$; filter #81094) using a 150 W Oriel Instruments Solar Simulator and a Xenon lamp. The light intensity was adjusted using a Gentec-eo power detector (PS-330).

Since the thickness of the active layer may be a critical issue for a reliable roll-to-toll processing of bulk heterojunction (BHJ) solar cells, both thin and thick active layers were investigated using a 25 $mm^2$ active area.

Figure 12:
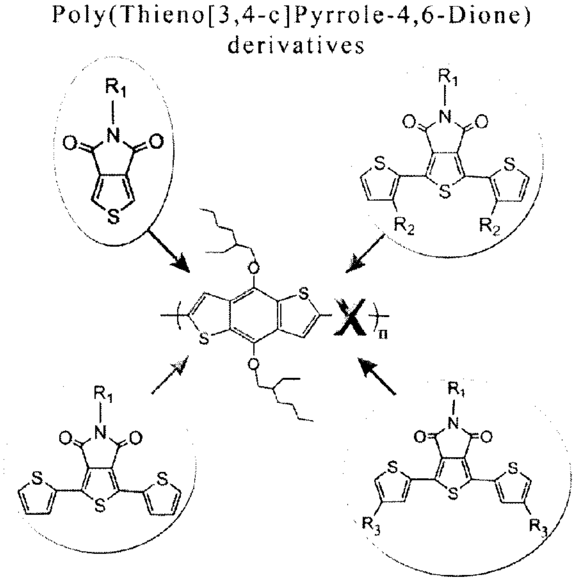
FIG. 12 is an illustration of (A) exemplary molecular structures composing the photoactive materials in accordance with an embodiment of the present specification [e.g. poly(thieno [3,4-c]pyrrole-4,6-dione) derivatives and [60]PCBM; wherein X represents the thieno[3,4-c]pyrrole-4,6-dione-based unit]; and (B) a device structure (right) and a SEM cross-sectional image (left) of a polymer solar cell in accordance with an embodiment of the present specification.
Figure 12:
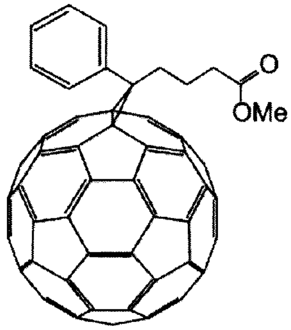
Figure 12:
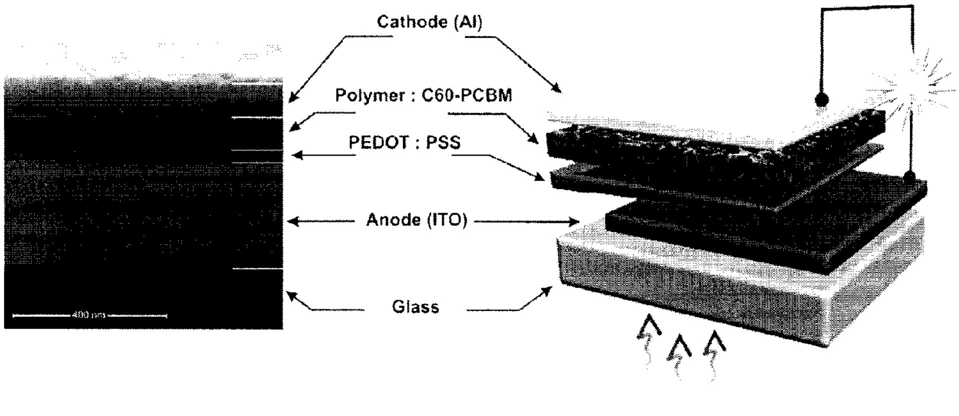

In accordance with an embodiment of the present specification, bulk heterojunction photovoltaic solar cells were fabricated using the following structure: Glass/ITO/PEDOT:PSS/Polymer:[60]PCBM/Al as illustrated in FIG. 12. Commercial Indium Tin Oxide (ITO-coated glass substrate (25×25 $mm^2$) with a sheet resistance of ≤10 Ohms/sq (Prazisions Glas Optic GmbH, Germany) were cleaned using following sequence in an ultrasonic bath: detergent, water, acetone and 2-propanol. After treatments in Plasma-$O_2$ for 5 minutes, each ITO substrate was patterned using photolithography techniques. Then poly(3,4-ethylenedioxythiophene): poly(styrenesulphonate) (PEDOT-PSS, Baytron P, H. C. Starck) was spin-coated (2000 rpm, 60 s) on ITO surface and dried at 120° C. for 1 h. After cooling the substrate, a ortho-dichlorobenzene (o-DCB) solution of polymer and [6,6]-phenyl-$C_{61}$ butyric acid methyl ester ([60]PCBM) (Nano-C, USA) mixture (1:2, wt/wt) was spin-coated. The substrates were then put in a thermal evaporation chamber, in order to evaporated 70 nm of aluminum layer (0.2-0.3 nm per second) under high vacuum ($2\times10^{-5}$ torr) through a shadow mask (active area 25 $mm^2$). The current-voltage characteristics of the photovoltaic cells were measured using a Kheithey 2400 (I-V) Digital SourceMeter under a collimated beam. The measurements were conducted under the irradiation of AM 1.5 G filter (No 81094) simulated solar light (100 mW $cm^{-2}$) by using a 150 W Oriel Instruments Solar Simulator and Xenon lamp. Light intensity was adjusted using a Gentec-eo power detector (PS-330).

In accordance with an embodiment of the present specification, various additional N-alkylated TBD derivatives were prepared using the synthetic route shown herein below in Scheme 7.

Scheme 7:

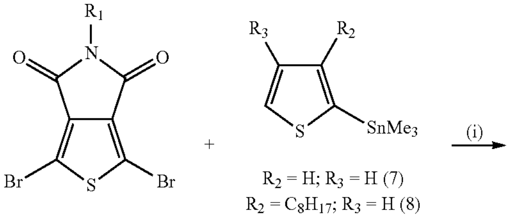

$R_1 = C_8H_{17}$ (4)
$R_1$ = EthylHexyl (5)
$R_1 = C_{12}H_{25}$ (6)

$R_2$ = H; $R_3$ = H (7)
$R_2 = C_8H_{17}$; $R_3$ = H (8)
$R_2 = C_2H_5$; $R_3$ = H (9)
$R_2$ = H; $R_3 = C_8H_{17}$ (10)

-continued

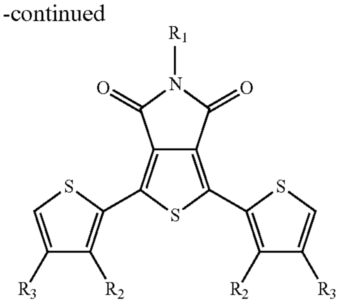

$R_1 = C_8H_{17}$; $R_2$ = H; $R_3$ = H (11)
$R_1$ = EthylHexyl; $R_2$ = H; $R_3$ = H (12)
$R_1 = C_{12}H_{25}$; $R_2$ = H; $R_3$ = H (13)
$R_1 = C_8H_{17}$; $R_2 = C_8H_{17}$; $R_3$ = H (14)
$R_1 = C_8H_{17}$; $R_2 = C_2H_5$; $R_3$ = H (15)
$R_1 = C_8H_{17}$; $R_2$ = H; $R_3 = C_8H_{17}$ (16)
$R_1 = C_{12}H_{25}$; $R_2 = C_8H_{17}$; $R_3$ = H (17)
$R_1 = C_{12}H_{25}$; $R_2$ = H; $R_3 = C_8H_{17}$ (18)

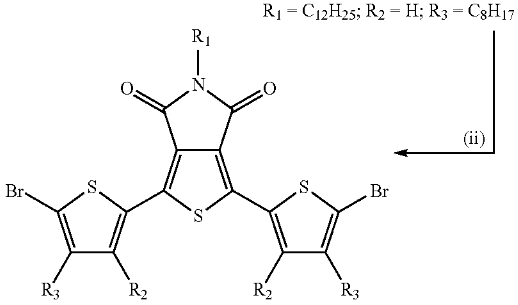

$R_1 = C_8H_{17}$; $R_2$ = H; $R_3$ = H (19)
$R_1$ = EthylHexyl; $R_2$ = H; $R_3$ = H (20)
$R_1 = C_{12}H_{25}$; $R_2$ = H; $R_3$ = H (21)
$R_1 = C_8H_{17}$; $R_2 = C_8H_{17}$; $R_3$ = H (22)
$R_1 = C_8H_{17}$; $R_2 = C_2H_5$; $R_3$ = H (23)
$R_1 = C_8H_{17}$; $R_2$ = H; $R_3 = C_8H_{17}$ (24)
$R_1 = C_{12}H_{25}$; $R_2 = C_8H_{17}$; $R_3$ = H (25)
$R_1 = C_{12}H_{25}$; $R_2$ = H; $R_3 = C_8H_{17}$ (26)

-continued

Reagents and conditions:
(i) $Pd(PPh_3)_2Cl_2$, THF, reflux, 24 h;
(ii) NBS, $CHCl_3$, AcOH, 50° C., 24 h.

Previous work on BDT-TPD polymers and BDT-based polymers revealed that benzo[1,2-b:3,4-b]dithiophene (BDT) bearing an ethylhexyl side chain leads to soluble polymers having high molecular weights, enhanced morphology for films obtained from polymer/[60]PCBM blends, and high power conversion efficiency in bulk heterojunction (BHJ) solar cells [20-23]. Since the presence of alkyl side chains on the TPD unit can also influence the solubility, molecular weight, organization, and charge mobility of BDT-TPD based polymers, polymers P1, P2 and P3 were prepared (Scheme 8) and the morphology of the polymer/[60]PCBM blends investigated. The preparation of additional BDT-TPD based polymers comprising a thiophene spacer (P4, P5 and P6); comprising a thiophene spacer having alkyl chains facing the TPD unit (P7, P8 and P10); and comprising a thiophene spacer having alkyl chains facing the BDT unit (P9 and P11) is shown herein below in Scheme 8. Stille coupling of monomers 4-6 and the BDT comonomer yielded soluble polymers of moderate molecular weights. The solubility of the polymers comprising unsubstituted thiophene spacers was dramatically reduced when compared to P1-P3. Polymers P4 and P6 were insoluble in common organic solvents. However, modifying the N-alkyl group of the TBD unit from a straight alkyl chain to a branched alkyl chain (i.e. ethylhexyl) results in a soluble and processable polymer (P5) of moderate molecular weight. Polymerization of the monomeric unit obtained by Stille coupling of monomers 22-26 and the BDT comonomer afforded soluble materials with high molecular weights.

Scheme 8: Various illustrative polymers comprising an alkylated BDT—TPD unit.

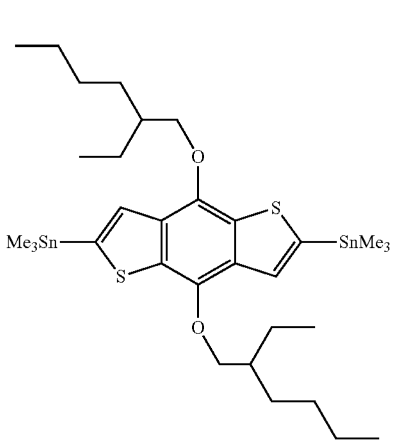

+

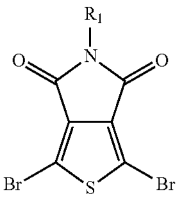

$R_1 = C_8H_{17}$ (4)
$R_1$ = EthylHexyl (5)
$R_1 = C_{12}H_{25}$ (6)

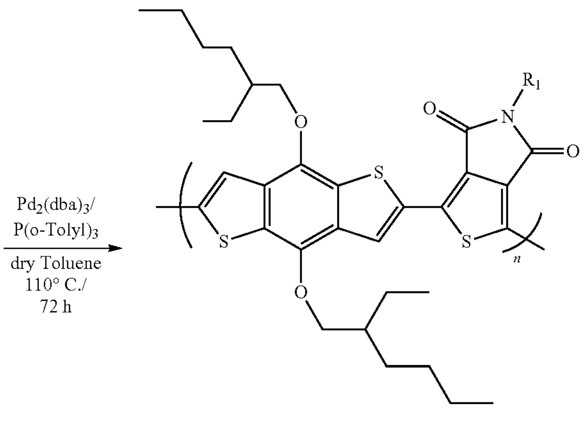

$R_1 = C_8H_{17}$ (P1)
$R_1$ = EthylHexyl (P2)
$R_1 = C_{12}H_{25}$ (P3)

-continued

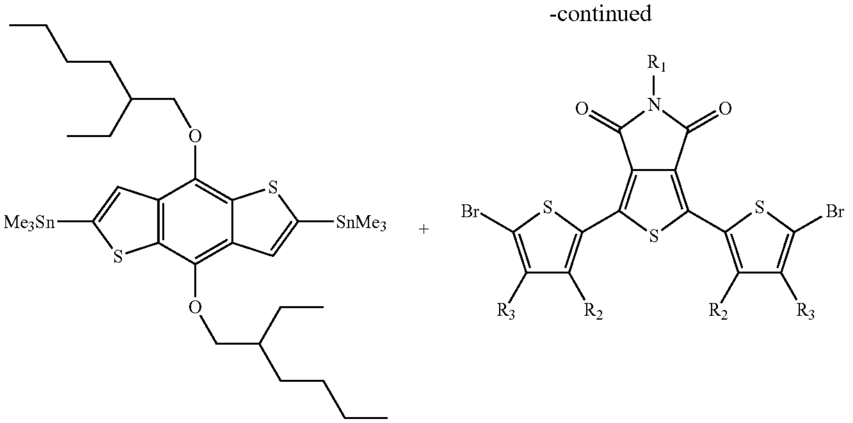

$R_1 = C_8H_{17}$; $R_2$ = H; $R_3$ = H (19)
$R_1$ = EthylHexyl; $R_2$ = H; $R_3$ = H (20)
$R_1 = C_{12}H_{25}$; $R_2$ = H; $R_3$ = H (21)
$R_1 = C_8H_{17}$; $R_2 = C_8H_{17}$; $R_3$ = H (22)
$R_1 = C_8H_{17}$; $R_2 = C_2H_5$; $R_3$ = H (23)
$R_1 = C_8H_{17}$; $R_2$ = H; $R_3 = C_8H_{17}$ (24)
$R_1 = C_{12}H_{25}$; $R_2 = C_8H_{17}$; $R_3$ = H (25)
$R_1 = C_{12}H_{25}$; $R_2$ = H; $R_3 = C_8H_{17}$ (26)

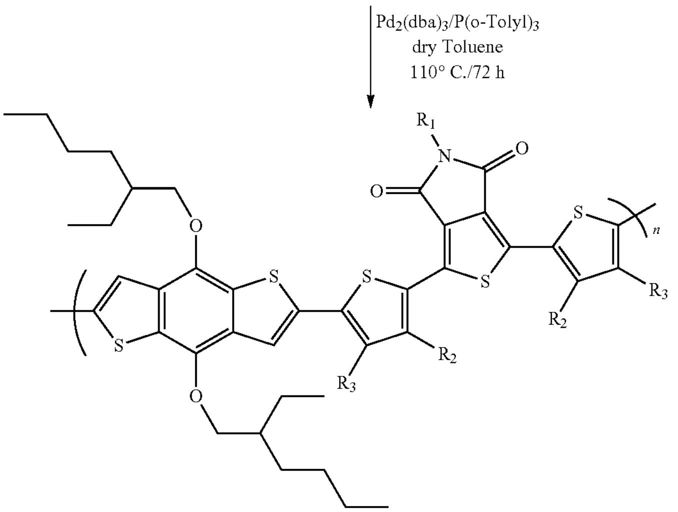

$R_1 = C_8H_{17}$; $R_2$ = H; $R_3$ = H (P4)
$R_1$ = EthylHexyl; $R_2$ = H; $R_3$ = H (P5)
$R_1 = C_{12}H_{25}$; $R_2$ = H; $R_3$ = H (P6)
$R_1 = C_8H_{17}$; $R_2 = C_8H_{17}$; $R_3$ = H (P7)
$R_1 = C_8H_{17}$; $R_2 = C_2H_5$; $R_3$ = H (P8)
$R_1 = C_8H_{17}$; $R_2$ = H; $R_3 = C_8H_{17}$ (P9)
$R_1 = C_{12}H_{25}$; $R_2 = C_8H_{17}$; $R_3$ = H (P10)
$R_1 = C_{12}H_{25}$; $R_2$ = H; $R_3 = C_8H_{17}$ (P11)

Polymers (P1-P11) were characterized by size exclusion chromatography (SEC) using monodisperse polystyrene in hot 1,2,4-trichlorobenzene (TCB) as the standard. The data are summarized hereinbelow in Table 4. The number-average molecular weight ($M_n$) ranges from 8.3 kDa (P5) to 131 kDa (P7) with a polydispersity index (PDI) ranging between 1.5 (P5) and 3.2 (P8). Thermogravimetric analyses (TGA) showed that all polymers are thermally stable with degradation temperature ($T_d$) ranging from 330 to 380° C. With the exception of P1 ($T_g$=138° C.), differential scanning calorimetry (DSC) did not reveal any noticeable glass transition temperatures (P2-P11).

TABLE 4

Molecular Weights, Optical and Electrochemical Properties of Polymers P1-P11.

| Polymer | Mn (kDa) | PDI | $T_d$ (° C.) | Solution $\lambda_{max}$ (nm) | Film $\lambda_{max}$ (nm) | $E_{HOMO}$ (eV) | $E_{LUMO}$ (eV) | $E_g^{cv}$ (eV) | $E_g^{opt}$ (eV) |
|---|---|---|---|---|---|---|---|---|---|
| P1 | 12.0 | 2.37 | 380 | 308, 360, 448, 614 | 308, 360, 448, 614 | −5.56 | −3.75 | 1.81 | 1.80 |
| P2 | 20.6 | 2.56 | 340 | 447, 556, 609 | 444, 555, 609 | −5.66 | −3.87 | 1.79 | 1.84 |
| P3 | 16.1 | 2.23 | 330 | 555, 610 | 556, 615 | −5.60 | −3.82 | 1.78 | 1.84 |
| P4[a] | — | — | — | — | — | — | — | — | — |
| P5 | 8.3 | 1.50 | 330 | 512 | 516 | −5.49 | −3.70 | 1.65 | 1.84 |
| P6[a] | — | — | — | — | — | — | — | — | — |
| P7 | 131.0 | 2.82 | 340 | 524 | 539 | −5.56 | −3.70 | 1.86 | 1.88 |
| P8 | 11.6 | 3.19 | 340 | 513 | 553 | −5.54 | −3.78 | 1.76 | 1.84 |
| P9 | 19.9 | 2.11 | 330 | 517 | 539 | −5.66 | −3.83 | 1.83 | 1.86 |
| P10 | 41.6 | 2.27 | 340 | 512 | 540 | −5.56 | −3.70 | 1.86 | 1.88 |
| P11 | 22.9 | 2.30 | 330 | 519 | 538 | −5.73 | −3.78 | 1.95 | 1.89 |

[a](P4 and P6 are not soluble)

Figure 13A:
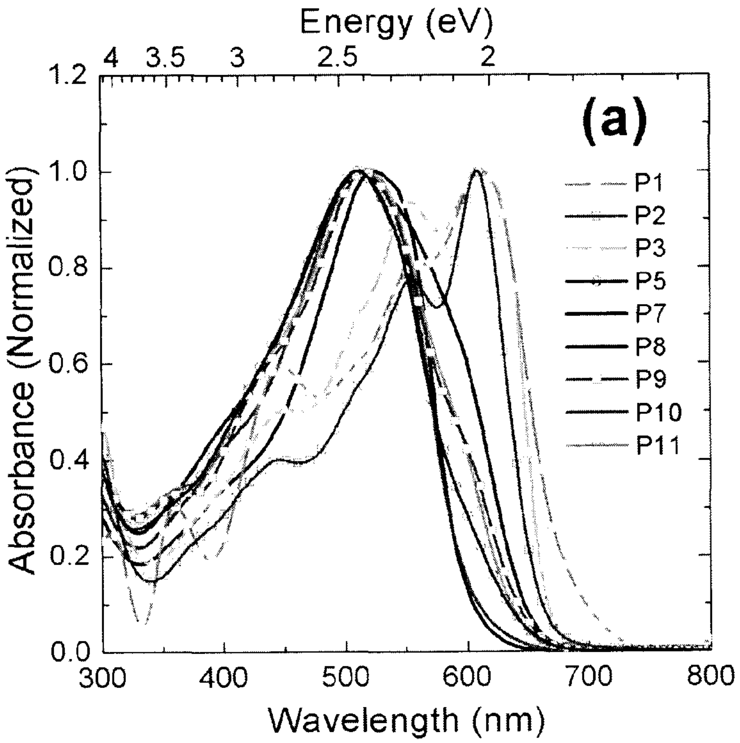
FIG. 13 is an illustration of (a) normalized absorption spectra for various solution-based thieno[3,4-c]pyrrole-4,6-dione derivatives (dilute o-DCB solutions for P1-P5; and P8; dilute chloroform solutions for P7, P8, P10 and P11); (b) for various TPD derivative-based films; and (c) for various films comprising TPD-based polymer/[60]PCBM blends.
Figure 13B:
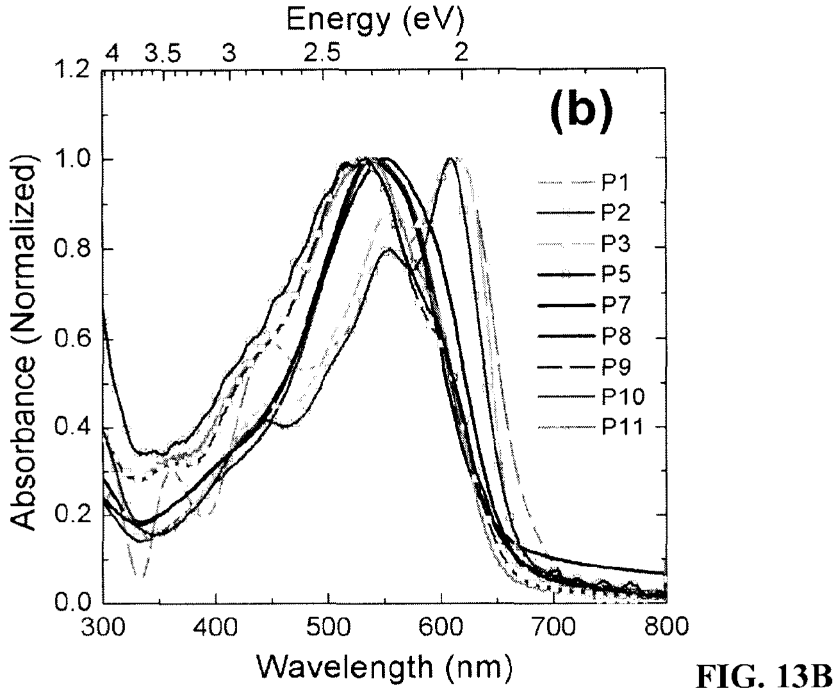
Figure 13C:
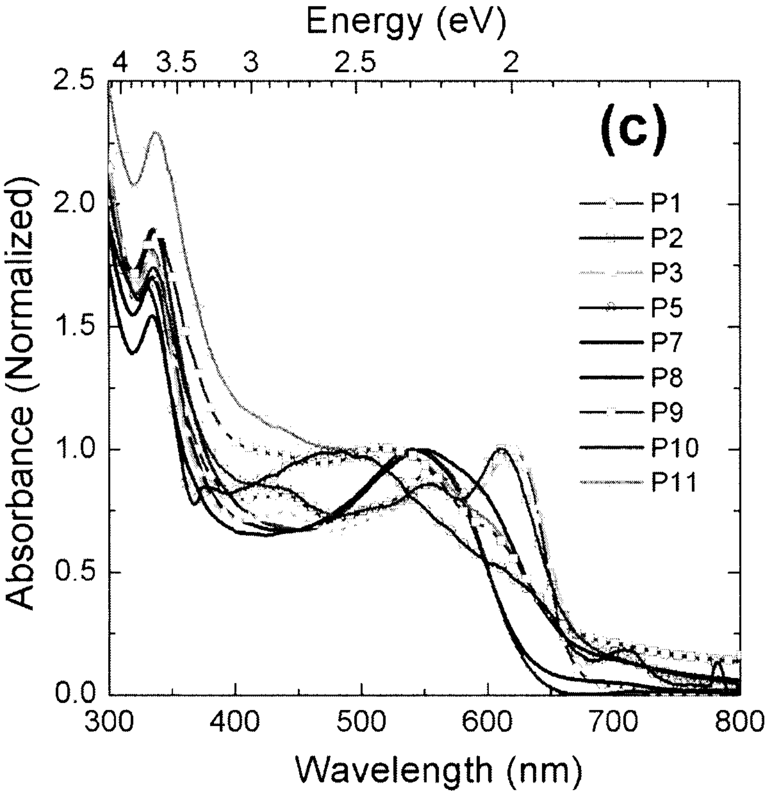

All polymeric materials (P1-P11) exhibit a broad absorption spectra indicative of a large part of the solar spectral flux being absorbed (FIG. 13). These absorption characteristics should contribute to obtaining high short circuit current (JO values in BHJ solar cells. The absorption spectra of P1, P2, P3, and P5 remain almost the same in going from solution to film (FIG. 13*b*). DFT (density functional theory) calculations performed on P1-P3 revealed coplanar structures (data not shown). Moreover, neither the length nor the type of the tail chain on the thieno[3,4-c]pyrrole-4,6-dione (TPD) unit seems to affect the optical properties of these polymers (P1-P11). Absorption spectra obtained for a film comprising P5 showed that the thiophene spacers (without alkyl chains) did not modulate the optical properties; the optical band gap remaining the same as for P1-P3. Polymers P7-P11 displayed significant red shifts (up to 40 nm for P8) in going from solution to film. This behaviour observed in dense thin films of conjugated polymers is due to an increase in the conjugation length due to an ordering in the solid state. However, the absorption spectra of these polymers were blue shifted when compared to P1-P3; again the optical band gap remains almost the same. It can be readily observed that only a small range in the optical band gap (onset of the absorption spectra) was obtained for polymers P1-P11, meaning that the influence of the thiophene spacer on the optical properties is somehow limited.

Figure 14:
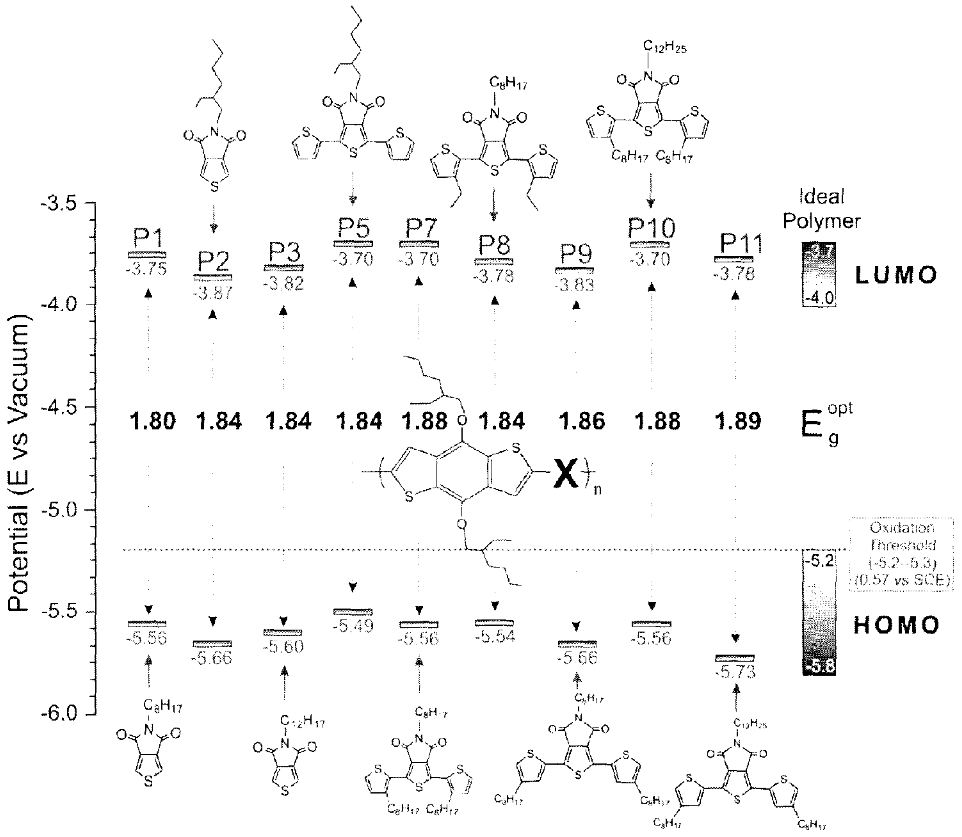
FIG. 14 is an illustration of the experimental energy levels for various benzodithiophene/thieno[3,4-c]pyrrole-4,6-dione-based polymers (P1 to P11) in accordance with an embodiment of the present specification [Insert: X represents the thieno[3,4-c]pyrrole-4,6-dione-based unit].

Cyclic voltammetry measurements were performed in order to estimate the HOMO/LUMO energy levels and the bandgap of polymers P1-P11 (FIG. 14; Table 4). The HOMO energy levels were estimated by using the onset of the oxidation potential (all polymers showed non-reversible oxidation processes). On the other hand, all polymers showed reversible reduction processes. The LUMO energy levels were estimated in a manner similar to that used to estimate the HOMO energy levels. As observed regarding the optical properties, modifying the N-alkyl group of the TBD unit did not have a significant impact on the electronic properties. The relatively deep HOMO energy levels should contribute to achieve high $V_{oc}$ values in BHJ photovoltaic cells while the LUMO energy levels are within the desirable range for proper electron transfer from the donor to the electron acceptor ([60]PCBM).

Figure 15:
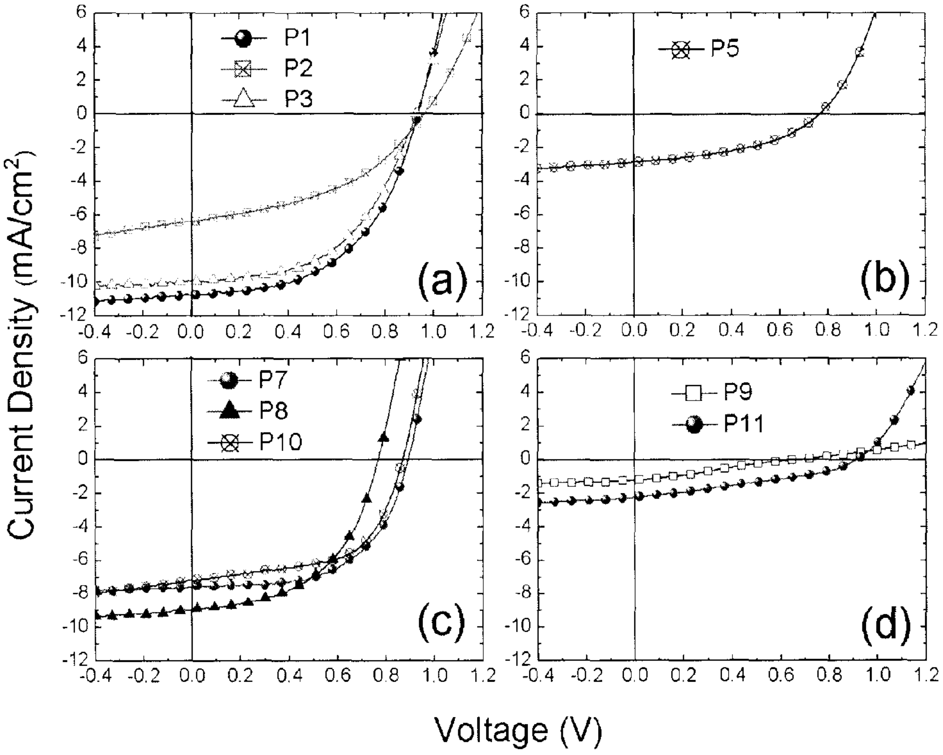
FIG. 15 is an illustration of the J-V characteristics for various polymer-based solar cells (Air Mass 1.5, 100 $mW.cm^{-2}$) in accordance with an embodiment of the present specification: (a) polymers without a thiophene spacer (P1, P2 and P3), (b) polymer with a thiophene spacer (P5), (c) polymers with a thiophene spacer having alkyl chains facing the TPD unit (P7, P8 and P10), (d) polymers with a thiophene spacer having alkyl chains facing the BDT unit (P9 and P11).

In accordance with an embodiment of the present specification, the photovoltaic properties of polymers P1-P11 were investigated in BHJ solar cells comprising the following configuration: Glass/ITO/PEDOT:PSS/active layer/Al (FIG. 12). The active layer comprised a blend of at least one of P1-P11 with [60]PCBM, spin-coated from chloroform or ortho-dichlorobenzene (o-DCB) solutions. For P1 and P10, both thin and relatively thick active layers were prepared. The ratio of donor/acceptor was optimized and found to be 1:2 (wt/wt) for all polymers, excepted for P2 (1:1). Solar cells were tested under AM 1.5 G (AM=air mass) illumination of 100 mW $cm^{-2}$ and the active area of the devices were 25 $mm^2$ (Table 5). J-V curves are shown in FIG. 15 and data on the BHJ solar cells are summarized hereinbelow in Table 5.

TABLE 5

Open circuit Potential (Voc), Short Circuit Potential (Jsc), Fill Factor (FF) and other characteristics for BHJ solar cells comprising an active layer composed of a blend of at least one of P1-P11 with [60]PCBM.

| Polymer | Solvent | D:A Ratio (wt/wt) | $J_{sc}$ ($mA \cdot cm^{-2}$) | $V_{oc}$ (V) | FF | PCE (%) | Rs ($\Omega$ $cm^2$) | Rsh ($\Omega$ $cm^2$) | Active layer Thickness (nm) |
|---|---|---|---|---|---|---|---|---|---|
| P1 | oDCB | 1:2 | −10.8 | 0.94 | 0.51 | 5.2 | 18 | 994 | 98 |
| | oDCB | 1:2 | −10.2 | 0.92 | 0.41 | 3.8 | 30 | 407 | 170 |
| P2 | oDCB | 1:1 | −6.2 | 0.96 | 0.43 | 2.6 | 52 | 480 | 67 |
| P3 | oDCB | 1:2 | −10.0 | 0.93 | 0.51 | 4.8 | 23 | 1163 | 95 |
| P4[a] | — | — | — | — | — | — | — | — | — |
| P5 | oDCB | 1:2 | −2.9 | 0.76 | 0.43 | 0.95 | 61 | 884 | 88 |
| P6[a] | — | — | — | — | — | — | — | — | — |
| P7 | $CHCl_3$ | 1:2 | −7.6 | 0.89 | 0.57 | 3.9 | 19 | 1904 | 102 |
| P8 | oDCB | 1:2 | −9.0 | 0.76 | 0.51 | 3.5 | 20 | 700 | 70 |
| P9 | $CHCl_3$ | 1:2 | −1.2 | 0.66 | 0.26 | 0.2 | 690 | 1222 | 115 |
| P10 | $CHCl_3$ | 1:2 | −7.2 | 0.87 | 0.58 | 3.6 | 19 | 533 | 90 |
| | $CHCl_3$ | 1:2 | −6.5 | 0.88 | 0.53 | 3.1 | 32 | 958 | 165 |
| P11 | $CHCl_3$ | 1:2 | −2.3 | 0.92 | 0.34 | 0.7 | 97 | 772 | 85 |

[a](P4 and P6 are not soluble)

Based upon the equivalent circuit of a photovoltaic cell, the current vs. voltage (I/V) characteristics can be described by the following equation:

$$I = I_0\left[\exp\left(e\frac{V - IR_s}{nkT}\right) - 1\right] + \frac{V - IR_s}{R_{sh}} - I_{ph} \quad (1)$$

Where $I_0$ is the dark current, e is the electron charge, n is the diode ideality factor, V is the applied voltage, $R_s$ is the series resistance, $R_{sh}$ is the shunt resistance, and $I_{ph}$ is the photocurrent. $R_s$ and $R_{sh}$ can be described by the following equations:

$$\left[\frac{dI}{dV}\right]_{I=0} = R_s^{-1} \quad (2)$$

$$\left[\frac{dI}{dV}\right]_{V=0} = R_{sh}^{-1} \quad (3)$$

Thus, to obtain high short-circuit currents, $I_{sc}$ (V=0), solar-cell devices must have small $R_s$ and large $R_{sh}$ values. From a physical point of view, the series resistance $R_s$ can be associated to materials conductivity, thus the charge carrier mobility in the Donor/Acceptor blends (electron mobility in the acceptor and hole mobility in the donor). $R_{sh}$ interprets the charge recombination close to dissociation charge sites (interface D/A and electrodes).

P1 and P3 show the best photovoltaic performances with high $V_{oc}$ values (0.94 V and 0.96 V respectively), and short circuit current density ($J_{sc}$) values (10.8 $mA.cm^{-2}$ and 10.0 $mA.cm^{-2}$ respectively). Moderate fill factor (FF) values approaching 51% for both polymers afforded power conversion efficiencies (PCE) of 5.2% (P1) and 4.8% (P3). Since high-speed roll-to-toll manufacturing processes can be used to print polymeric solar cells, the use of relatively thick films is important in order to get uniform and defect free active layers. While the $V_{oc}$ and $J_{sc}$ values remain substantially unchanged when varying the thickness of the film devices, the FF values drop by more than 20%. Despite this fact, the PCE reported herein for P1 is among the highest values reported in the literature for thick layer BHJ solar cells. According to data reported in Table 5, varying the length of the N-alkyl group of the TPD unit from octyl to docecyl led to a lower PCE (4.8%). This lower value is caused by a drop of the $J_{sc}$ value even though the shunt resistance ($R_{sh}$) was higher for P3 (1163 $\Omega cm^2$) than for P1 (994 $\Omega cm^2$).

The BDT-TPD derivatives comprising thiophene spacers having alkyl chains facing the TPD unit also revealed promising photovoltaic results (P7, P8, and P10). Among these polymers, P7 gave the best photovoltaic results with a power conversion efficiency of 3.9% (thickness of 102 nm). P10 (with $C_{12}H_{25}$ on the TPD unit) reached a PCE of 3.6% with a $V_{oc}$ of 0.87 V and a FF of 58%. Data reported in Table 5 are indicative of devices comprising P7 being superior to ones comprising P8 and P10 due to a higher shunt resistance value ($R_{sh}$=1904 $\Omega cm^2$). For P10, a lower shunt resistance causes power losses in solar cells by providing an alternate current path for the light-generated current. However, when used in a thick film configuration (165 nm), P10 shows a high $V_{oc}$ (0.88V) and a PCE of 3.1%. As for P1 and P3, the length of the N-alkyl chain causes a small drop in the short circuit current $J_{sc}$, which is probably due to the morphology of the blend with the [60]PCBM.

P8 was prepared to get soluble polymers having a short alkyl chain on the thiophene spacer (P4 and P6 being insoluble in most common organic solvents). Despite a high $J_{sc}$ of 9.0 mA/cm$^2$, a drop of the $V_{oc}$ of 0.13V (compared to P7) led to a PCE of 3.5%.

Figure 16:
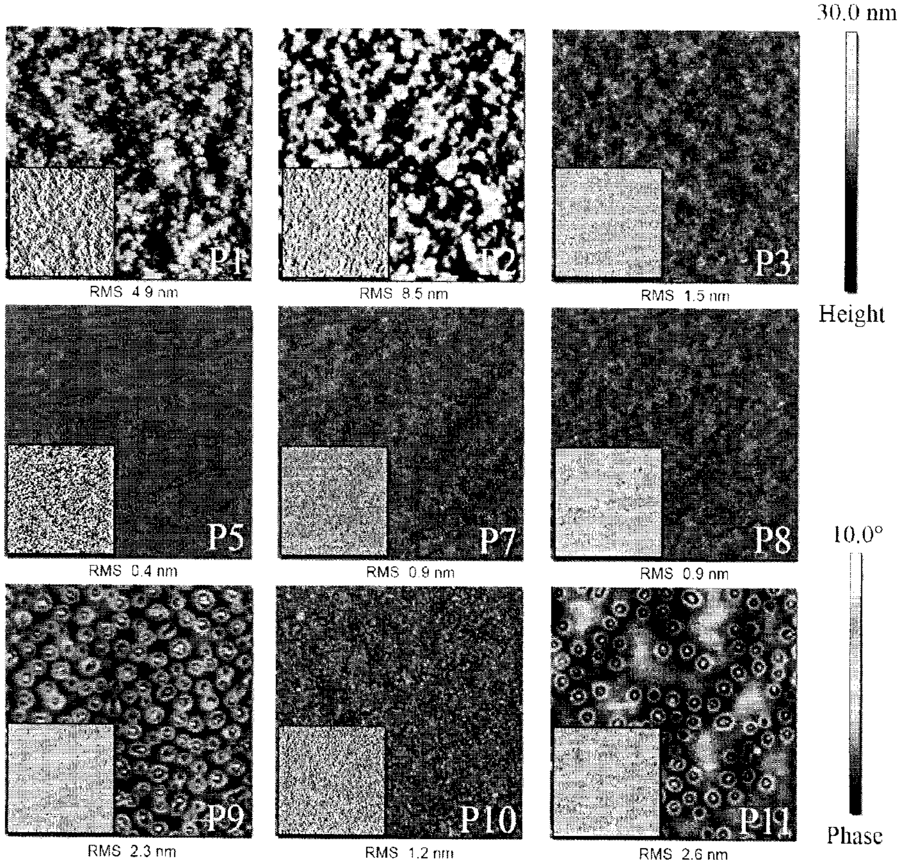
FIG. 16 is an illustration of the AFM tapping mode height and simultaneously acquired phase inset images for poly (thieno[3,4-c]pyrrole-4,6-dione) derivatives (P1-P3, P5 and P7-P11) in accordance with an embodiment of the present specification; (the scan size for height and phase images is 10 μm×10 μm).

BDT-TPD derivatives comprising thiophene spacers bearing alkyl chains facing the BDT unit revealed deficient photovoltaic results (P9 and P11). PCEs of 0.2% and 0.7% for P9 and P11 respectively were observed. Moreover, for both polymers, the $J_{sc}$ and FF values were low. This can be explained by the nanoscale morphology observed using atomic force microscopy (AFM). While the nanoscale morphology of blends of P1-P5; P7, P8 and P10 with [60]PCBM are quite similar with only small variations in the roughness on the surface, P9 and P11 revealed a somehow unique morphology. As shown in FIG. 16, "donut" shapes with a diameter of 500 nm were observed. The percolation pathways are poorly formed limiting the transport of the charges to the respective electrodes in turn leading to poor short circuit current $J_5$ values.

Figure 17:
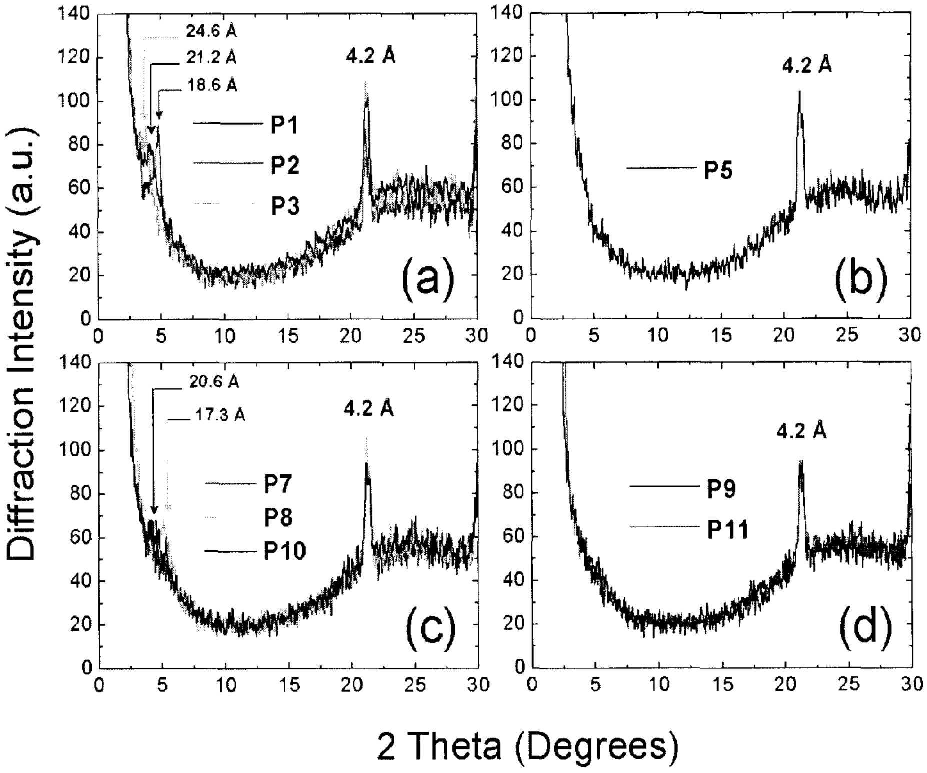
FIG. 17 is an illustration of the X-ray diffraction patterns for various films comprising TPD-based polymer (P1-P3, P5 and P7-P11)/[60]PCBM blends at room temperature in accordance with an embodiment of the present specification.

To confirm these assumptions, the effect of the N-alkyl chain on the TPD unit (P1-P3) and the effect of the thiophene spacer (with or without alkyl chains) (P5-P11) on the molecular organization in polymer thin films was investigated using grazing-incidence X-ray scattering (GIXS). P1-P11/[60]PCBM GIXS analyses were conducted on Glass/ITO/PEDOT-PSS solid supports. As shown in FIG. 17, a peak at 4.2 Å was observed for all polymer/[60]PCBM blends. This peak corresponds to the distance between the coplanar π-conjugated backbones. The fact that the 7'-stacking peak could be observed for the entire BDT-TPD series, is indicative of these polymers being able to retain the same face-on orientation when blended with the electron acceptor ([60]PCBM). For P1-P3, an additional peak corresponding to lamellar spacing could be observed. Since this distance is related to the length of the N-alkyl chain, it is longer for the dodecyl derivative P3 (24.6 Å) than for the octyl P1 (21.2 Å) and ethylhexyl derivatives P2 (18.6 Å). These peaks were also present for P8 ($d_1$=17.3 Å) and P10 ($d_1$=20.6 Å). One can surmise that the shorter distance observed for P8 (ethyl on the thiophene spacer) leads to better order in the blend which results in higher $J_{sc}$ (9.0 mA/cm$^2$) values in BHJ solar cells when compared to P10 ($J_{sc}$=7.2 mA/cm$^2$). On the other hand, while P7 afforded good power conversion efficiency (3.9%), the GIXS diffractogram did not show any lamellar distance related peaks as for the less efficient BDT-TPD derivatives (P5, P9 and P11).

Preliminary results on the photovoltaic devices revealed that the length of the N-alkyl chain of the TPD unit has an impact on the morphology of the polymers/[60]PCBM blends. Power conversion efficiencies of 5.2% have been obtained for a thin layer of P1. Moreover, thick active layer BHJ solar cells have been studied and PCE values of up to 3.8% were reached with P1. This result is among the highest PCE values reported so far for relatively thick films.

EXPERIMENTAL

A number of examples are provided herein below illustrating the efficiency of the photoactive polymers of the present specification.

Materials

Thiophene-3,4-dicarboxylic acid was purchased from Frontier Scientific. 2-(tributylstannyl)thiophene was purchased from Aldrich. Tetrabutylammonium tetrafluoborate ($NBu_4BF_4$) (98%, Aldrich) was recrystallized three times in a 50:50 mixture of methanol/water and dried at 100° C. N-Bromosuccinimide (NBS) was recrystallized from water prior to use. All reactions were carried out under argon unless otherwise stated. The reaction solvents were dried prior to use (THF from sodium/benzophenone, toluene and acetonitrile from $CaH_2$) unless otherwise stated. Column chromatography was carried out on silica gel (300-400 mesh). The synthesis of 5-octylthieno[3,4-c]pyrrole-4,6-dione, 1,3-dibromo-5-octyl-thieno[3,4-c]pyrrole-4,6-dione (4), 2-trimethyltin thiophene (7), 2-(trimethyltin)-3-octylthiophene (8), 2-(trimethyltin)-4-octylthiophene (10) and 2,6-bis(trimethyltin)-4,8-di(2-ethylhexyloxyl)benzo[1,2-b:3,4-b]dithiophene involved known literature procedures. All the monomers were carefully purified prior to use in the polymerization reaction. All other compounds were synthesized following the procedures described herein.

Characterization $^1$H NMR or $^{13}$C NMR spectra were recorded using a Varian AS400 (400 MHz) or Brucker AC300 (300 MHz) in a deuterated chloroform, dimethyl sulfoxide, tetrahydrofuran or acetone solution at 298 K. Chemical shifts were reported as δ values (ppm) relative to an internal tetramethylsilane (TMS) standard. Number-average ($M_n$) and weight-average ($M_w$) molecular weights were determined by size exclusion chromatography(SEC) using a high pressure liquid chromatography (HPLC) pump (Waters 515 pump), two Shodex KF-804 columns (Particle size 7 μm, 8.0 mm ID×300 mm), and chloroform ($CHCl_3$)(HPLC grade, Aldrich) as eluant and using a Waters 441 UV-vis detector. Alternatively, number-average ($M_n$) and weight-average ($M_w$) molecular weights were determined by size exclusion chromatography (SEC) using a high temperature Varian Polymer Laboratories GPC220 equipped with an RI detector and a PL BV400 HT Bridge Viscometer. The column set consists of 2 PLgel Mixed C (300×7.5 mm) columns and a PLgel Mixed C guard column. The flow rate was fixed at 1.0 mL/min using 1,2,4-trichlorobenzene (TCB)

(with 0.0125% BHT w/v) as eluant. The temperature of the system was set to 140° C. The sample was prepared at concentration of nominally 1.0 mg/mL in hot TCB. Dissolution was performed using a Varian Polymer Laboratories PL-SP 260VC sample preparation system. The sample vial was held at 160° C. with shaking for 1 h for complete dissolution. The solution was filtered through a 2 μm porous stainless steel filter used with the SP260 pipettor into a 2 mL chromatography vial. The calibration method used to generate the reported data was the classical polystyrene method using polystyrene narrow standards Easi-Vials PS-M from Varian Polymer Laboratories which were dissolved in TCB. Thermogravimetric analysis (TGA) measurements were carried out using a Mettler Toledo TGA SDTA 851e apparatus at a heating rate of 20° C./min under nitrogen. The temperature of degradation ($T_d$) corresponds to a 5% weight loss. Differential scanning calorimetric (DSC) analysis was performed on a Perkin-Elmer DSC-7 instrument, calibrated with ultra pure indium. Glass transition temperatures ($T_g$) were measured at a scanning rate of 20° C./min, under a nitrogen flow. UV-vis-NIR absorption spectra were taken using a Varian Cary 500 UV-Vis-NIR spectrophotometer using 1 cm path length quartz cells. Spin-coated films on glass plates were used for solid-state UV-vis-NIR measurements (a polymer solution in chloroform was spin coated on quartz plates). Optical bandgaps were determined from the onset of the absorption band. Cyclic voltammograms (CV) were recorded on a Solartron 1287 potentiostat using platinum electrodes, at a scan rate of 50 $mVs^{-1}$ and a $Ag/Ag^+$ reference electrode (0.1 M of $AgNO_3$ in acetonitrile) in an anhydrous and argon-saturated solution of 0.1 M of tetrabutylammonium tetrafluoborate ($Bu_4NBF_4$) in acetonitrile (electrolyte). Under these conditions, the oxidation potential ($E_{ox}$) of ferrocene was 0.09V versus $Ag/Ag^+$, whereas the $E_{ox}$ of ferrocene was 0.41 V versus SCE. The HOMO and LUMO energy levels were determined from the oxidation and reduction onset from the CV spectra assuming the SCE electrode to be −4.7 eV from vacuum. Electrochemical onsets were determined at the position where the current starts to differ from the baseline. A Nanoscope III, Dimension 3100, atomic force microscope (Digital Instrument) was used to determine the thickness. To determine the thickness, each film was indented with a razor blade and topographic images were recorded by AFM; the thickness of the film was taken as the difference between the height of the film surface (an average made on both sides of the indentation) relative to the surface of the substrate (at the bottom of the indentation). Grazing-incidence X-ray scattering (GIXS) experiments were performed using a Siemens D5000 X-ray diffractometer with a CuKa radiation source (1.540598 Å). The operation power was 40 kV, 30 mA. The surface topographies of BHJ active layers composed of donor polymers and [60]PCBM were obtained with an atomic force microscopy (AFM) in tapping mode (Dimension V SPM, Veeco). The Si AFM tip was used with a force constant of 42 N $m^{-1}$ and AFM images were collected in air under ambient conditions.

Synthesis of 3,4-dicyanothiophene

A stirred solution of 3,4-bromothiophene (48.2 g, 0.2 mol) and cuprous cyanide (54 g, 0.6 mol) in dimethylformamide (100 mL) in a 250 mL flask was heated to 140° C., over a period ranging from 12-24 h. The reaction mixture was allowed to cool and was subsequently poured into a large amount of diluted ammonium hydroxide and stirred overnight. The reaction mixture was extracted with chloroform (4×1000 mL) and filtered. The combined organic extracts were washed twice with water. The organic phase was dried over anhydrous magnesium sulfate. Following the removal of the solvent a light-yellow solid was obtained which was subsequently purified by column chromatography using hexanes:ethyl acetate (1:1) as the eluant. A white product was obtained (12 g, yield: 45%): mp: 170-171° C.; GC-Ms: 134; $^1$H NMR (400 MHz, $CDCl_3$, ppm) δ: 8.06(s, 2H); $^{13}$C NMR (400 MHz, $CDCl_3$, ppm) δ: 136.8, 113.2, 112.

Synthesis of Thiophene-3,4-dicarboxylic acid 3,4-Dicyanothiophene (8.84 g, 66 mmol) and potassium hydroxide (34 g, 0.6 mol) were dissolved in ethylene glycol (100 mL) and refluxed overnight. The light yellow reaction mixture was cooled and poured into water (600 mL). The resulting solution was extracted with diethyl ether (2×400 mL), and the aqueous phase was cooled in an ice bath and acidified with excess concentrated hydrochloric acid until pH<3. The acidified aqueous phase was subsequently extracted with diethyl ether (2×400 mL). The combined organic extracts were dried over anhydrous magnesium sulfate and concentrated to afford the crude product as brown crystals. Recrystallization from water afforded thiophene-3,4-dicarboxylic acid (9.06 g, yield: 83%): mp: 230-232° C.; $^1$H NMR (400 MHz, DMSO-$d_6$, ppm) δ: 8.11(s, 2H); $^{13}$C NMR (100 MHz, DMSO-$d_6$, ppm) δ: 165.1, 134.3, 133.

Synthesis of 5-Octylthieno[3,4-c]pyrrole-4,6-dione

A solution of thiophene-3,4-dicarboxylic acid (5.97 g, 34.77 mmol) in acetic anhydride (150 mL) was stirred overnight at 140° C. The reaction mixture was subsequently concentrated to yield thiophene-3,4-dicarboxylic anhydride as a brown solid which was used without further purification. GC-Ms: 154; $^1$H NMR (400 MHz, $CDCl_3$, ppm) δ: 8.09(s, 2H).

The anhydride was subsequently dissolved in toluene (320 mL) in a 500 mL flask, followed by the addition of n-octylamine (6.72 g, 52.02 mmol, 8.6 mL). The resulting reaction mixture was subsequently refluxed over a period of 24 h. The reaction mixture was allowed to cool and was subsequently concentrated affording 4-octylcarbamoylthiophene-3-carboxylic acid as a solid. The acid was dissolved in thionyl chloride ($SOCl_2$) (270 mL) and refluxed over a period of 4 hours. The reaction mixture was cooled down and subsequently concentrated to dryness. The residue was purified by column chromatography using methylene dichloride:hexanes (2:1) as the eluant to afford the title compound as a pure white solid (5.2 g, yield 57%): mp: 120-122° C.; GC-Ms: 265; $^1$H NMR (400 MHz, $CDCl_3$, ppm) δ:7.8(s, 2H), 3.62-3.59 (t, 2H), 1.64-1.62(m, 2H), 1.26(m, 10H), 0.87-0.85(m, 3H); $^{13}$C NMR (100 MHz, $CDCl_3$, ppm) δ: 162.4, 136.7, 125.2, 37.9, 31.7, 29.2 (2C), 28.4, 26.8, 22.4, 14.1.

Synthesis of 1,3-Dibromo-5-octylthieno[3,4-c]pyrrole-4,6-dione

5-Octylthieno[3,4-c]pyrrole-4,6-dione (2.66 g, 10 mmol) was dissolved in concentrated sulfuric acid (15.3 mL) and trifluoroacetic acid (50 mL). NBS (5.37 g, 30 mmol) was subsequently added in five portions and the reaction mixture was stirred at room temperature overnight. The brown-red solution was then slowly diluted with water (100 mL) and extracted with dichloromethane. The organic phase was dried over anhydrous magnesium sulfate and concentrated to afford the crude product as orange crystals. Purification by column chromatography using methylene dichloride:hexanes (1:1) as the eluant afforded the title compound as a white powder (3.4 g, yield: 81%): mp:104° C.; $^1H$ NMR (400 MHz, $CDCl_3$, ppm) δ: 3.61-3.57(t, 2H), 1.62-1.56(m, 2H), 1.29-1.26(m, 10H), 0.89-0.85(t, 3H); $^{13}C$ NMR (100 MHz, $CDCl_3$, ppm) δ:160.6, 138.7, 113.2, 39.1, 32, 29.4, 29.36, 29.33, 28.5, 27.02, 27, 22.8, 14.3.

Synthesis of 5-(2-ethylhexyl)thieno[3,4-c]pyrrole-4,6-dione

A solution of thiophene-3,4-dicarboxylic acid (0.90 g, 5.23 mmol) in acetic anhydride (21 mL) was stirred overnight at 140° C. The reaction mixture was subsequently concentrated to yield thiophene-3,4-dicarboxylic anhydride as a brown solid which was used without further purification.

The anhydride was subsequently dissolved in toluene (55 mL) in a 100 mL flask, followed by the addition of 2-ethylhexylamine (1.02 g, 7.85 mmol). The resulting reaction mixture was subsequently refluxed over a period of 24 h. The reaction mixture was allowed to cool and was subsequently concentrated affording the desired acid as a solid. The acid was subsequently dissolved in thionyl chloride ($SOCl_2$) (68 mL) and refluxed over a period of 3 hours. The reaction mixture was cooled down and subsequently concentrated to dryness. The residue was purified by column chromatography using methylene dichloride:hexanes (1:1) as the eluant to afford the title compound as a pure white solid (0.9 g, yield: 65%): $^1H$ NMR (400 MHz, $CDCl_3$, ppm) δ: 7.78(s, 2H), 3.48-3.46(t, 2H), 1.78-1.75(t, 1H), 1.32-1.24(m, 8H), 0.90-0.82(t, 6H). $^{13}C$ NMR (100 MHz, $CDCl_3$, ppm) δ: 163.16; 136.81; 125.71; 42.54; 38.35; 30.67; 28.67; 24.00; 23.23; 14.30; 10.62.

Synthesis of 5-(dodecyl)thieno[3,4-c]pyrrole-4,6-dione)

The title compound was synthesized as described hereinabove using thiophene-3,4-dicarboxylic acid (10.00 g, 58.08 mmol) and 1-dodecylamine (16.14 g, 87.12 mmol) to afford 10.27 g of the title product as a white solid (Y=55%). $^1H$ NMR (400 MHz, $CDCl_3$, ppm) δ: 7.80 (s, 2H); 3.60 (t, 2H, J=7.3 Hz); 1.65-1.62 (m, 2H); 1.30-1.24 (m, 18H); 0.87 (t, 3H, J=6.5 Hz); $^{13}C$ NMR (100 MHz, $CDCl_3$, ppm) δ: 162.92; 136.91; 125.71; 38.75; 32.15; 29.87; 29.85; 29.81; 29.75; 29.59; 29.45; 28.72; 27.12; 22.93; 14.39.

Synthesis of 1,3-Dibromo-5-(2-ethylhexyl)thieno[3,4-e]pyrrole-4,6-dione 5-(2-Ethylhexyl)thieno[3,4-c]pyrrole-4,6-dione (0.45 g, 1.7 mmol) was dissolved in concentrated sulfuric acid (2.6 mL) and trifluoroacetic acid (8.7 mL). NBS (0.94 g, 5.1 mmol) was subsequently added in four portions and the reaction mixture was stirred at room temperature overnight under darkness. The brown-red solution was then slowly diluted with water (20 mL) and extracted with dichloromethane. The organic phase was dried over anhydrous magnesium sulfate and concentrated to afford the crude product as orange crystals. Purification by column chromatography using methylene dichloride:hexanes (1.5:1) as the eluant afforded the title compound as a white powder (1.0 g, yield: 78%): $^1H$ NMR (400 MHz, $CDCl_3$, ppm) δ: 3.5-3.48 (d, 2H), 1.8(m, 1H), 1.34-1.27(m, 8H), 0.92-0.87(t. 6H); $^{13}C$ NMR (100 MHz, $CDCl_3$, ppm) δ:160.92; 134.95; 113.18; 42.86; 38.40; 30.74; 28.77; 24.05; 23.18; 14.32; 10.60.

Synthesis of 1,3-Dibromo-5-(dodecyl)thieno[3,4-c]pyrrole-4,6-dione

The title compound was synthesized as described for 5 using 5-(dodecyl)-thieno[3,4-c]pyrrole-4,6-dione (3.00 g. 9.32 mmol), a mixture of sulfuric acid (17.4 mL) and trifluoroacetic acid (56.4 mL) and N-bromosuccinimide (4.44 g, 24.94 mmol) to afford 3.03 g of the title product as white powder (Y=68%). $^1H$ NMR (400 MHz, $CDCl_3$, ppm) δ: 3.59 (t, 2H, J=7.2 Hz); 1.64-1.61 (m, 2H); 1.30-1.25 (m, 18H); 0.87 (t, 3H, J=6.5 Hz). $^{13}C$ NMR (100 MHz, $CDCl_3$, ppm) δ: 160.63; 135.03; 113.17; 39.08; 32.16; 29.86; 29.84; 29.81; 29.69; 29.59; 29.40; 28.50; 27.04; 22.94; 14.38.

Synthesis of 1,3-Dithiophene-5-octylthieno[3,4-c]pyrrole-4,6-dione 1,3-Dibromo-5-octylthieno [3,4-c]pyrrole-4,6-dione (2.1 g, 5 mmol) was dissolved in THF (200 mL) in a 500 mL flask, followed by the addition of tributyltin thiophene (5.6 g, 4.8 mL) and $Pd(PPh_3)_2Cl_2$ (210 mg, 6%). The resulting reaction mixture was subsequently refluxed over a period of 24 h. The reaction mixture was allowed to cool and was subsequently treated with an aqueous KF solution (100 mL). The reaction mixture was then extracted with dichloromethane (250 mL). The organic phase was dried and concentrated to afford the crude product as a yellow-green residue. Purification by column chromatography using methylene dichloride:hexanes (1:1) as the eluant afforded the title compound as a green powder (1.6 g, yield: 75%): $R_f$(DCM:hexanes(1:1))=0.6; $^1H$ NMR (400 MHz, $d^8$-THF, ppm) δ: 8.33-8.32 (d, 2H), 7.78-7.77 (d, 2H), 7.34-7.32 (t, 2H), 3.83 (t, 2H), 1.89 (m, 2H), 1.53-1.47 (m, 10H), 1.05 (t, 3H); $^{13}C$ NMR (100 MHz, $d^8$-THF) δ:162.1, 135.7, 132.5, 1 30.1, 129.1, 128.9, 128.4, 38.1, 32, 28.9, 28.4, 26.9, 22.7, 13.6.

Synthesis of 1,3-Di(2-bromothien-5'-yl)-5-octylthieno[3,4-c]pyrrole-4,6-dione 1,3-Dithiophene-5-octylthieno[3,4-c]pyrrole-4,6-dione (0.86 g, 2 mmol) was dissolved in a mixture of AcOH and $CHCl_3$ (30 mL:30 mL) in a 100 mL flask placed in an ice bath. NBS (0.79 g, 4.4 mmol) was subsequently added in several portions and the reaction mixture was stirred at room temperature over a period of 24 h. The solution was then slowly diluted with water and extracted with chloroform (200 mL). The organic phase was dried and concentrated to afford a crude residue which was purified by column chromatography using methylene dichloride:hexanes (1:1) as the eluant. The title compound was obtained as a bright yellow powder (1.16 g, yield: 99%): $^1H$ NMR (400 MHz, $CDCl_3$, ppm) δ: 7.65(d, 2H), 7.09-7.08(d, 2H), 3.64(t, 2H), 1.67(m, 2H), 1.32-1.26 (m, 10H), 0.89-0.85(t, 3H).

Synthesis of 2-Bromo-3-octylthiophene

3-Octylthiophene (45 g) was dissolved in DMF (327 mL). NBS (40.75 g) was dissolved in DMF (300 mL) and was subsequently added dropped to the 3-octylthiophene solution at room temperature under the darkness. The reaction mixture was subsequently stirred at room temperature overnight, slowly diluted with water (800 mL) and extracted with diethyl ether (3×300 mL). The combined organic extracts were subsequently washed with brine (2×200 mL) and water (200 mL). The organic phase was dried over anhydrous magnesium sulfate and concentrated. Vacuum distillation of the crude residue afforded the title compound as a colorless liquid (56.0 g, yield: 89%): $^1H$ NMR (300 MHz, $CDCl_3$, ppm) δ: 7.15-7.13(d, 1H), 6.78-6.76(d, 1H), 2.57-2.52(t, 2H), 1.59-1.54(m, 2H), 1.29-1.27(m, 10H), 0.90-0.86(t, 3H).

Synthesis of 2-Boranate-3-octylthiophene

2-Bromo-3-octylthiophene (10 g, 36.33 mmol) was dissolved in THF (180 mL) and the solution cooled to −78° C.

n-BuLi (23.8 mL, 38.15 mmol, 1.6 M BuLi in hexane) was added dropwise over a period of 30 minutes. The reaction mixture was subsequently stirred at −78° C. over a period of 2 h. 2-Isopropoxy-4,4,5,5-tetramethyl-[1,3,2]dioxaboralane (72.66 mmol, 14.8 mL) was subsequently added to the reaction mixture over a period of 5 minutes. The reaction mixture was then allowed to warm to room temperature and stirred overnight. The reaction mixture was then quenched with a saturated aqueous $NaHCO_3$ solution (190 mL). The reaction mixture was subsequently extracted with ethyl acetate (1800 mL). The organic extract was washed with water, dried over sodium sulfate and subsequently concentrated to provide a crude residue which was purified by column chromatography using ethyl acetate:hexanes (1:20) as the eluant. The title compound was obtained as a colorless liquid (10.0 g, yield: 85.4%): $^1$H NMR (400 MHz, $CDCl_3$, ppm) δ: 7.47(d, 1H), 7.02(d, 1H), 2.89(t, 2H), 1.57(m, 2H), 1.32(br, 22H), 0.92(t, 3H).

1,3-Di(3-octylthien-2-yl)-5-octylthieno[3,4-c]pyrrole-4,6-dione 1,3-Dibromo-5-octylthieno[3,4-c]pyrrole-4,6-dione (0.421 g, 1 mmol) was dissolved in THF (10 mL) in a 50 mL flask, followed by the addition of 2-boranate 3-octylthiophene (0.97 g, 3 mmol), $Pd(PPh_3)_4$ (11 mg, 10%) and $K_2CO_3$ (5 mL, 2M aqueous solution). The resulting reaction mixture was subsequently refluxed overnight. The reaction mixture was allowed to cool and was subsequently diluted with water. The reaction mixture was then extracted with dichloromethane (30 mL), the organic phase dried over anhydrous magnesium sulfate and concentrated. Purification by column chromatography using methylene dichloride:hexanes (20:1) as the eluant afforded the title compound as a green powder (yield: 70.0%).

Synthesis of 1,3-Di(5-bromo-3-octylthien-2'-yl)-5-octylthieno[3,4-c]pyrrole-4,6-dione 1,3-Di(3-octylthien-2-yl)5-octylthieno[3,4-c]pyrrole-4,6-dione (2 mmol) was dissolved in a mixture of AcOH and $CHCl_3$ (30 mL:30 mL) in a 100 mL flask placed in an ice bath. NBS (0.79 g, 4.4 mmol) was subsequently added in several portions and the reaction mixture was stirred at room temperature over a period of 24 h. The solution was then slowly diluted with water and extracted with chloroform (200 mL). The organic phase was dried and concentrated to afford a crude residue which was purified by column chromatography using methylene dichloride:hexanes (1:1) as the eluant. The title compound was obtained as a bright yellow powder (yield: 90%).

Synthesis of Thiophene-3-carbonyl chloride

Thiophene-3-carboxylic acid (38.4 g, 0.3 mmol) was dissolved in methylene chloride (60 mL) in a 250 mL flask placed in an ice bath. Oxalyl chloride (76.2 g, 0.6 mol, 53 mL) was subsequently added. The reaction mixture was stirred overnight at room temperature resulting in a clear solution. The reaction mixture was subsequently concentrated to yield thiophene-3-carbonyl chloride as a colorless solid which was used without further purification.

Synthesis of N,N-diethylthiophene-3-carboxamide

Thiophene-3-carbonyl chloride was dissolved in methylene chloride (100 mL) and added to a mixture of diethylamine (43.8 g, 0.6 mol) and methylene chloride (100 mL) placed in an ice bath. Following the addition, the ice bath was removed and the resulting reaction mixture stirred at room temperature over a period of 4 h. The reaction mixture was washed several times with water and the organic layer dried over anhydrous magnesium sulfate and concentrated. Vacuum distillation of the crude residue afforded the title compound as a light yellow oil (yield: 91%): GC-Ms: 183; $^1$H NMR (300 MHz, $CDCl_3$, ppm) δ: 7.36(d, 1H), 7.22-7.19(m, 1H), 7.08-7.06(m, 1H).

Synthesis of 4,8-Dihydrobenzo[1,2-b:4,5-b']dithiophen-4,8-dione

N,N-diethylthiophene-3-carboxamide (18.3 g, 0.1 mol) was dissolved in THF (100 mL) in a flame dried flask kept under an inert atmosphere. The reaction flak was placed in an ice bath followed by the dropwise addition of n-BuLi (40.0 mL, 2.5 M BuLi in hexane) over a period of 30 minutes. The reaction mixture was then allowed to warm to room temperature and stirred over a period of 2 hours. The reaction mixture was subsequently slowly poured into ice water (250 mL) and stirred for several hours. The resulting reaction mixture was filtered and the yellow precipitate washed successively with water, methanol (50 mL) and hexanes (50 mL). The title compound was obtained as a yellow powder (yield: 75%): GC-Ms: 220; $^1$H NMR (400 MHz, $CDCl_3$,ppm) δ: 7.69-7.68 (d, 2H), 7.65-7.64(d, 2H); $^1$H NMR (400 MHz, DMSO-$d_6$, ppm) δ: 8.12-8.11(d, 2H), 7.60-7.59(d, 2H); $^{13}$C NMR (100 MHz, $CDCl_3$, ppm) δ: 174.7, 145.1, 143.1, 133.8, 126.8.

Synthesis of 4,8-Dioctyloxylbenzo[1,2-b:3,4-b]dithiophene

A 250 mL flask was charged with 4,8-dihydrobenzo[1,2-b:4,5-b']dithiophen-4,8-dione (4.4 g, 20 mmol), zinc powder (2.86 g, 44 mmol) and water (60 mL). NaOH (12 g) was subsequently added to the reaction mixture. The resulting reaction mixture was subsequently refluxed over a period of 2 hours. 1-Bromooctane (12 g, 60 mmol) and tetrabutylammonium bromide (644 mg) were subsequently added to the reaction mixture. The reaction mixture was then stirred overnight at 100-110° C. and subsequently slowly poured into cold water and extracted twice with diethyl ether. The organic layer was dried over anhydrous magnesium sulfate and concentrated. Purification by column chromatography using methylene chloride:hexanes (1:8) as the eluant afforded the title compound as a white solid (7.8 g, yield: 87.0%): GC-MS: m/z=446; $^1$H NMR (400 MHz, $CDCl_3$, ppm) δ: 7.48-7.47(d, 2H), 7.37-7.36(d, 2H), 4.28-4.26(m, 4H), 1.91-1.84(m, 4H), 1.60-1.52(m, 4H), 1.36-1.31(m, 16 H), 0.91-0.88(t, 6H).

Synthesis of 4,8-Didodecyloxylbenzo[1,2-b:3,4-b]dithiophene

The synthetic procedure is similar to that for the preparation of 4,8-dioctyloxylbenzo[1,2-b:3,4-b]dithiophene. The title compound was obtained as a white solid (7.8 g, yield: 70%): $^1$H NMR (400 MHz, $CDCl_3$, ppm) δ: 7.48-7.47(d, 2H), 7.37-7.35(d, 2H), 4.29-4.26(m, 4H), 1.88-1.86(m, 4H), 1.58-1.56(m, 4H), 1.40-1.27(m, 32H), 0.90-0.87(t, 6H), 0.45(s, 18H).

Synthesis of 4,8-Di(2-ethylhexyloxyl)lbenzo[1,2-b:3,4-b]dithiophene

The synthetic procedure is similar to that for the preparation of 4,8-dioctyloxylbenzo[1,2-b:3,4-b]dithiophene. The title compound was obtained as a colorless liquid (8.0 g, yield: 89.6%): $^{1}$H NMR (400 MHz, $CDCl_3$, ppm) δ: 7.54-7.53(d, 2H), 7.40-7.39(d, 2 H),4.25-4.24(m, 4H), 1.89-1.86 (m, 2H), 1.79-1.50(m, 6H), 1.47-1.36(m, 10H), 1.11-0.96(m, 12H).

Synthesis of 4,8-(3,7-Dimethyloctyloxy)benzo[1,2-b:3,4-b]dithiophene

The synthetic procedure is similar to that for the preparation of 4,8-dioctyloxylbenzo[1,2-b:3,4-b]dithiophene. Purification by column chromatography using hexanes followed by methylene chloride:hexanes (1:10) as the eluant afforded the title compound as a pale yellow liquid (9.0 g, yield: 87.0%): $^{1}$H NMR (300 MHz, $CDCl_3$, ppm) δ: 7.50-7.49(d, 2H), 7.38-7.36(d, 2H), 4.35-4.33 (m, 4 H), 1.97(m, 2H), 1.83(m, 2H), 1.61(m, 2H), 1.39-1.18(m, 12H), 1.01-0.99(d, 6H), 0.91-0.89(d, 12 H).

Synthesis of 2,6-Bis(trimethyltin)-4,8-dioctyloxylbenzo[1,2-b:3,4-b]dithiophene 4,8-Dioctyloxylbenzo[1,2-b:3,4-b]dithiophene (0.62 g, 1.4 mmol) was dissolved in THF (20 mL) and the resulting solution cooled to −78° C. under an argon atmosphere. n-BuLi (5.6 mL, 14.0 mmol, 2.5 M BuLi in hexane) was added dropwise over a period of 15 minutes. The reaction mixture was subsequently stirred at −78° C. over a period of 30 minutes. The reaction mixture was then allowed to warm to room temperature and stirred over a period of 2 hours resulting in the formation of a light green precipitate. The reaction mixture was subsequently cooled to −78° C. followed by the addition of trimethyltin chloride (1 M in hexanes, 7 mL, and 7 mmol). The precipitate disappeared and a clear solution was obtained. The reaction mixture was then allowed to warm to room temperature and stirred overnight. The reaction mixture was then quenched with a saturated aqueous $NH_4Cl$ solution and extracted with hexanes. The organic extract was dried over anhydrous sodium sulfate and subsequently concentrated to provide a crude residue which was twice purified by recrystallization from isopropanol. The title compound was obtained as a colorless solid (0.87 g, yield: 80.0%): $^{1}$H NMR (400 MHz, $CDCl_3$, ppm) δ: 7.51(s, 2H), 4.31-4.28(t, 4H), 1.90-1.87(m, 4H), 1.37-1.20(m, 20 H), 0.91-0.88 (t, 6H), 0.45(s, 18 H).

Synthesis of 2,6-Bis(trimethyltin)-4,8-didodecyloxylbenzol[1,2-b:3,4-b]dithiophene 4,8-Didodecyloxylbenzo[1,2-b:3,4-b]dithiophene (0.78 g, 1.4 mmol) was dissolved in THF (20 mL) and the resulting solution cooled to −78° C. under an argon atmosphere. n-BuLi (5.6 mL, 14.0 mmol, 2.5 M BuLi in hexane) was added dropwise over a period of 15 minutes. The reaction mixture was subsequently stirred at −78° C. over a period of 30 minutes. The reaction mixture was then allowed to warm to room temperature and stirred over a period of 1 hour resulting in the formation of a light green precipitate. The reaction mixture was subsequently cooled to −78° C. followed by the addition of trimethyltin chloride (1 M in hexanes, 7 mL, and 7 mmol). The precipitate disappeared and a clear solution was obtained. The reaction mixture was then allowed to warm to room temperature and stirred overnight. The reaction mixture was then quenched with a saturated aqueous $NH_4Cl$ solution and extracted with hexanes. The organic extract was dried over anhydrous sodium sulfate and subsequently concentrated to provide a crude residue which was twice purified by recrystallization from isopropanol. The title compound was obtained as a colorless solid (1.04 g, yield: 87.0%): $^{1}$H NMR (400 MHz, $CDCl_3$, ppm) δ: 7.53 (s, 2H), 4.33-4.30 (t, 4H), 1.90-1.87(m, 4H), 1.40-1.26(m, 36 H), 0.90-0.87(t, 6H), 0.45(s, 18 H).

Synthesis of 2,6-Bis(trimethyltin)-4,8-di(2-ethylhexyloxyl)benzo[1,2-b:3,4-b]dithiophene 4,8-Di(2-ethylhexyloxyl)benzo[1,2-b:3,4-b]dithiophene (1.24 g, 2.8 mmol) was dissolved in THF (40 mL) and the resulting solution cooled to −78° C. under an argon atmosphere. n-BuLi (5.6 mL, 14.0 mmol, 2.5 M BuLi in hexane) was added dropwise over a period of 15 minutes. The reaction mixture was subsequently stirred at −78° C. over a period of 30 minutes. The reaction mixture was then allowed to warm to room temperature and stirred over a period of 2 hours resulting in the formation of a light green precipitate. The reaction mixture was subsequently cooled to −78° C. followed by the addition of trimethyltin chloride (1 M in hexanes, 14 mL, and 14 mmol). The precipitate disappeared and a clear solution was obtained. The reaction mixture was then allowed to warm to room temperature and stirred overnight. The reaction mixture was then quenched with a saturated aqueous $NH_4Cl$ solution and extracted with hexanes. The organic extract was dried over anhydrous sodium sulfate and subsequently concentrated to provide a crude residue which was twice purified by recrystallization from isopropanol. The title compound was obtained as a colorless solid (1.90 g, yield: 88.0%): $^{1}$H NMR (400 MHz, $CDCl_3$, ppm) δ: 7.56 (s, 2H), 4.24-4.23(t, 4H), 1.90-1.87(m, 2H), 1.8-1.41(m, 16 H), 1.09-1.05(m, 12 H), 0.49(s, 18H).

Synthesis of 2,6-Bis(trimethyltin)-4,8-(3,7-dimethyloctyloxy)benzo[1,2-b:3,4-b]dithiophene 4,8-(3,7-Dimethyloctyloxy)benzo[1,2-b:3,4-b]dithiophene (1.76 g, 3.5 mmol) was dissolved in THF (50 mL) and the resulting solution cooled to −78° C. under an argon atmosphere. n-BuLi (8.4 mL, 21.0 mmol, 2.5 M BuLi in hexane) was added dropwise over a period of 15 minutes. The reaction mixture was subsequently stirred at −78° C. over a period of 30 minutes. The reaction mixture was then allowed to warm to room temperature and stirred over a period of 2 hours resulting in the formation of a light green precipitate. The reaction mixture was subsequently cooled to −78° C. followed by the addition of trimethyltin chloride (1 M in hexanes, 14 mL, and 14 mmol). The precipitate disappeared and a clear solution was obtained. The reaction mixture was then allowed to warm to room temperature and stirred overnight. The reaction mixture was then quenched with a saturated aqueous $NH_4Cl$ solution and extracted with hexanes. The organic extract was dried over anhydrous sodium sulfate and subsequently concentrated to provide a crude oily residue which was twice washed with isopropanol at −78° C. The title compound was obtained as a colorless solid (2.10 g, yield: 69%): $^{1}$H NMR (300 MHz, $CDCl_3$, ppm) δ: 7.53 (s, 2H), 4.4(m, 4H), 1.97(m, 2H), 1.83(m, 2H), 1.61(m, 2H), 1.39-1.18(m, 12H), 1.02-1.00(d, 6H), 0.90-0.88(d, 12 H), 0.46(s, 18H).

Synthesis of 3,3'-5,5'-Tetrabromo-2,2-bithiophene 2,2'-Bithiophene (39.2 g, 0.236 mol) was dissolved in a solvent mixture composed of AcOH and chloroform (138 mL: 320 mL). The reaction mixture was subsequently placed in an ice bath followed by the dropwise addition of $Br_2$ (138 g, 44.4 mL). The reaction mixture was then stirred at room temperature over a period of 5 h followed by overnight refluxing. The reaction mixture was allowed to cool and an aqueous KOH solution (350 mL, 10%) was subsequently added. The reaction mixture was subsequently extracted with chloroform (2×700 mL). The combined organic extract was washed with water, dried over anhydrous magnesium sulfate and subsequently concentrated to provide a crude residue which was purified by recrystallization from ethanol. The title compound was obtained as a yellow solid (86 g, yield: 76%); $^1H$ NMR (400 MHz, $CDCl_3$, ppm) δ: 7.05(s, 2H).

Synthesis of 3,3'-Dibromo-5,5'-bis(trimethylsilyl)-2,2'-bithiophene 3,3'-5,5'-Tetrabromo-2,2-bithiophene (9.64 g, 20 mmol) was dissolved in anhydrous THF (200 mL) and the resulting solution cooled to −90° C. under an argon atmosphere. n-BuLi (16 mL, 40.0 mmol, 2.5 M BuLi in hexane) was added dropwise over a period of 40 minutes. The reaction mixture was subsequently stirred at −90° C. over a period of 60 minutes followed by the addition of chlorotrimethylsilane (5.4 g, 50 mmol, 6.3 mL). The reaction mixture was stirred for an additional 30 minutes at −90° C., allowed to warm to room temperature and stirred overnight. The reaction mixture was subsequently poured into cold water and extracted three times with diethyl ether. The combined organic layers were dried over anhydrous magnesium sulfate and concentrated. Purification by column chromatography using hexanes as the eluant afforded the title compound as a colorless solid (6.5 g, yield: 67.0%): $^1H$ NMR (400 MHz, $CDCl_3$, ppm) δ: 7.16(s, 2H), 0.34(s, 18 H).

Synthesis of 4,4'-Bis(octyl-5,5'-bis(trimethylsilyl)-dithieno[3,2-b:2',3'-d]silole 3,3'-Dibromo-5,5'-bis(trimethylsilyl)-2,2'-bithiophene (2.34 g, 5 mmol) was dissolved in THF (40 mL) in a 100 mL flask cooled to −78° C. n-BuLi (4.21 mL, 10.53 mmol, 2.5 M BuLi in hexane) was added dropwise over a period of 15-30 minutes. The reaction mixture was subsequently stirred at −78° C. over a period of 60 minutes followed by the addition of dichlorodioctylsilane (2.08 mL, 6 mmol). The reaction mixture was subsequently allowed to warm to room temperature and stirred overnight. The reaction mixture was then quenched with water and extracted three times with diethyl ether. The combined organic layers were dried over anhydrous magnesium sulfate and concentrated. Purification by column chromatography using hexanes as the eluant afforded the title compound as a colorless oil (2.26 g, yield: 72.0%): $^1H$ NMR (400 MHz, $CDCl_3$, ppm) δ: 7.14(s, 2H), 1.24(m, 24 H), 0.90-0.88(m, 10H), 0.34(s, 18 H).

Synthesis of 4,4'-Bis(octyl)-5,5'-dibromo-dithieno[3,2-b:2',3'-d]silole 4,4'-Bis(octyl)-5,5'-bis(trimethylsilyl)-dithieno[3,2-b:2',3'-d]silole (1.19 g, 2.11 mmol) was dissolved in THF (14 mL). NBS (0.77 g, 4.33 mmol) was subsequently added in several portions and the reaction mixture was stirred overnight. The reaction mixture was subsequently poured into cold water and extracted several times with diethyl ether. The combined organic layers were dried over anhydrous magnesium sulfate and concentrated. Purification by column chromatography using hexanes as the eluant afforded the title compound (yield: 84.0%): $^1H$ NMR (400 MHz, $CDCl_3$, ppm) δ: 6.99(s, 2H), 1.31-1.21(m, 24 H), 0.89-0.85(t, 10H).

Synthesis of 4,4'Bis(hexyl)-5,5'-dibromo-dithieno[3,2-b:2',3'-d]silole

The synthetic procedure is similar to that for the preparation of 4,4'-bis(octyl)-5,5'-dibromo-dithieno[3,2-b: 2',3'-d] silole. $^1H$ NMR (400 MHz, $CDCl_3$, ppm) δ: 6.99(s, 2H), 1.34-1.23(m, 16H), 0.89-0.84(t, 10H).

Synthesis of 5,5'Bis(trimethyltin)-4,4-bis(octyl)-dithieno[3,2-b:2',3'-d]silole 4,4'-Bis(octyl)-5,5'-dibromo-dithieno[3,2-b: 2',3'-d]silole (1.2 g, 2.08 mmol) was dissolved in anhydrous THF (20 mL) and the resulting solution cooled to −78° C. under an argon atmosphere. n-BuLi (2.6 mL, 6.5 mmol, 2.5 M BuLi in hexane) was added dropwise over a period of 10 minutes. The reaction mixture was subsequently stirred at −78° C. over a period of 30 minutes followed by the addition of trimethyltin chloride (1 M in hexanes, 7 mL, and 7 mmol). The reaction mixture was then allowed to warm to room temperature and stirred overnight. The reaction mixture was subsequently poured into cold water and extracted several times with diethyl ether. The combined organic layers were dried over anhydrous magnesium sulfate and concentrated. The title compound was obtained as a sticky oil (yield: 84.3%): $^1H$ NMR (400 MHz, $CDCl_3$, ppm) δ: 7.09 (s, 2H), 1.62-1.24(m, 34 H), 0.34(s, 18 H).

Synthesis of 5,5'Bis(trimethyltin)-4,4-bis(hexyl)-dithieno[3,2-b:2',3'-d]silole

The synthetic procedure is similar to that for the preparation of 5,5'-bis(trimethyltin)-4,4-bis(octyl)-dithieno[3,2-b:2',3'-d]silole. The title compound was obtained in 91% yield: $^1H$ NMR (400 MHz, $CDCl_3$, ppm) δ: 7.09 (s, 2H), 1.62-1.24(m, 26 H), 0.34(s, 18 H).

Synthesis of 9-Octylnonylamine

A mixture of 9-heptanedecanone (12 g, 47 mmol), ammonium acetate (36.32 g, 470 mmol), $NaBH_3CN$ (2 g, 31 mmol) and methanol (140 mL) was stirred at room temperature under an argon atmosphere over a period of 3 days. The reaction mixture was then acidified with excess concentrated hydrochloric acid until pH<2 and concentrated. The residue was subsequently treated with an aqueous KOH solution until pH>10 and extracted with diethyl ether (3×300 mL). The combined organic layers were dried over anhydrous magnesium sulfate and concentrated. Vacuum distillation of the crude residue afforded the title compound as a colorless oil (9.4 g, yield: 82%): $^1H$ NMR (400 MHz, $CDCl_3$, ppm) δ: 2.60(s, 1H), 1.21 (br, 28H), 0.83-0.79 (t, 6H).

Synthesis of 3,3-Dibromo-2,2'-bithiophene 3,3',5,5'-Tetrabromo-2,2-bithiophene (24.2 g, 0.05 mol) was added portionwise over a period of 30 minutes to a refluxing dispersion of zinc powder (12.6 g, 0.2 mol) in a solvent mixture comprising ethanol (250 mL), water (50 mL), glacial acetic acid (60 mL) and HCl (5 mL; 3M). Following overnight refluxing, the reaction mixture was allowed to cool to room temperature and was filtered. The solid was washed three times with ethanol. The combined filtrates were subsequently concentrated and the residue combined with water (125 mL). The resulting mixture was subsequent extracted several times with diethyl ether. The combined organic layers were washed with water dried over anhydrous magnesium sulfate and concentrated. Purification by column chromatography using hexanes as the eluant afforded the title compound as white crystals (10.9 g, yield: 67.0%): $^{1}$H NMR (400 MHz, $CDCl_3$, ppm) δ: 7.42-7.40(d, 2H), 7.09-7.08(d, 2H).

Synthesis of N-(1-Octylnonyl)dithieno[3,2-b:2',3'-d]pyrrole

To a solution of 3,3-dibromo-2,2'-bithiophene (4.92 g, 15.3 mmol), t-BuONa (3.54 g, 36.8 mmol), $Pd_2$ dba$_3$ (0.35 g, 0.382 mmol) and BINAP (0.95 g, 1.53 mmol) in toluene (38 mL) under an argon atmosphere was added 9-octylnonylamine (4 g, 15.7 mmol). The reaction mixture was subsequently stirred at 110° C. over a period of 7 hours. The reaction mixture was allowed to cool to room temperature followed by the addition of water. The organic layer was removed and the remaining aqueous phase extracted several times with diethyl ether. The combined organic layers were dried over anhydrous magnesium sulfate and concentrated. Purification by column chromatography using hexanes as the eluant afforded the title compound as a light green solid (5.2 g, 81% yield): mp: 60° C.; GC-Ms: 417.5; $^{1}$H NMR (400 MHz, $CDCl_3$, ppm) δ: 7.11(d, 2H), 7.02-7.01(d, 2H), 4.23-4.19(m, 1H), 2.08(m, 2H), 1.85-1.80(m, 2H), 1.22-1.07(m, 24 H), 0.86-0.82(t, 6 H); $^{13}$C NMR (100 MHz, $CDCl_3$, ppm) δ: 144.2, 122, 4, 114.9, 59.9, 35.4, 31.9, 29.4, 29.3, 26.7, 22.8, 14.2.

Synthesis of 2,6-Bis(trimethyltin)-N-(1-octylnonyl)dithieno[3,2-b:2',3'-d]pyrrole N-(1-Octylnonyl)dithieno[3,2-b:2',3'-d]pyrrole (0.834 g, 2 mmol) was dissolved in anhydrous THF (40 mL) and the resulting solution cooled to −78° C. under an argon atmosphere. n-BuLi (4.0 mL, 10.0 mmol, 2.5 M BuLi in hexane) was added dropwise over a period of 10 minutes. The reaction mixture was subsequently stirred at −78° C. over a period of 60 minutes, allowed to warm to room temperature and stirred for an additional 2 hours. The reaction mixture was subsequently cooled to −78° C. followed by the addition of trimethyltin chloride (1 M in hexanes, 10 mL, and 1 mmol). The reaction mixture was then allowed to warm to room temperature and stirred overnight. The reaction mixture was then concentrated and the crude residue extracted with hexanes and filtered. Following removal of the solvent, the title compound was obtained as a dark viscous green oil (1.13 g, yield: 82%): GC-Ms: 743.5; $^{1}$H NMR (400 MHz, $CDCl_3$, ppm) δ:7.05(s, 2H), 4.37(m, 1H), 2.1(m, 2H), 1.90(m, 2H), 1.32-1.23(m, 24 H), 0.94-0.88(m, 6H), 0.39 (s, 18H); $^{13}$C NMR (100 MHz, $CDCl_3$, ppm) δ: 147.2, 135, 120.1, 119.1, 59.6, 35.2, 32.0, 29.5, 29.4, 26.7, 22.8, 14.3, −8.1.

Synthesis of Polymers

Synthesis of ZP16

To a solution of 5,5'-bis(trimethyltin)-4,4-bis(octyl)-dithieno[3,2-b:2',3'-d]silole (212.6 mg, 0.309 mmol) and 1,3-dibromo-5-octylthieno[3,4-c]pyrrole-4,6-dione (126.3 mg, 0.3 mmol) in toluene (10 mL) under an argon atmosphere was added $Pd_2$ dba$_3$ (5.5 mg, 2%) and P(Tolyl)$_3$ (19.65 mg, 16%). The reaction mixture was subsequently refluxed over a period of 48 h and end-capped using successively tributyltin-thiophene and 2-bromothiophene. The reaction mixture was subsequently allowed to cool to room temperature and the polymer precipitated using methanol (400 mL). The polymer was then subjected to Soxhlet extraction using methanol, hexanes and chloroform. The chloroform portion was concentrated and purified by precipitation from MeOH. The polymer was obtained as a dark solid following drying under vacuum over a period of 12 hours (yield: 65%).

Synthesis of ZP25

To a solution of 1,3-dibromo-5-octylthieno[3,4-c]pyrrole-4,6-dione (211 mg, 0.5 mmol) and trans-1,2-bis(tributylstannyl)ethylene (303 mg, 0.5 mmol) in toluene (10 mL) in a 50 mL flask was added $Pd(PPh_3)_4$ (15 mg). The reaction mixture was subsequently refluxed over a period of 8 h and subsequently allowed to cool to room temperature. The polymer was precipitated using methanol (300 mL) and subsequently subjected to Soxhlet extraction using hexanes, acetone and chloroform. The chloroform portion was concentrated and purified by precipitation from MeOH. The polymer was obtained as a dark-purple solid following drying under vacuum over a period of 12 hours (yield: 15%).

Synthesis of ZP28

To a solution of 1,3-dibromo-5-octylthieno[3,4-c]pyrrole-4,6-dione (421 mg, 1.0 mmol) and 2,5-di(trimethyl)tin thiophene (409.7 mg, 1 mmol) in toluene (15 mL) in a 50 mL flask was added $Pd(PPh_3)_4$ (30 mg). The reaction mixture was subsequently refluxed over a period of 48 h and end-capped using successively 2-bromothiophene and 2-tributyltin thiophene. The reaction mixture was subsequently allowed to cool to room temperature and the polymer precipitated using methanol. The polymer was then subjected to Soxhlet extraction using hexanes, acetone and chloroform. The chloroform portion was concentrated and purified by precipitation from MeOH. The polymer was obtained as a dark-purple solid following drying under vacuum over a period of 12 hours (yield: 26%): $M_w$=1.9 K; polydispersity=1.18.

Synthesis of ZP30

Figure 8:
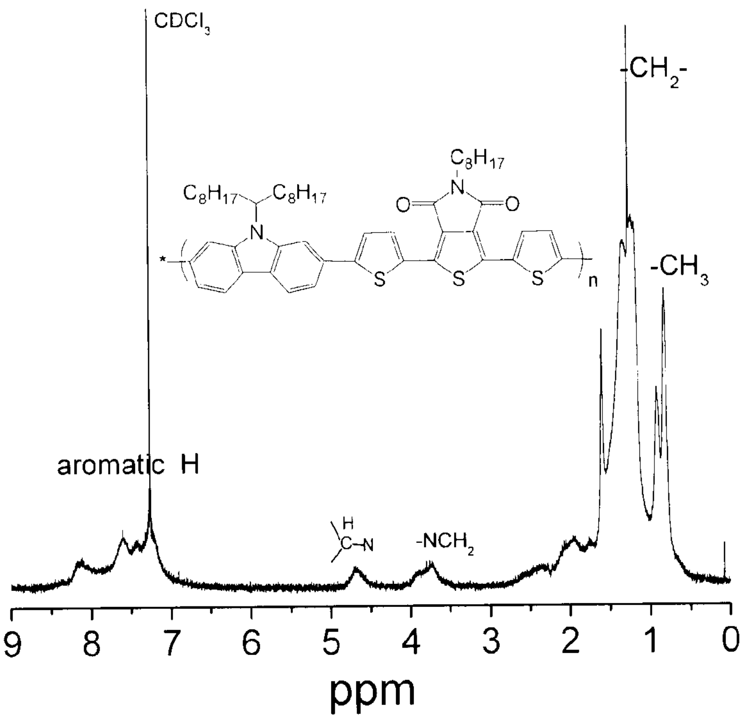
FIG. 8 is an illustration of the $^1$H NMR spectra of polymer ZP30 in deuterated chloroform at room temperature in accordance with an embodiment of the present specification.
Figure 9:
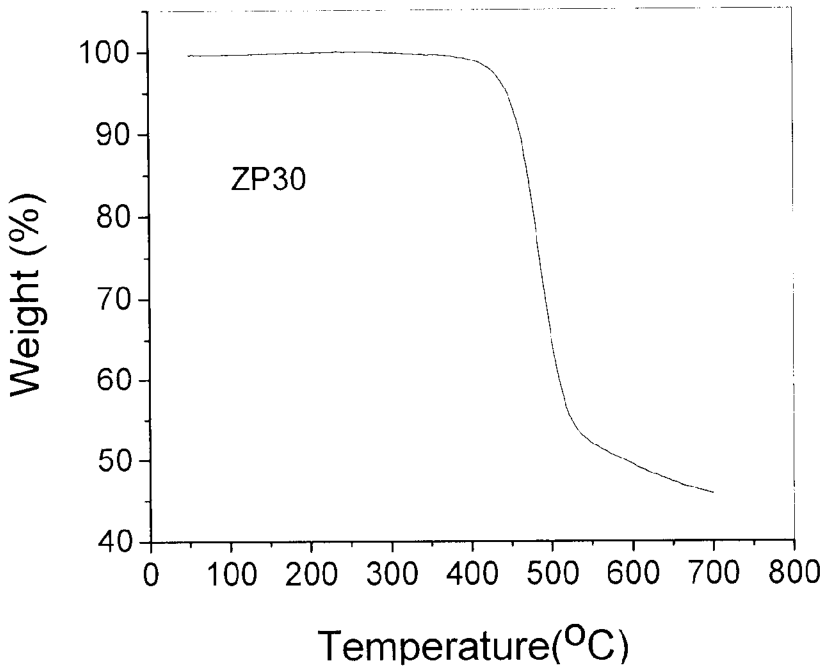
FIG. 9 is an illustration of the temperature of degradation of polymer ZP 30 in accordance with an embodiment of the present specification.

To a solution of 1,3-di(2-bromothien-5'-yl)-5-octylthieno[3,4-c]pyrrole-4,6-dione (176.22 mg, 0.3 mmol) and 2,7-(bis(4,4,5,5-tetramethyl-1,3,2-dioxaboralan-2-yl)-n-9-heptadecanylcarbazole (197.25 mg, 0.3 mmol) in toluene (5 mL) and water (1.2 mL) was added $Pd_2$ dba$_3$ (2.75 mg, 0.003 mmol), sphos (5 mg) and $K_3$ $PO_4$ (509.4 mg, 2.4 mmol). The reaction mixture was subsequently heated at 95° C. over a period of 24 h followed by the addition of bromobenzene (31.5 μL, 0.23 mmol). Following heating at 95° C. for an additional 3 hours, phenylboronic acid (36.6 mg, 0.25 mmol) in toluene (2 mL) was added. The reaction mixture was refluxed overnight to complete the end-capping reaction. The polymer was purified by precipitation using methanol/water (10:1) followed by filtration through a 0.45 μm nylon filter. The polymer was then subjected to Soxhlet extraction using methanol, hexanes and chloroform. The chloroform portion was concentrated and purified by precipitation from MeOH/$H_2O$ (10:1, 300 mL). The precipitate was filtration through a 0.45 μm nylon filter and the polymer isolated following drying under vacuum at 50° C. overnight (190 mg; yield: 76%): $^{1}$H NMR (300 MHz, $CDCl_3$, ppm) δ: 8.15 (br, 2H), 7.59-7.10(br, 8H), 4.67(br, 1H), 3.76(br, 2H), 2.37-1.95(br, 6H), 1.33-1.25(br, 34H),0.91-0.82(br, 9H); $M_w$=23.6 K; polydispersity=1.86 (the $^{1}$H NMR spectra and the temperature of degradation of polymer ZP 30 are illustrated in FIGS. 8 and 9).

Synthesis of ZP35

A solution of 1,3-di(2-bromothien-5'-yl)-5-octylthieno[3,4-c]pyrrole-4,6-dione (176.22 mg, 0.3 mmol) and 5,5'-bis(trimethyltin)-4,4-bis(octyl)-dithieno[3,2-b:2',3'-d]silole (234 mg, 0.315 mmol) in toluene (10 mL) in a 50 mL flask was flushed with argon over a period of 10 minutes. $Pd_2$ $dba_3$ (5.5 mg, 2 mol %) and $P(Tolyl)_3$ (14.6 mg, 16%) were subsequently added to the reaction mixture which was subsequently heated at 95° C. over a period of 65 hours while under an argon atmosphere. 2-Bromothiophene (0.1 equiv) was then added to the reaction mixture, the reaction mixture heated at 95° C. for an additional 2 hours and 2-tributylstannyl thiophene (0.1 equiv) added. The reaction mixture was then heated at 95° C. overnight to complete the end-capping reaction. The reaction mixture was subsequently allowed to cool to room temperature, the polymer precipitated using methanol/$H_2O$ (10:1) (300 mL) and filtered through a 0.45 μm nylon filter. The polymer was then subjected to Soxhlet extraction using methanol and hexanes. The polymer was taken-up in chloroform, the chloroform solution concentrated and the polymer precipitated using MeOH/$H_2O$ (10:1, 300 mL). The precipitate was filtered through a 0.45 μm nylon filter and the polymer isolated as a purple solid following drying under vacuum at 50° C. over a period of 12 hours (100 mg; yield: 41%); $M_w$=5.2 K; polydispersity=2.08.

Synthesis of ZP36

A solution of 1,3-di(2-bromothien-5'-yl)-5-octylthieno[3,4-c]pyrrole-4,6-dione (176.28 mg, 0.3 mmol) and 2,6-bis(trimethyltin)-N-(1-octylnonyl)dithieno[3,2-b:2',3'-d]pyrrole (223 mg, 0.3 mmol) in toluene (10 mL) in a 50 mL flask was flushed with argon over a period of 10 minutes. $Pd_2$ $dba_3$ (5.5 mg, 2 mol %) and $P(Tolyl)_3$ (19.6 mg, 16%) were subsequently added to the reaction mixture which was subsequently heated at 95° C. over a period of 16 hours while under an argon atmosphere. 2-Bromothiophene (0.1 equiv) was then added to the reaction mixture, the reaction mixture heated at 95° C. for an additional 2 hours and 2-tributylstannyl thiophene (0.1 equiv) added. The reaction mixture was then heated at 95° C. overnight to complete the end-capping reaction. The reaction mixture was subsequently allowed to cool to room temperature, the polymer precipitated using methanol/$H_2O$ (10:1) (300 mL) and filtered through a 0.45 μm nylon filter. The polymer was then subjected to Soxhlet extraction using methanol and hexanes. The polymer was taken-up in chloroform, the chloroform solution concentrated and the polymer precipitated using MeOH/$H_2O$ (10:1, 300 mL). The precipitate was filtered through a 0.45 μm nylon filter and the polymer isolated as a dark blue solid following drying under vacuum at 50° C. over a period of 12 hours (177 mg; yield: 75%); $M_w$=36.4 K; polydispersity=1.83.

Synthesis of ZP37

A solution of 1,3-dibromo-5-octylthieno[3,4-c]pyrrole-4,6-dione (84.2 mg, 0.2 mmol) and 2,6-bis(trimethyltin)-4,8-dioctyloxylbenzo[1,2-b:3,4-b]dithiophene (154.4 mg, 0.2 mmol) in toluene (8 mL) in a 25 mL flask was flushed with argon over a period of 10 minutes. $Pd_2$ $dba_3$ (3.66 mg, 2 mol %) and $P(Tolyl)_3$ (6.55 mg, 8%) were subsequently added to the reaction mixture which was subsequently heated at 95-100° C. over a period of 24 hours while under an argon atmosphere. 2-Bromothiophene (0.1 equiv) was then added to the reaction mixture, the reaction mixture heated at 95-100° C. for an additional 2 hours and 2-tributylstannyl thiophene (0.1 equiv) added. The reaction was then heated at 95-100° C. overnight to complete the end-capping reaction. The reaction mixture was subsequently allowed to cool to room temperature and the polymer precipitated using methanol/$H_2O$ (10:1) (300 mL) and filtered through a 0.45 vim nylon filter. The polymer was then subjected to Soxhlet extraction using methanol and hexanes. The polymer was taken-up in chloroform, the chloroform solution concentrated and the polymer precipitated using MeOH/$H_2O$ (10:1, 300 mL). The precipitate was filtered through a 0.45 vim nylon filter and the polymer isolated as a dark purple solid following drying under vacuum at 50° C. over a period of 12 hours (60 mg; yield: 43%).

Synthesis of ZP40

A solution of 1,3-dibromo-5-octylthieno[3,4-c]pyrrole-4,6-dione (126.3 mg, 0.3 mmol), 2,7-(bis(4,4,5,5-tetramethyl-1,3,2-dioxaboralan-2-yl)-n-9-heptadecanylcarbazole (197.25 mg, 0.3 mmol) in toluene (3 mL) and water (1.2 mL) was added $Pd_2$ $dba_3$ (2.3 mg, 0.0025 mmol), sphos (4.1 mg) and $K_3$ $PO_4$ (509.4 mg, 2.4 mmol). The reaction mixture was subsequently heated at 95° C. over a period of 72 h followed by the addition of bromobenzene (31.5 μL, 0.23 mmol). Following heating at 95° C. for an additional 3 hours, phenylboronic acid (36.6 mg, 0.25 mmol) in toluene (2 mL) was added. The reaction mixture was refluxed overnight to complete the end-capping reaction. The polymer was purified by precipitation using methanol/water (10:1) followed by filtration through a 0.45 μm nylon filter. The polymer was then subjected to Soxhlet extraction using methanol, hexanes and chloroform. The chloroform portion was concentrated and purified by precipitation from MeOH/$H_2O$ (10:1, 300 mL). The precipitate was filtration through a 0.45 μm nylon filter and the polymer isolated as a red-brown solid following drying under vacuum at 50° C. overnight (110 mg; yield: 55%): $M_W$=4 K; polydispersity=1.4.

Synthesis of ZP43

A solution of 1,3-dibromo-5-octylthieno[3,4-c]pyrrole-4,6-dione (126.3 mg, 0.3 mmol) and 2,6-bis(trimethyltin)-4,8-dioctyloxylbenzo[1,2-b:3,4-b]dithiophene (265.35 mg, 0.3 mmol) in toluene (8 mL) in a 50 mL flask was flushed with argon over a period of 10 minutes. $Pd_2$ $dba_3$ (5.5 mg, 2 mol %) and $P(Tolyl)_3$ (9.83 mg, 8%) were subsequently added to the reaction mixture which was subsequently heated at 95-100° C. over a period of 24 hours while under an argon atmosphere. 2-Bromothiophene (0.1 equiv) was then added to the reaction mixture, the reaction mixture heated at 95-100° C. for an additional 2 hours and 2-tributylstannyl thiophene (0.1 equiv) added. The reaction was then heated at 95-100° C. overnight to complete the end-capping reaction. The reaction mixture was subsequently allowed to cool to room temperature and the polymer precipitated using methanol/$H_2O$ (10:1) (300 mL) and filtered through a 0.45 μm nylon filter. The polymer was then subjected to Soxhlet extraction using methanol and hexanes. The polymer was taken-up in chloroform, the chloroform solution concentrated and the polymer precipitated using MeOH/$H_2O$ (10:1, 300 mL). The precipitate was filtered through a 0.45 μm nylon filter and the polymer isolated as a dark purple solid following drying under vacuum at 50° C. over a period of 12 hours (150 mg; yield: 72%): $M_w$=10.6 K; polydispersity=2.21.

Synthesis of ZP45

A solution of 1,3-dibromo-5-octylthieno[3,4-c]pyrrole-4,6-dione (126.3 mg, 0.3 mmol) and 2,6-bis(trimethyltin)-N-

(1-octylnonyl)dithieno[3,2-b:2',3'-d]pyrrole (223 mg, 0.305 mmol) in toluene (7.5 mL) in a 50 mL flask was flushed with argon over a period of 10 minutes. $Pd_2$ $dba_3$ (5.5 mg, 2 mol %) and $P(Tolyl)_3$ (19.6 mg, 16%) were subsequently added to the reaction mixture which was subsequently refluxed over a period of 24 hours while under an argon atmosphere. 2-Bromothiophene (0.1 equiv) was then added to the reaction mixture, the reaction mixture refluxed for an additional 2 hours and 2-tributylstannyl thiophene (0.1 equiv) added. The reaction was then refluxed overnight to complete the end-capping reaction. The reaction mixture was subsequently allowed to cool to room temperature and the polymer precipitated using methanol/$H_2O$ (10:1) (300 mL) and filtered through a 0.45 μm nylon filter. The polymer was then subjected to Soxhlet extraction using methanol and hexanes. The polymer was taken-up in chloroform, the chloroform solution concentrated and the polymer precipitated using MeOH/$H_2O$ (10:1, 300 mL). The precipitate was filtered through a 0.45 μm nylon filter and the polymer isolated as a dark blue solid following drying under vacuum at 50° C. over a period of 12 hours (180 mg; yield: 89%): $M_w$=17.1K; polydispersity=2.16.

Synthesis of ZP46

A solution of 1,3-dibromo-5-octylthieno[3,4-c]pyrrole-4,6-dione (210.5 mg, 0.5 mmol) and 2,6-bis(trimethyltin)-4,8-dihexylethylbenzo[1,2-b:3,4-b]dithiophene (386 mg, 0.5 mmol) in toluene (20 mL) in a 50 mL flask was flushed with argon over a period of 10 minutes. $Pd_2$ $dba_3$ (9.2 mg, 2 mol %) and $P(Tolyl)_3$ (32.72 mg, 16%) were subsequently added to the reaction mixture which was subsequently refluxed over a period of 24 hours while under an argon atmosphere. 2-Bromothiophene (0.1 equiv) was then added to the reaction mixture, the reaction mixture refluxed for an additional 2 hours and 2-tributylstannyl thiophene (0.1 equiv) added. The reaction was then refluxed overnight to complete the end-capping reaction. The reaction mixture was subsequently allowed to cool to room temperature and the polymer precipitated using methanol/$H_2O$ (10:1) (300 mL) and filtered through a 0.45 μm nylon filter. The polymer was then subjected to Soxhlet extraction using methanol and hexanes. The polymer was taken-up in chloroform, the chloroform solution concentrated and the polymer precipitated using MeOH/$H_2O$ (10:1, 400 mL). The precipitate was filtered through a 0.45 μm nylon filter and the polymer isolated as a dark purple solid following drying under vacuum at 50° C. over a period of 12 hours (340 mg; yield: 98%): $^1H$ NMR (300 MHz, $CDCl_3$, ppm) δ: 8.52 (br, 2H), 4.65-3.66(br, 4H), 3.58(bs, 2H), 1.38-1.25(br, 30H), 0.93(br, 15H).

Synthesis of ZP50

A solution of 1,3-di(2-bromothien-5'-yl)-5-octylthieno[3,4-c]pyrrole-4,6-dione (58.4 mg, 0.1 mmol) and 2,6-bis(trimethyltin)-4,8-dihexylethylbenzo[1,2-b:3,4-b]dithiophene (77.2 mg, 0.1 mmol) in toluene (5 mL) in a 25 mL flask was flushed with argon over a period of 10 minutes. $Pd_2$ $dba_3$ (1.83 mg, 2 mol %) and $P(Tolyl)_3$ (6.5 mg, 16%) were added to the reaction mixture which was subsequently heated to 95° C. and stirred over a period of 16 hours while under an argon atmosphere. 2-Bromothiophene (0.1 equiv) was then added to the reaction mixture, the reaction mixture heated at 95° C. for an additional 2 hours and 2-tributylstannyl thiophene (0.1 equiv) added. The reaction mixture was then continued to be heated at 95° C. overnight to complete the end-capping reaction. The reaction mixture was subsequently allowed to cool to room temperature and the polymer precipitated using methanol/$H_2O$ (10:1) (300 mL) and filtered through a 0.45 μm nylon filter. The polymer was then subjected to Soxhlet extraction using methanol and hexanes. The polymer was taken-up in chloroform, the chloroform solution concentrated and the polymer precipitated using MeOH/$H_2O$ (10:1, 300 mL). The precipitate was filtered through a 0.45 μm nylon filter and the polymer isolated as a dark blue solid following drying under vacuum at 50° C. over a period of 12 hours (21 mg; yield: 23%).

Synthesis of ZP51

Figure 10:
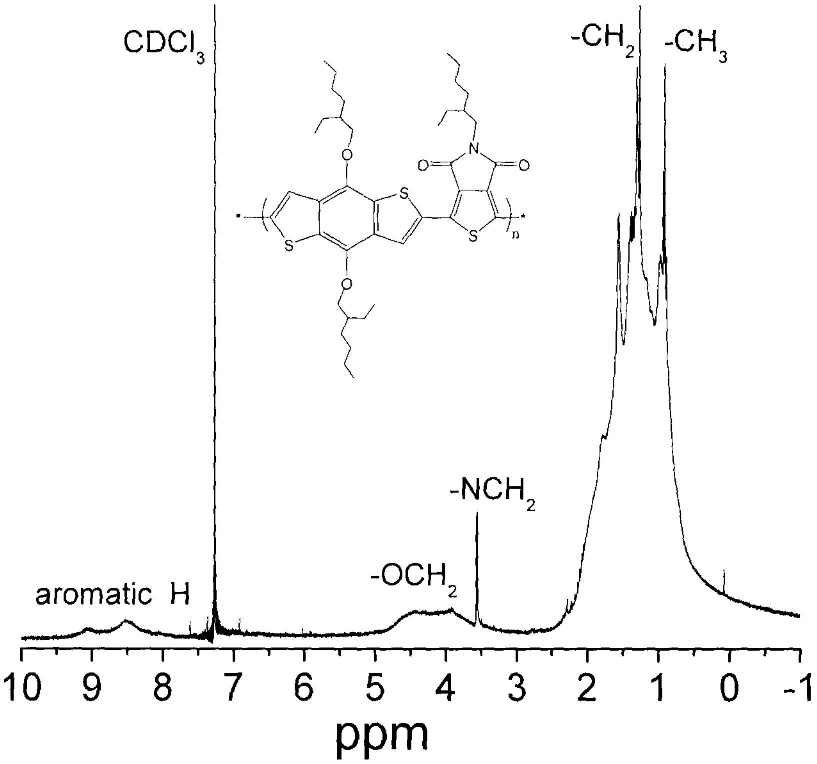
FIG. 10 is an illustration of the $^1$H NMR spectra of polymer ZP51 in deuterated chloroform at room temperature in accordance with an embodiment of the present specification.

A solution of 1,3-dibromo-5-hexylethylthieno[3,4-c]pyrrole-4,6-dione (168.4 mg, 0.4 mmol) and 2,6-bis(trimethyltin)-4,8-dihexylethylbenzo[1,2-b:3,4-b]dithiophene (308.8 mg, 0.4 mmol) in toluene (15 mL) in a 50 mL flask was flushed with argon over a period of 10 minutes. $Pd_2$ $dba_3$ (7.3 mg, 2 mol %) and $P(Tolyl)_3$ (26.2 mg, 16%) were added to the reaction mixture which was subsequently refluxed and stirred over a period of 24 hours while under an argon atmosphere. 2-Tributylstannyl thiophene (39.5 μl) was then added to the reaction mixture, the reaction mixture refluxed for an additional 2 hours and 2-bromothiophene (12.5 μl) added. The reaction mixture was then continued to be refluxed overnight to complete the end-capping reaction. The reaction mixture was subsequently allowed to cool to room temperature and the polymer precipitated using methanol/$H_2O$ (10:1) (300 mL) and filtered through a 0.45 μm nylon filter. The polymer was then subjected to Soxhlet extraction using methanol and hexanes. The polymer was taken-up in chloroform, the chloroform solution concentrated and the polymer precipitated using MeOH/$H_2O$ (10:1, 400 mL). The precipitate was filtered through a 0.45 μm nylon filter and the polymer isolated as a dark purple solid following drying under vacuum at 50° C. over a period of 12 hours (233 mg; yield: 84%): $^1H$ NMR (300 MHz, $CDCl_3$, ppm) δ: 8.52(br, 2H), 4.65-3.66(br, 4H), 3.58(bs, 2H), 1.38-1.25(br, 27H), 0.93(br, 18H) (the $^1H$ NMR spectra of polymer ZP 51 is illustrated in FIG. 10).

Synthesis of 2-(trimethyltin)-3-ethylthiophene (9)

To a solution of 2-bromo-3-ethylthiophene (5.00 g, 26.17 mmol) in dry tetrahydrofuran (50 mL) at −78° C. was added dropwise n-butyllithium (2.5M in hexane) (27.60 mmol, 11.0 mL). The solution was stirred at −78° C. for 2 h. Then, trimethyltin chloride (39.40 mmol, 40.0 mL) was added at once to the reaction mixture. The cooling bath was removed and the reaction was warmed to room temperature overnight. The reaction mixture was then poured into hexanes. The organic phase was washed with water then brine. The solvent was removed under reduced pressure and the crude product (brownish oil) was purified by distillation under high vacuum to afford 4.57 g of the title product as a colorless oil (Y=63%) (b.p. 73-75° C./0.35 mmHg). $^1H$ NMR (300 MHz, $CDCl_3$, ppm) δ: 7.55 (d, 1H, J=4.6 Hz); 7.13 (d, 1H, J=4.7 Hz); 2.68 (q, 2H, J=7.7 Hz); 1.24 (t, 3H, J=7.5 Hz); 0.39 (s, 9H).

Synthesis of 1,3-Di(thien-2'-yl)-5-octylthieno[3,4-c]pyrrole-4,6-dione (11)

Compound 4 (2.10 g, 4.96 mmol) was dissolved into dry tetrahydrofuran (200 mL). 2-(tributylstannyl)thiophene (15.00 mmol, 4.76 mL) and Bis(triphenylphosphine) Palladium(II) dichloride (210 mg, 6%) were added to the reaction mixture. The solution was refluxed for 24 h then cooled down and poured into water. The mixture was extracted twice with dichloromethane. The organic phases were combined and washed with brine and dried over anhydrous magnesium sulphate. The solvent was removed under reduce pressure and the crude product was purified by column chromatography using dichloromethane/hexanes as the eluent (ratio 1:1) to afford 1.60 g of the title product as a green powder (Y=75%). $^1$H NMR (400 MHz, d$^8$-THF, ppm) δ: 8.33 (d, 2H); 7.78 (d, 2H); 7.34 (t, 2H, J=4.2 Hz); 3.83 (t, 2H, J=7.1 Hz); 1.89 (m, 2H); 1.53-1.47 (m, 10H); 1.05 (t, 3H, J=7.2 Hz); $^{13}$C NMR (100 MHz, d$^8$-THF) δ: 162.08; 135.71; 132.57; 130.09; 129.12; 128.94; 128.42; 38.14; 32.00; 29.36; 28.48; 26.99; 22.73; 13.62. *one peak is missing due to the deuterated solvent.

Synthesis of 1,3-Di(thien-2'-yl)-5-(2-ethylhexyl) thieno[3,4-c]pyrrole-4,6-dione (12)

The title compound was synthesized as described for 11 using 5 (2.10 g, 4.96 mmol), dry THF (100 mL), 2-(tributylstannyl)thiophene (15.00 mmol, 4.76 mL) and Bis(triphenylphosphine) Palladium(II) dichloride (210 mg, 6%) to afford 1.90 g of the title product as a green powder (Y=89%). $^1$H NMR (400 MHz, $CDCl_3$, ppm) δ: 8.03 (d, 2H, J=3.1 Hz); 7.44 (d, 2H, J=4.6 Hz); 7.13 (t, 2H, J=4.0 Hz); 3.58 (d, 2H, J=7.3 Hz); 1.87-1.84 (m, 1H); 1.46-1.26 (m, 8H); 0.94-0.88 (m, 6H); $^{13}$C NMR (100 MHz, $CDCl_3$, ppm) δ: 163.17; 136.72; 132.68; 130.15; 128.87; 128.69; 128.65; 42.75; 38.49; 30.83; 28.84; 24.14; 23.28; 14.33; 10.70.

Synthesis of 1,3-Di(thien-2'-yl)-5-dodecylthieno[3,4-c]pyrrole-4,6-dione (13)

The title compound was synthesized as described for 11 using 6 (1.00 g, 2.09 mmol), dry THF (50 mL), 2-(tributylstannyl)thiophene (4.18 mmol, 1.45 mL) and Bis(triphenylphosphine) Palladium(II) dichloride (73 mg, 6%) to afford 0.82 g of the title product as a yellow green powder (Y=82%). $^1$H NMR (400 MHz, $CDCl_3$, ppm) δ: 8.01 (d, 2H, J=3.0 Hz); 7.45 (d, 2H, J=0.6 Hz); 7.13 (t, 2H, J=1.0 Hz); 3.66 (t, 2H, J=7.3 Hz); 1.70-1.65 (m, 2H); 1.37-1.25 (m, 18H); 0.95 (t, 3H, J=7.3 Hz); $^{13}$C NMR (100 MHz, $CDCl_3$, ppm) δ: 162.87; 136.73; 132.68; 130.11; 128.89; 128.67; 128.63; 38.83; 32.16; 29.91; 29.88; 29.83; 29.74; 29.60; 29.48; 28.73; 27.20; 22.94; 14.39.

Synthesis of 1,3-Di(3'-octylthien-2'-yl)-5-octylthieno [3,4-e]pyrrole-4,6-dione (14)

The title compound was synthesized as described for 11 using 4 (1.26 g, 2.98 mmol), dry THF (100 mL), 2-(trimethyltin-3-octylthiophene) (7.45 mmol, 3.58 g) and Bis(triphenylphosphine) Palladium(II) dichloride (210 mg, 6%). The crude product was purified by column chromatography using dichloromethane/hexanes as the eluent (ratio 3:2) to afford 1.52 g of the title product as a sticky oil (Y=79%). $^1$H NMR (400 MHz, $CDCl_3$, ppm) δ: 7.42 (d, 2H, J=5.2 Hz); 7.02 (d, 2H, J=5.2 Hz); 3.63 (t, 2H, J=7.2 Hz); 2.80 (t, 4H, J=7.9 Hz); 1.66-1.63 (m, 6H); 1.30-1.25(m, 30H); 0.88 (t, 9H, J=6.4 Hz); $^{13}$C NMR (100 MHz, $CDCl_3$, ppm) δ: 162.55; 144.55; 137.25; 130.83; 130.06; 127.83; 125.27; 38.69; 32.11; 32.04; 30.77; 29.89; 29.77; 29.64; 29.50; 29.43; 29.40; 28.69; 27.19; 22.90; 22.87; 14.34; 14.33.

1,3-Di(3'-ethylthien-2'-yl)-5-octylthieno[3,4-c]pyrrole-4,6-dione (15)

The title compound was synthesized as described for 11 using 4 (0.97 g; 22.90 mmol), dry THF (60 mL), 2-(trimethyltin)-3-ethylthiophene (1.89 g; 69.00 mmol) and Bis(triphenylphosphine) Palladium(II) dichloride (96 mg, 6%) to afford 0.75 g of the title product as a sticky orange oil (Y=68%). $^1$H NMR (300 MHz, $CDCl_3$, ppm) δ: 7.42 (d, 2H, J=5.2 Hz); 7.05 (d, 2H, J=5.2 Hz); 3.06 (t, 2H, J=7.2 Hz); 2.82 (q, 4H, J=7.5 Hz); 1.67-1.59 (m, 2H); 1.28 (m, 16H); 0.86 (t, 3H, J=6.3 Hz); $^{13}$C NMR (75 MHz, $CDCl_3$, ppm) δ: 162.33; 145.55; 137.04; 130.71; 129.35; 127.76; 124.63; 38.47; 31.80; 29.18 (2C); 28.48; 26.95; 22.91; 22.65; 14.79; 14.10.

Synthesis of 1,3-Di(4'-octylthien-2'-yl)-5-octylthieno [3,4-c]pyrrole-4,6-dione (16)

The title compound was synthesized as described for 11 using 4 (1.00 g, 2.36 mmol), dry THF (50 mL), 2-(trimethyltin)-4-octylthiophene (1.87 g; 5.20 mmol) and Bis(triphenylphosphine) Palladium(II) dichloride (9.9 mg, 6%) to afford 0.55 g of the title product as a sticky orange oil (Y=36%). $^1$H NMR (400 MHz, $CDCl_3$, ppm) δ: 7.87 (s, 2H); 7.02 (s, 2H); 3.65 (t, 2H, J=7.4 Hz); 2.26 (t, 4H, J=7.6 Hz); 1.67-1.61 (m, 6H); 1.33-1.29 (m, 30H); 0.89 (t, 9H, J=6.5 Hz); $^{13}$C NMR (100 MHz, $CDCl_3$, ppm) δ:162.94; 145.18; 137.02; 132.38; 131.32; 128.28; 123.77; 38.83; 32.13; 30.70; 29.65; 29.52; 29.49; 29.43; 28.80; 27.24; 22.93; 14.37. *some peaks are missing due to overlapping.

Synthesis of 1,3-Di(3'-octylthien-2'-yl)-5-dodecylthieno[3,4-c]pyrrole-4,6-dione (17)

The title compound was synthesized as described for 11 using 6 (0.95 g, 1.98 mmol), dry THF (46 mL), 2-(trimethyltin)-3-octylthiophene) (4.35 mmol, 1.56 g) and Bis(triphenylphosphine) Palladium(II) dichloride (8.3 mg, 6%) were added to the solution. The crude product was purified by column chromatography using dichloromethane/hexanes as the eluent (ratio 2:3) to afford 0.96 g of the title product as a yellow solid (Y=68%). $^1$H NMR (400 MHz, $CDCl_3$, ppm) δ: 7.46 (d, 2H, J=5.1 Hz); 7.04 (d, 2H, J=5.2 Hz); 3.64 (t, 2H, J=7.2 Hz); 2.86 (t, 4H, J=7.7 Hz); 1.70-1.59 (m, 6H); 1.31-1.25 (m, 38H); 0.86 (t, 9H, J=3.9 Hz); $^{13}$C NMR (100 MHz, $CDCl_3$, ppm) δ: 167.24; 145.19; 131.58; 130.30; 130.04; 128.31; 112.99; 38.64; 31.90; 31.79; 30.56; 29.50; 29.40; 29.27; 29.17; 26.95; 22.68; 22.62; 14.10; 14.07. *some peaks are missing due to overlapping

Synthesis of 1,3-Di(4'-octylthien-2'-yl)-5-dodecylthieno[3,4-c]pyrrole-4,6-dione (18)

The title compound was synthesized as described for 11 using 6 (0.91 g, 1.90 mmol), dry THF (45 mL), 2-(trimethyltin)-4-octylthiophene (1.5 g, 4.17 mmol) and Bis(triphenylphosphine) Palladium(II) dichloride (8.0 mg, 6% mol). The crude product was purified by column chromatography using dichloromethane/hexanes as the eluent (ratio 2:3) to afford 0.73 g of the title product as a yellow wax (Y=75%). $^1$H NMR (400 MHz, $CDCl_3$, ppm) δ: 7.87 (s, 2H); 7.01 (s, 2H); 3.65 (t, 2H, J=7.3 Hz); 2.62 (t, 4H, J=7.6 Hz); 1.65-1.61 (m, 6H); 1.33-1.25 (m, 38H); 0.88 (t, 9H, J=4.9 Hz); $^{13}$C NMR (100 MHz, $CDCl_3$, ppm) δ: 162.91; 145.17; 136.99; 132.38; 131.31; 128.27; 123.74; 38.83; 32.17; 32.13; 30.70; 30.66; 29.89; 29.84; 29.77; 29.66; 29.60; 29.57; 29.53; 28.80; 27.25; 22.93; 14.37. *some peaks are missing due to overlapping

Synthesis of 1,3-Di(2'-bromothien-5'-yl)-5-octylthieno[3,4-c]pyrrole-4,6-dione (19)

Compound II (0.86 g, 2.00 mmol) was dissolved in a mixture of acetic acid and chloroform (60 mL) (ratio 1/1). The solution was cooled down to 0° C. and kept in the dark. N-bromosuccinimide (0.79 g, 4.43 mmol) was added to the solution in several portions. The cooling bath was removed and the reaction was stirred at ambient temperature for 24 h. The reaction solution was poured into water and extracted several times with chloroform. The organic phases were combined, washed with brine and dried over anhydrous magnesium sulphate. The solvent was removed under reduced pressure and the crude product was purified by column chromatography using dichloromethane/hexanes as the eluent (ratio 1:1) to afford 1.16 g of the title product as a bright yellow solid (Y=99%). $^1$H NMR (400 MHz, $CDCl_3$, ppm) δ: 7.65 (d, 2H, J=4 Hz); 7.09 (d, 2H, J=4 Hz); 3.64 (t, 2H, J=6.9 Hz); 1.67 (m, 2H); 1.32-1.26 (m, 10H); 0.87 (t, 3H, J=5.4 Hz); $^{13}$C NMR (100 MHz, $CDCl_3$, ppm) δ: 162.54; 135.32; 133.96; 131.37; 129.97; 128.83; 116.98; 38.93; 32.03; 29.41 (2C); 28.69; 27.20; 22.87; 14.34.

Synthesis of 1,3-Di(2'-bromothien-5'-yl)-5-(2-ethylhexyl)thieno[3,4-c]pyrrole-4,6-dione (20)

The title compound was synthesized as described for 19 using 12 (1.29 g, 3.00 mmol), a mixture of acetic acid and chloroform (60 mL) (ratio 1/1) at 0° C. and N-bromosuccinimide (1.20 g, 6.67 mmol). The crude product was purified by gradient column chromatography using hexanes to dichloromethane/hexanes (ratio 1:1 to 2:3) to afford 1.72 g of the title product as a bright yellow solid (Y=98%). $^1$H NMR (400 MHz, $CDCl_3$, ppm) δ: 7.65 (d, 2H, J=4.0 Hz); 7.07 (d, 2H, J=4.0 Hz); 3.54 (d, 2H, J=7.3 Hz); 1.82 (t, 1H, J=6.0 Hz); 1.38-1.29 (m, 8H); 0.92 (t, 6H, J=2.9 Hz); $^{13}$C NMR (100 MHz, $CDCl_3$, ppm) δ: 162.92; 135.37; 133.96; 131.38; 130.01; 128.79; 116.98; 42.87; 38.51; 30.83; 28.86; 28.83; 24.13; 23.28; 14.34.

Synthesis of 1,3-Di(2'-bromothien-5'-yl)-5-dodecylthieno[3,4-c]pyrrole-4,6-dione (21)

The title compound was synthesized as described for 19 using 13 (0.80 g, 1.65 mmol), a mixture of acetic acid and chloroform (40 mL) (ratio 1/1) at 0° C. and N-bromosuccinimide (0.65 g, 3.62 mmol). The crude product was purified by column chromatography using dichloromethane/hexanes as the eluent (ratio 1:1) to afford 0.80 g of the title product as a yellow solid (Y=76%). $^1$H NMR (400 MHz, $CDCl_3$, ppm) δ: 7.65 (d, 2H, J=4.0 Hz); 7.08 (d, 2H, J=4.0 Hz); 3.64 (t, 2H, J=7.3 Hz); 1.66 (m, 2H); 1.32-1.25 (m, 18H); 0.87 (t, 3H, J=6.5 Hz); $^{13}$C NMR (100 MHz, $CDCl_3$, ppm) δ: 162.63; 135.39; 133.96; 131.39; 129.99; 128.87; 116.97; 38.95; 32.16; 31.20; 29.87; 29.81; 29.72; 29.60; 29.45; 28.69; 27.18; 22.94; 14.28.

Synthesis of 1,3-Di(5'-bromo-3-octylthien-2'-yl)-5-octylthieno[3,4-c]pyrrole-4,6-dione (22)

The title compound was synthesized as described for 19 using 14 (1.10 g, 1.72 mmol), a mixture of acetic acid and chloroform (50 mL) (ratio 1/1) at 0° C. and N-bromosuccinimide (0.68 g, 3.76 mmol). After the addition of NBS, the cooling bath was removed and the reaction was stirred at ambient temperature for 24 h. The solution was then heated up to 55° C. for 24 h. The reaction was carefully monitored by TLC. The reaction mixture was cooled down and poured into water. The mixture was extracted three times using chloroform. The chloroform parts were combined and washed with brine and dried over anhydrous magnesium sulphate. The crude product was purified by column chromatography using dichloromethane/hexanes as the eluent (ratio 1:1) to afford 1.30 g of the title product as a yellow solid (Y=82%). $^1$H NMR (400 MHz, $CDCl_3$, ppm) δ: 6.96 (s, 2 H); 3.60 (t, 2H, J=7.1 Hz); 2.75-2.71 (t, 4H, J=7.6 Hz); 1.64-1.60 (m, 6 H); 1.30-1.25 (m, 30 H); 0.88-0.84 (t, 9H, J=5.7 Hz); $^{13}$C NMR (100 MHz, $CDCl_3$, ppm) δ: 162.26; 145.13; 135.63; 132.81; 130.94; 126.63; 115.69; 38.78; 32.11; 32.04; 30.57; 30.06; 29.73; 29.61; 29.49; 29.42 (2C); 28.68; 27.19; 22.92; 22.89; 14.35; 14.32.

Synthesis of 1,3-Di(5'-bromo-3'-ethylthien-2'-yl)-5-octylthieno[3,4-c]pyrrole-4,6-dione (23)

The title compound was synthesized as described for 22 using 15 (0.36 g, 0.75 mmol), a mixture of acetic acid and chloroform (24 mL) (ratio 1/1) at 0° C. and N-bromosuccinimide (0.29 g, 1.65 mmol) to afford 0.32 g of the title product as a highly viscous orange oil (Y=66%). $^1$H NMR (300 MHz, $CDCl_3$, ppm) δ: 7.01 (s, 2H); 3.61 (t, 2H, J=7.4 Hz); 2.7 (q, 4H, J=7.5 Hz); 1.66-1.60 (m, 2H); 1.28-1.23 (m, 16H); 0.87 (t, 3H, J=6.2 Hz); $^{13}$C NMR (75 MHz, $CDCl_3$, ppm) δ: 162.07; 146.13; 135.42; 132.19; 130.83; 126.08; 115.53; 38.58; 31.79; 29.17 (2C); 28.45; 26.95; 23.09; 22.65; 14.61; 14.11.

Synthesis of 1,3-Di(5'-bromo-4'-octylthien-2'-yl)-5-octylthieno[3,4-c]pyrrole-4,6-dione (24)

The title compound was synthesized as described for 22 using 16 (0.55 g, 0.85 mmol), a mixture of acetic acid and chloroform (20 mL) (ratio 1/1) at 0° C. and N-bromosuccinimide (0.29 g, 1.65 mmol) to afford 0.52 g of the title product as a yellow solid (Y=72%). $^1$H NMR (400 MHz, $CDCl_3$, ppm) δ: 7.60 (s, 2H); 3.61 (t, 2H, J=7.1 Hz); 2.54 (t, 4H, J=7.5 Hz); 1.66-1.60 (m, 6H); 1.33-1.28 (m, 30H); 0.87 (t, 9H, J=6.6 Hz); $^{13}$C NMR (100 MHz, $CDCl_3$, ppm) δ: 162.61; 143.96; 135.62; 132.09; 130.47; 128.49; 113.76; 38.91; 32.13; 29.96; 29.89; 29.75; 29.61; 29.52; 29.46; 28.76; 27.25; 22.93; 14.38. *some peaks are missing due to overlapping Synthesis of 1,3-Di(5'-bromo-3'-octylthien-2'-yl)-5-dodecylthieno[3,4-c]pyrrole-4,6-dione (25)

The title compound was synthesized as described for 22 using 17 (1.47 g, 2.07 mmol), a mixture of acetic acid and chloroform (50 mL) (ratio 1/1) at 0° C. and N-bromosuccinimide (0.82 g, 4.55 mmol) to afford 1.26 g of the title product as a yellow solid (Y=70%). $^1$H NMR (400 MHz, $CDCl_3$, ppm) δ: 6.98 (s, 2H); 3.61 (t, 2H, J=7.2 Hz); 2.74 (t, 4H, J=7.8 Hz); 1.64-1.58 (m, 6H); 1.30-1.26 (m, 38H); 0.87 (t, 9H, J=6.4 Hz); $^{13}$C NMR (100 MHz, $CDCl_3$, ppm) δ: 162.34; 145.17; 135.69; 132.84; 130.97; 126.55; 115.68; 38.81; 32.10; 32.03; 30.59; 30.03; 29.71; 29.60; 29.47; 29.42; 29.40; 28.67; 27.18; 22.90; 22.87; 14.35. *some peaks are missing due to overlapping Synthesis of 1,3-Di(5'-bromo-4'-octylthien-2'-yl)-5-dodecylthieno[3,4-c]pyrrole-4,6-dione (26)

The title compound was synthesized as described for 22 using 18 (0.60 g, 0.85 mmol), a mixture of acetic acid and chloroform (20 mL) (ratio 1:1) at 0° C. and N-bromosuccinimide (0.29 g, 1.65 mmol) to afford 0.45 g of the title product as a yellow solid (Y=65%). $^1$H NMR (400 MHz, $CDCl_3$, ppm) δ: 6.98 (s, 2H); 3.61 (t, 2H, J=7.2 Hz); 2.74 (t, 4H, J=7.8 Hz); 1.64-1.58 (m, 6H); 1.30-1.26 (m, 38H); 0.87 (t, 9H, J=6.4 Hz); $^{13}$C NMR (100 MHz, $CDCl_3$, ppm) δ: 162.61;

143.95; 135.63; 132.09; 130.46; 128.50; 113.76; 38.92; 32.17; 32.13; 29.97; 29.89; 29.84; 29.77; 29.61; 29.52; 28.76; 27.25; 22.95; 22.94; 14.38 *some peaks are missing due to overlapping Representative Procedure for Polymerization [P1-P11]

2,6-Bis(trimethyltin)-4,8-di(2-ethylhexyloxyl)-benzo[1,2-b:3,4-b]dithiophene (27) (0.5 mmol), compounds (4-6; 19-26) (0.5 mmol), $Pd_2(dba)_3$ (2 mol %) and $P(o\text{-}Tol)_3$ (8 mol %) were put in a round bottom flask (25 mL). The system was then purged three times by vacuum/argon cycling. The solids were dissolved in 16 mL of dry and oxygen free toluene. The temperature was increased from room temperature to 110° C. using an oil bath equipped with a temperature controller. After 24 to 36 h of polymerization time, 100 μl of bromobenzene was added to the viscous reaction mixture as end-capping agent. After an additional hour of reaction, 100 μL of trimethyltin phenyl was added to complete the end capping procedure. After an additional hour of reaction, the whole mixture was cooled to room temperature and poured in 500 mL of cold methanol. The precipitate was filtered. Soxhlet extraction with acetone followed by hexane removed catalyst residues and low molecular weight material. Polymers were then extracted with chloroform. The solvent was reduced to about 30 mL and the mixture was poured into cold methanol. Polymers were recovered by filtration. Typical yields from 80 to 95% were obtained.

It is to be understood that the specification is not limited in its application to the details of construction and parts as described hereinabove. The specification is capable of other embodiments and of being practiced in various ways. It is also understood that the phraseology or terminology used herein is for the purpose of description and not limitation. Hence, although the present invention has been described hereinabove by way of illustrative embodiments thereof, it can be modified, without departing from the spirit, scope and nature of the subject disclosure as defined in the appended claims.

References

1. G. Li, V. Shrotriya, J. Huang, Y. Yao, T. Moriarty, K. Emery, Y. Yang, *Nature Mater.* 2005, 4, 864.
2. J. Y. Kim, S. H. Kim, H. H. Lee, K. Lee, W. Ma, X. Gong, A. J. Heeger, *Adv. Mater.* 2006, 18, 572.
3. K. Kim, J. Liu, M. A. G. Namboothiry, D. L. Carroll, *Appl. Phys. Lett.* 2007, 90, 163511.
4. J. Peet, J. Y. Kim, N. E. Coates, W. L. Ma, D. Moses, A. J. Heeger, G. C. Bazan, *Nature Mater.* 2007, 6, 497.
5. S. H. Park, A. Roy, S. Beaupré, S. Cho, N. Coates, J. S. Moon, D. Moses, M. Leclerc, K. Lee, A. J. Heeger, *Nature Photon.* 2009, 3, 297.
6. E. Zhou, J. Cong, S. Yamakawa, Q. Wei, M. Nakamura, K. Tajima, C. Yang, K. Hashimoto, *Macromolecules* 2010, 43, 2873.
7. J. M. Tour et al. *J. Am. Chem. Soc.* 1997, 119, 5065.
8. J. M. Tour et al. *J. Am. Chem. Soc.* 1998, 120, 5355.
9. J. M. Pomerantz et al. *Synth. Met.* 2003, 135-136, 257.
10. M. Pomerantz et al. *Tetra Lett.* 2003, 44, 1563.
11. T. Bjornholm et al. *Org. Lett.* 2004, 6, 3381.
12. WO 2008/144756 A1.
13. Y. Zou, A, Najari, P. Berrouard, S. Beaupré, B. R. Aïch, Y. Tao, M. Leclerc, *J. Am. Chem. Soc.* 2010, 132, 5330.
14. Y. Zhang, S. K. Hau, H.-L. Yip, Y. Sun, O. Acton, A. K.-Y. Jen, *Chem. Mater.* 2010, 22, 2696.
15. C. Piliego, T. W. Holcombe, J. D. Douglas, C. H. Woo, P. M. Beaujuge, J. M. J. Fréchet, *J. Am. Chem. Soc.* 2010, 132, 7595.
16. G. Zhang, Y. Fu, Q. Zhang, Z. Xie, *Chem. Commun.* 2010, 46, 4997.
17. M.-C. Yuan, M.-Y. Chiu, S.-P. Liu, C-M. Chen, K.-H. Wei, *Macromolecules* 2010, doi:10.1021/ma101523a.
18. Scharber et al, *Adv. Mater.* 2006, 18, 789.
19. Chen H-Y et al, *Adv. Mater.* 2009, 21, 1.
20. Y. Zhang, S. K. Hau, H.-L. Yip, Y. Sun, O. Acton, A. K.-Y. Jen, *Chem. Mater.* 2010, 22, 2696.
21. C. Piliego, T. W. Holcombe, J. D. Douglas, C. H. Woo, P. M. Beaujuge, J. M. J. Fréchet, *J. Am. Chem. Soc.* 2010, 132, 7595.
22. G. Zhang, Y. Fu, Q. Zhang, Z. Xie, *Chem. Commun.* 2010, 46, 4997.
23. Y. Liang, Z. Xu, J. Xia, S.-T. Tsai, Y. Wu, G. Li, C. Ray, L. Yu, *Adv. Mater.* 2010, 22, E135.

What is claimed is:

1. A photoactive polymer comprising first and second co-monomer repeat units, the first co-monomer repeat unit comprising a 1,3-dithiophene-5-alkylthieno[3,4-c]pyrrole-4,6-dione moiety, and the second co-monomer repeat unit comprising a moiety selected from the group consisting of a 4,4'-dialkyl-dithieno[3,2-b :2'3'-d]silole moiety, an ethylene moiety, a thiophene moiety, an N-alkylcarbazole moiety, an N-(1-alkyl)dithieno[3,2-b:2'3'-d]pyrrole moiety and a 4,8-di-alkyloxylbenzo[1,2-b:3,4-b]dithiophene moiety.

2. The photoactive polymer of claim 1, wherein the first co-monomer repeat unit has a structure of:

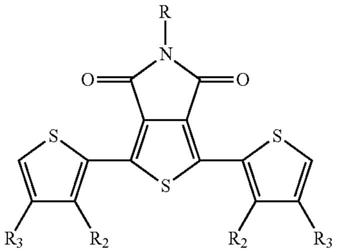

wherein R is an alkyl group and wherein $R_2$ and $R_3$ are independently selected from H and an alkyl group.

3. The photoactive polymer of claim 1, wherein the second co-monomer repeat unit has a structure selected from the group consisting of:

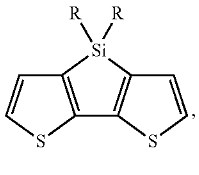, ethylene , thiophene ,

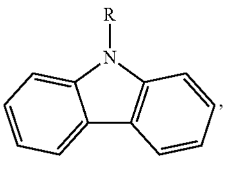, 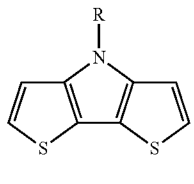 and

-continued

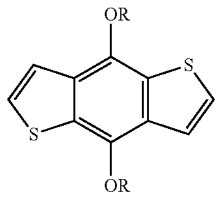

wherein R is an alkyl group.

4. The photoactive polymer of claim 1 having a structure selected from the group consisting of:

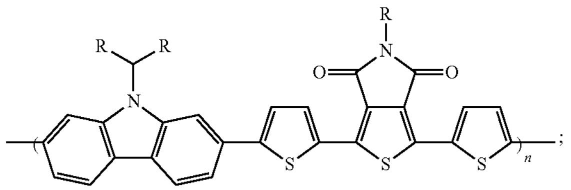

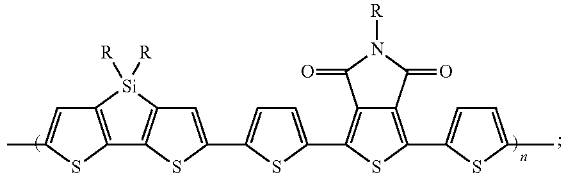

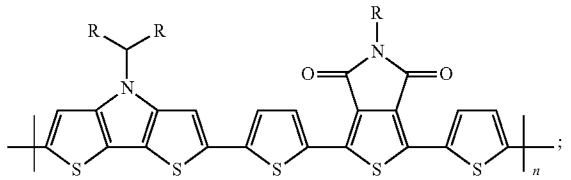

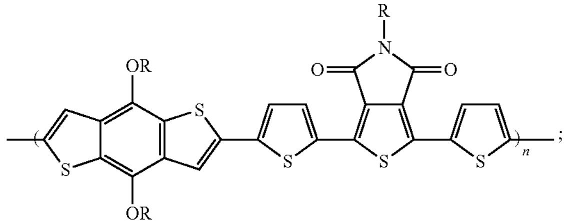

and

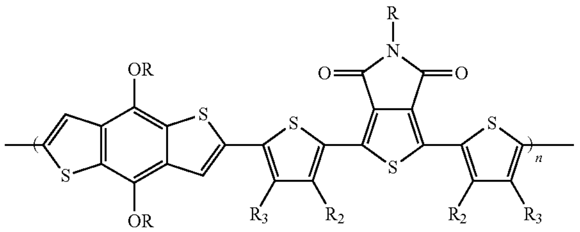

wherein R, $R_2$ and $R_3$ are independently selected alkyl groups and wherein n is an integer ranging from 5 to 1000000.

5. The photoactive polymer of claim 4 having a structure selected from the group consisting of:

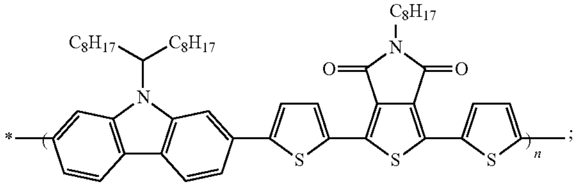

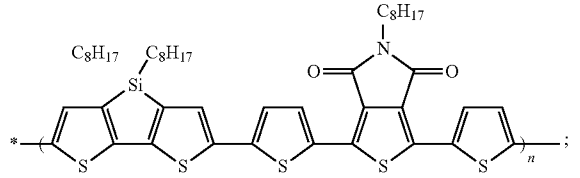

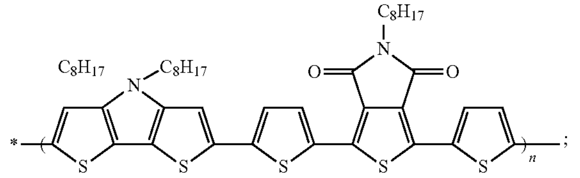

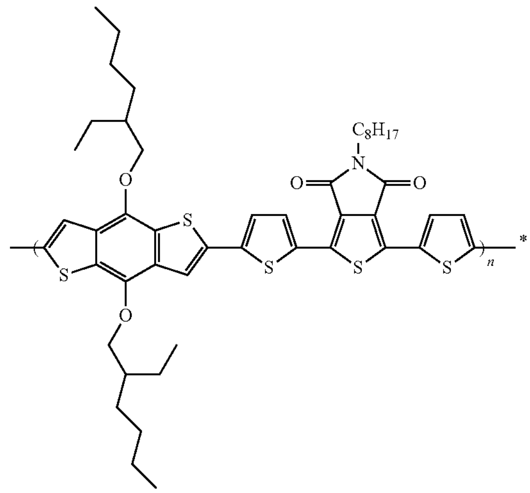

and

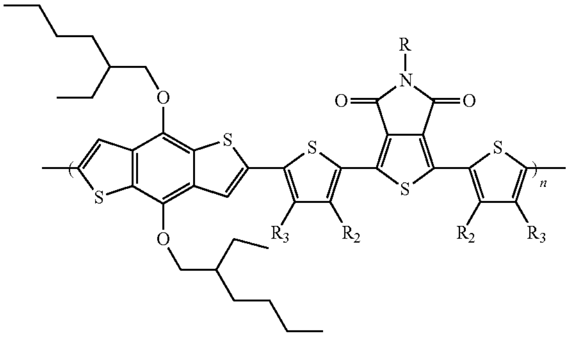

wherein R, $R_2$ and $R_3$ are independently selected alkyl groups and wherein n is an integer ranging from 5 to 1000000.

6. A system comprising:

first and second electrodes; and at least one photoactive layer between the first and second electrodes, the photoactive layer comprising a photoactive polymer comprising first and second co-monomer repeat units, the first co-monomer repeat unit comprising a 1,3-dithiophene-5-alkylthieno[3,4-c]pyrrole-4,6- dione moiety, and the second co-monomer repeat unit comprising a moiety selected from the group consisting of a 4,4'-dialkyl-dithieno[3,2-b:2'3'-d]silole moiety, an ethylene moiety, a thiophene moiety, an N-alkylcarbazole moiety, an N-(1-alkyl)dithieno[3,2-b:2'3'-d]pyrrole moiety and a 4,8-dialkyloxylbenzo[1,2-b:3,4-b] dithiophene moiety;

wherein the system is configured as a photovoltaic system.

7. The system of claim 6, wherein the first co-monomer repeat unit has a structure of:

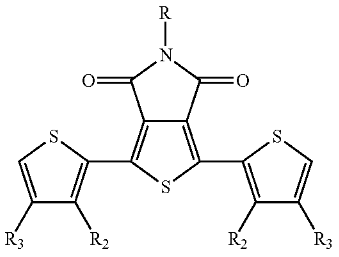

wherein R is an alkyl group and wherein $R_2$ and $R_3$ are independently selected from H and an alkyl group.

8. The system of claim 6, wherein the second co-monomer repeat unit has a structure selected from the group consisting of:

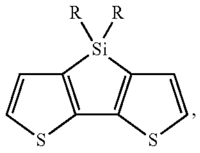, ethylene, thiophene,

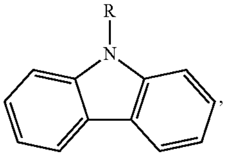, 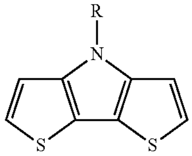 and

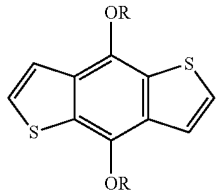

wherein R is an alkyl group.

9. The system of claim 6 having a photoactive polymer selected from the group consisting of:

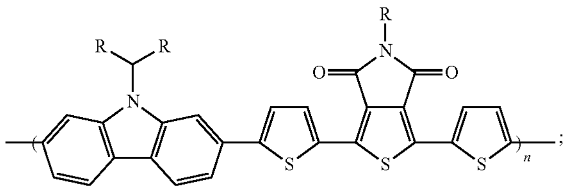;

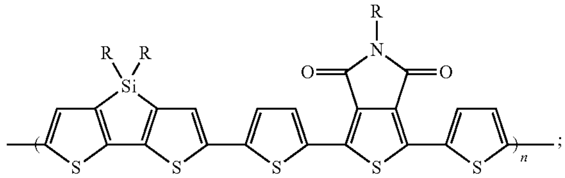;

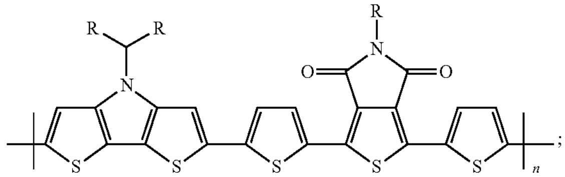;

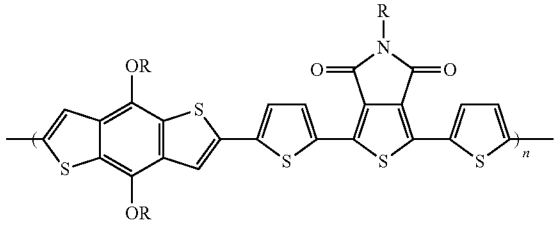;

and

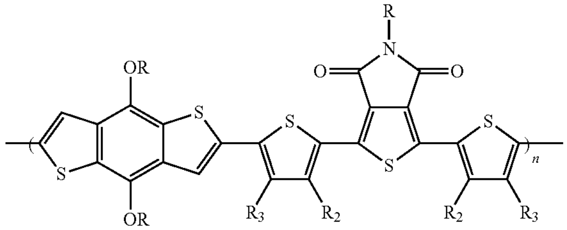

wherein R, $R_2$ and $R_3$ are independently selected alkyl groups and wherein n is an integer ranging from 5 to 1000000.

10. The system of claim 9 having a photoactive polymer selected from the group consisting of:

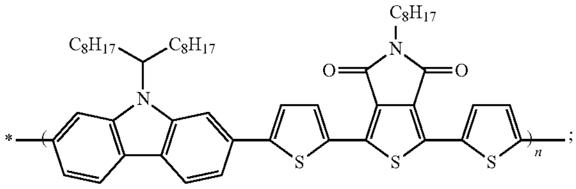;

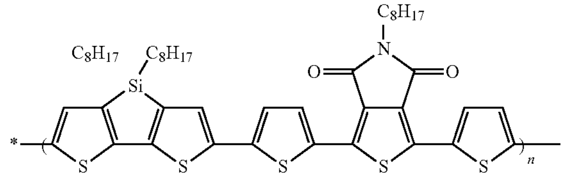;

-continued

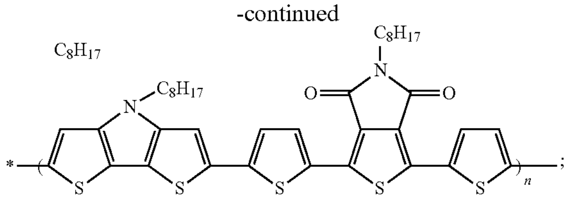;

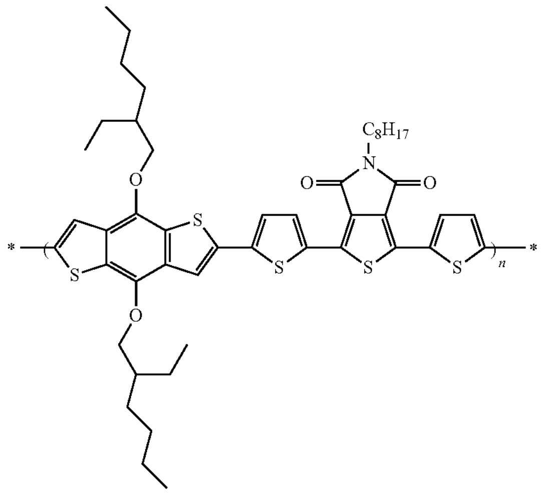 and

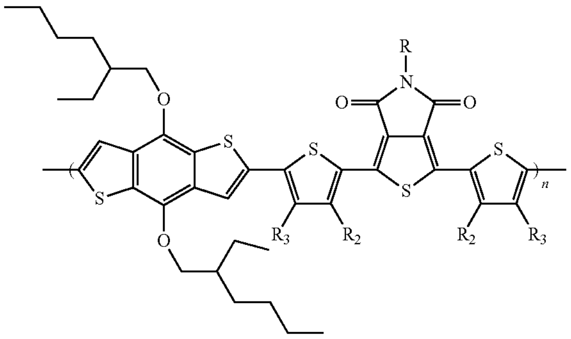

wherein R, $R_2$ and $R_3$ are independently selected alkyl groups and wherein n is an integer ranging from 5 to 1000000.

11. The system of claim 6, having a photoactive polymer having the structure:

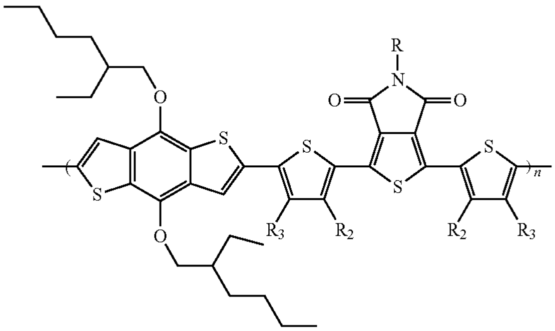

wherein R is an alkyl group and $R_2$ and $R_3$ are independently selected from H and an alkyl group and wherein n is an integer ranging from 5 to 1000000.

12. The system of claim 11 wherein R is ethylhexyl, $R_2$ is H and $R_3$ is H.

13. The system of claim 11 wherein R is $C_{12}H_{25}$, $R_2$ is H and $R_3$ is H.

14. The system of claim 11 wherein R is $C_8H_{17}$, $R_2$ is $C_8H_{17}$ and $R_3$ is H.

15. The system of claim 11 wherein R is $C_8H_{17}$, $R_2$ is $C_2H_5$ and $R_3$ is H.

16. The system of claim 11 wherein R is $C_8H_{17}$, $R_2$ is H and $R_3$ is $C_8H_{17}$.

17. The system of claim 11 wherein R is $C_{12}H_{25}$, $R_2$ is $C_8H_{17}$ and $R_3$ is H.

18. The system of claim 11 wherein R is $C_{12}H_{25}$, $R_2$ is H and $R_3$ is $C_8H_{17}$.

19. The photoactive polymer of claim 1 having the structure:

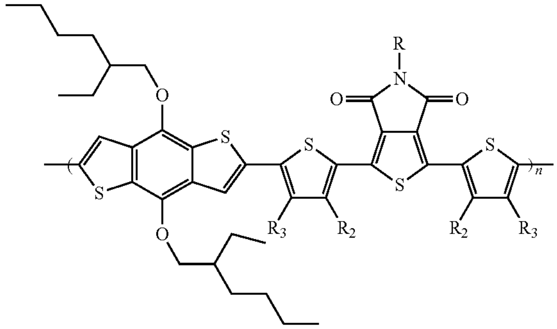

wherein R is an alkyl group and $R_2$ and $R_3$ are independently selected from H and an alkyl group and wherein n is an integer ranging from 5 to 1000000.

20. The photoactive polymer of claim 19 wherein R is ethylhexyl, $R_2$ is H and $R_3$ is H.

21. The photoactive polymer of claim 19 wherein R is $C_{12}H_{25}$, $R_2$ is H and $R_3$ is H.

22. The photoactive polymer of claim 19 wherein R is $C_8H_{17}$, $R_2$ is $C_8H_{17}$ and $R_3$ is H.

23. The photoactive polymer of claim 19 wherein R is $C_8H_{17}$, $R_2$ is $C_2H_5$ and $R_3$ is H.

24. The photoactive polymer of claim 19 wherein R is $C_8H_{17}$, $R_2$ is H and $R_3$ is $C_8H_{17}$.

25. The photoactive polymer of claim 19 wherein R is $C_{12}H_{25}$, $R_2$ is $C_8H_{17}$ and $R_3$ is H.

26. The photoactive polymer of claim 19 wherein R is $C_{12}H_{25}$, $R_2$ is H and $R_3$ is $C_8H_{17}$.

27. The system of claim 11 wherein R is $C_8H_{17}$, $R_2$ is H and $R_3$ is H.

28. The photoactive polymer of claim of claim 19 wherein R is $C_8H_{17}$, $R_2$ is H and $R_3$ is H.

* * * * *

UNITED STATES PATENT AND TRADEMARK OFFICE
CERTIFICATE OF CORRECTION

PATENT NO. : 8,816,035 B2
APPLICATION NO. : 13/511831
DATED : August 26, 2014
INVENTOR(S) : Mario Leclerc et al.

It is certified that error appears in the above-identified patent and that said Letters Patent is hereby corrected as shown below:

In the Claims

Column 68, on line 25-43, replace

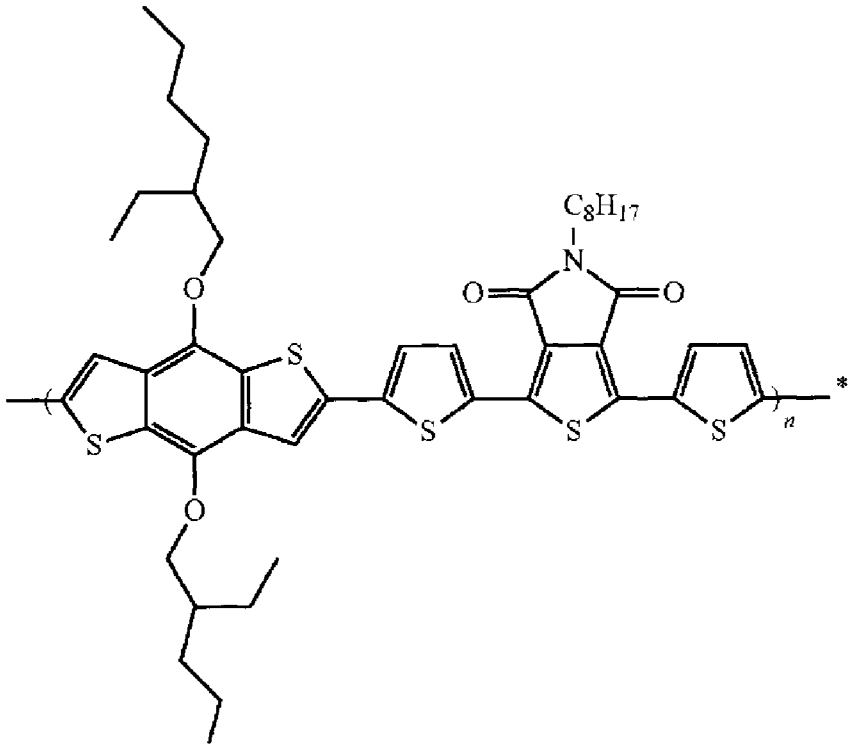

and

Signed and Sealed this
Twenty-sixth Day of May, 2015

Michelle K. Lee
*Director of the United States Patent and Trademark Office* with -- 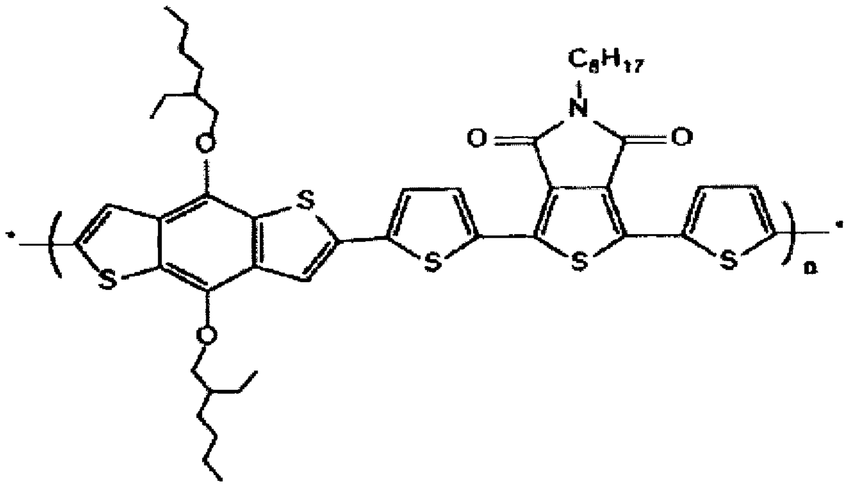 and -- therefor.